(12) United States Patent
Kawaguchi et al.

(10) Patent No.: US 7,625,633 B2
(45) Date of Patent: *Dec. 1, 2009

(54) ELECTROMAGNETIC NOISE SUPPRESSOR, ARTICLE WITH ELECTROMAGNETIC NOISE SUPPRESSING FUNCTION, AND THEIR MANUFACTURING METHODS

(75) Inventors: Toshiyuki Kawaguchi, Tokyo (JP); Hironao Fujiki, Takasaki (JP); Atsushi Taniguchi, Saitama (JP); Takashi Gonda, Saitama (JP); Kazutoki Tahara, Saitama (JP)

(73) Assignee: Shin-Etsu Polymer., Ltd. (JP)

( * ) Notice: Subject to any disclaimer, the term of this patent is extended or adjusted under 35 U.S.C. 154(b) by 173 days.

This patent is subject to a terminal disclaimer.

(21) Appl. No.: 10/540,825

(22) PCT Filed: Mar. 23, 2004

(86) PCT No.: PCT/JP2004/003951

§ 371 (c)(1),
(2), (4) Date: Jun. 23, 2005

(87) PCT Pub. No.: WO2004/086837

PCT Pub. Date: Oct. 7, 2004

(65) Prior Publication Data

US 2006/0083948 A1     Apr. 20, 2006

(30) Foreign Application Priority Data

| Mar. 25, 2003 | (JP) | 2003-083335 |
| Jun. 18, 2003 | (JP) | 2003-173428 |
| Jul. 4, 2003 | (JP) | 2003-192361 |
| Aug. 15, 2003 | (JP) | 2003-293927 |
| Sep. 29, 2003 | (JP) | 2003-338422 |
| Oct. 1, 2003 | (JP) | 2003-343627 |
| Oct. 1, 2003 | (JP) | 2003-343631 |
| Jan. 27, 2004 | (JP) | 2004-018465 |
| Jan. 27, 2004 | (JP) | 2004-018466 |
| Mar. 3, 2004 | (JP) | 2004-059115 |

(51) Int. Cl.
*B32B 9/04* (2006.01)

(52) U.S. Cl. ................. 428/411.1
(58) Field of Classification Search ........... 174/350, 174/391; 428/411.1
See application file for complete search history.

(56) References Cited

U.S. PATENT DOCUMENTS

4,784,739 A * 11/1988 Kadokura et al. ......... 204/192.2

(Continued)

FOREIGN PATENT DOCUMENTS

JP     05-183285     7/1993

(Continued)

OTHER PUBLICATIONS

Farris et al., The Characterization of Thermal and Elastic Constants for an Epoxy Photoresist SU8 Coating, 2002, Journal of Materials Science 37, pp. 4793-4799.*

(Continued)

*Primary Examiner*—Callie E Shosho
*Assistant Examiner*—Elizabeth Robinson
(74) *Attorney, Agent, or Firm*—Ostrolenk Faber LLP

(57) ABSTRACT

An electromagnetic noise suppressor of the present invention includes a base material 2 containing a binding agent and a composite layer 3 formed by integrating the binding agent that is a part of the base material 2 and the magnetic material. This electromagnetic noise suppressor has high electromagnetic noise suppressing effect in the sub-microwave band, and enables it to reduce the space requirement and weight. The electromagnetic noise suppressor can be manufactured by forming the composite layer 3 on the surface of the base material 2 by physical vapor deposition of the magnetic material onto the surface of the base material 2. The article with an electromagnetic noise suppressing function of the present invention is an electronic component, a printed wiring board, a semiconductor integrated circuit or other article of which at least a part of the surface is covered by the electromagnetic noise suppressor of the present invention.

23 Claims, 26 Drawing Sheets

U.S. PATENT DOCUMENTS

| | | | | |
|---|---|---|---|---|
| 5,864,088 | A | * | 1/1999 | Sato et al. .................... 174/386 |
| 5,990,417 | A | * | 11/1999 | Senda et al. ................ 174/391 |
| 6,104,530 | A | * | 8/2000 | Okamura et al. ............ 359/359 |
| 6,869,683 | B2 | | 3/2005 | Sakurai et al. ............... 428/448 |
| 6,921,573 | B2 | | 7/2005 | Watanabe et al. ........... 428/343 |
| 7,160,636 | B2 | | 1/2007 | Kondo et al. ............. 428/836.1 |
| 2004/0108486 | A1 | | 6/2004 | Yoshida et al. ............ 252/62.54 |
| 2004/0157085 | A1 | | 8/2004 | Kondo et al. ................ 428/692 |
| 2004/0219328 | A1 | | 11/2004 | Tasaki et al. | |
| 2006/0038630 | A1 | | 2/2006 | Kawaguchi et al. ........... 333/12 |
| 2006/0083948 | A1 | | 4/2006 | Kawaguchi et al. ...... 428/692.1 |
| 2007/0077369 | A1 | | 4/2007 | Kondo et al. ................ 427/547 |

FOREIGN PATENT DOCUMENTS

| | | | |
|---|---|---|---|
| JP | 07-212079 | | 8/1995 |
| JP | 9-035927 | | 2/1997 |
| JP | 09-074297 | | 3/1997 |
| JP | 09-093034 | | 4/1997 |
| JP | 09-115708 | | 5/1997 |
| JP | 09-130077 | | 5/1997 |
| JP | 09-181476 | | 7/1997 |
| JP | 10-229292 | | 8/1998 |
| JP | 10-308596 | | 11/1998 |
| JP | 11-354972 | | 12/1999 |
| JP | 2000-196281 | | 7/2000 |
| JP | 2000196281 | A * | 7/2000 |
| JP | 2000-307287 | | 11/2000 |
| JP | 2000-348916 | | 12/2000 |
| JP | 2001-053485 | | 2/2001 |
| JP | 2001-053487 | | 2/2001 |
| JP | 2001-308574 | | 11/2001 |
| JP | 2001-308583 | | 11/2001 |
| JP | 2002-084091 | | 3/2002 |
| JP | 2002-118008 | | 4/2002 |
| JP | 2003-078276 | | 3/2003 |
| JP | 05-115692 | | 4/2003 |
| JP | 2003-115692 | | 4/2003 |
| JP | 2003-324299 | | 11/2003 |
| JP | 2003-343627 | | 3/2008 |
| JP | 2003-343631 | | 3/2008 |
| WO | WO 03/021610 | | 3/2003 |

OTHER PUBLICATIONS

Shigehiro Ohnuma et al., Proceedings of the 131$^{st}$ Conference, pp. 17-24, Jul. 4, 2003; The Magnetics Society of Japan.

Masaki Abe et al., Proceeding of the 131$^{st}$ Conference, pp. 25-31, Jul. 4, 2003; The Magnetics Society of Japan.

International Search Report PCT/JP2004/003951 dated Jun. 18, 2004.

Tsuyoshi Ideguchi, et al., "Reduction Characteristics of Common Mode Effective Power on Metallic Lines When Putting a Thin Metal Plate Close To Them", pp. 1386-1390, No. 7, vol. J84-B, (Jul. 2001) Journal of The Institute of Electronics Information and Communication Engineers of Japan. English translation attached.

Office Action issued on Mar. 11, 2008 in counterpart Japanese Patent Application Nos. 2003-343627 and 2003-343631.

Yamaguchi, "Engineering Plastics Application Handbook," First Edition, Gijutsu-Hyohron Co., Ltd., Dec. 15, 1982, p. 68 (with English translation of Table 2.3).

Office Action issued on Oct. 21, 2008 in counterpart Japanese Patent Application No. 2004-018465, with English translation thereof.

Ki Hyeon Kim et al., "Applications of Spin Sprayed Ferrite Films on Coplanar Transmission Line for RF Noise Suppression", *Trans. Magn. Soc. Japan*, 3(4):pp. 133-136 (2003).

Japanese Office Action (for Japanese Patent Appl. No. 2004-059115) dated May 12, 2009 (with English translation).

Japanese Office Action (for Japanese Patent Appl. No. 2004-018466) dated May 12, 2009 (with English translation).

Japanese Office Action (for Japanese Patent Appl. No. 2003-338422) dated May 12, 2009 (with English translation).

International Search Report for PCT/JP2004/002104 dated May 18, 2004.

Masaki Abe et al., "Microwave and Nano-biomagnetic Applications of Ferrite Thin Films and Fine Particles Prepared from an Aqueous Solution", *Journal of the Magnetics Society of Japan*, 27(6):721-729, 2003 (Eng. Abstract only).

\* cited by examiner

ELECTROMAGNETIC NOISE SUPPRESSOR, ARTICLE WITH ELECTROMAGNETIC NOISE SUPPRESSING FUNCTION, AND THEIR MANUFACTURING METHODS

CROSS REFERENCE TO RELATED APPLICATION

The present application is a 35 U.S.C. § 371 national phase conversion of PCT/JP2004/003951 filed 23 Mar. 2004, which claims priority of Japanese Application No. 2003-083335 filed Mar. 25, 2003, Japanese Application No. 2003-173428 filed Jun. 18, 2003, Japanese Application No. 2003-192361 filed Jul. 4, 2003, Japanese Application No. 2003-293927 filed Aug. 15, 2003, Japanese Application No. 2003-338422 filed Sep. 29, 2003, Japanese Application No. 2003-343627 filed Oct. 1, 2003, Japanese Application No. 2003-343631 filed Oct. 1, 2003, Japanese Application No. 2004-018465 filed Jan. 27, 2004, Japanese Application No. 2004-018466 filed Jan. 27, 2004, and Japanese Application No. 2004-059115 filed Mar. 3, 2004.

TECHNICAL FIELD

The present invention relates to an electromagnetic noise suppressor that suppresses electromagnetic noise, an article with an electromagnetic noise suppressing function, and a method of manufacturing the same.

BACKGROUND ART

In recent years, as the use of the Internet increases, electoronic apparatuses that use CPUs running at high clock frequencies in the sub-microwave band (0.3 to 10 GHz), electronic apparatuses that use high frequency bus, and telecommunication apparatuses that utilize radio waves have been increasing, such as personal computers, home appliances having information processing functions, wireless LAN, bluetooth-equipped apparatuses, optical module, mobile telephones, mobile information terminals and intelligent road traffic information system. This trend leads to a society of ubiquitous computing that requires devices of higher performance with high-speed digital information processing function and low-voltage driving. However, as such apparatuses become popular, concerns have been increasing on the problems related to the electromagnetic interference such as malfunctions of the apparatus that emit electromagnetic radiation or other apparatuses and health threats to the human body. For this reason, such an apparatus is required to minimize the emission of unnecessary electromagnetic radiation so as not to affect its own operation and that of other apparatuses and not to cause adverse effect on the human body, and to operate without malfunction when subjected to electromagnetic radiation emitted by other apparatuses. Measures to prevent such electromagnetic interference include the use of an electromagnetic radiation shielding material that reflects electromagnetic radiation and the use of an electromagnetic absorbing material.

As the means for preventing electromagnetic interference between electronic apparatuses, electromagnetic radiation shielding material is provided on the surface of the housing of the electronic apparatus or between electronic apparatuses so as to block electromagnetic radiation (inter-system EMC). As a means for preventing electromagnetic interference within an electronic apparatus, electronic components and circuits are covered with electromagnetic radiation shielding material so as to prevent the electronic components and circuits from interfering with each other and resulting in malfunction, and suppressing the processing speed from decreasing and signal waveform from being distorted (intra-system EMC).

It has also been proposed to suppress the generation of electromagnetic noise by providing electromagnetic noise suppressing measures to electronic components that are the sources of the electromagnetic noise or to suppress the interference between signals thereby to improve the transmission characteristic in near-field environments such as within an electronic apparatus (micro EMC).

Electronic apparatuses and electronic components are recently required to have higher performance and be smaller and lighter in weight, and the electromagnetic noise suppressor used in these apparatuses or components is also required to have high electromagnetic noise suppressing effects in a high-frequency band such as sub-microwave band, become smaller and lighter in weight, and be easy to carry out by the work which takes measures with electromagnetic noise suppressing measures.

Conventional electrically conductive shield strengthens electromagnetic coupling due to the reflection from unnecessary radiation source. Therefore, it is said to be effective to suppress the unnecessary radiation source by making use of magnetic loss of magnetic material, namely the imaginary part of complex permeability $\mu''$. Japanese Patent Application, First Publication No. Hei 9-93034 discloses an electromagnetic radiation absorbing material made by adding about 95% by weight of such a magnetic powder to an organic binding agent as thickness of flaked powder of soft magnetic material is smaller than the skin depth, having sufficiently high aspect ratio with the magnetic material turned to be non-conductive. The electromagnetic radiation absorbing material is said to have high electromagnetic radiation absorbing property and flexibility. In this example, an electromagnetic radiation absorbing material provided with a backing made of a copper plate is used for evaluation, and thickness of the electromagnetic radiation absorbing material and the copper plate used for measurement combined is 2 mm.

However, thickness of the electromagnetic radiation absorbing material and the copper plate combined is 2 mm and sheet thickness of the electromagnetic radiation absorbing material excluding the copper plate is as thick as 1 mm or more, and is heavy because 95% by weight of the electromagnetic radiation absorbing material consists of ferromagnetic material such as iron. Therefore, it cannot be said that weight reduction has been achieved. It is also not sufficiently robust and flexible since its content of organic binding agent is small. Moreover, the flaked powder of soft magnetic material is expensive because it requires tedious processes to form the soft magnetic material in flakes and making the surface not electrically conductive. The electromagnetic radiation absorbing material that uses the flaked powder of soft magnetic material in a large amounts also is expensive and cannot satisfy the needs of industry.

Japanese Patent Application, First Publication No. Hei 9-181476 discloses an electromagnetic radiation absorbing material made by forming a layer of a ferromagnetic element and ceramic element by magnetron sputtering on a substrate, and annealing at a low temperature so as that ultra-fine crystal of ferromagnetic material precipitates in the ceramic phase of high resistivity thereby achieving isolation. It is claimed that the electromagnetic radiation absorbing material has high electrical resistance in a high-frequency band from 100 MHz to 10 GHz, capability to suppress the reflection of electromagnetic radiation due to eddy current and a large value of imaginary part of complex permeability μ", thus resulting in high electromagnetic radiation absorbing property.

It is said that the electromagnetic radiation absorbing material requires heat treatment at a high temperature in order to form the ultra-fine crystal of ferromagnetic material in the ceramic phase. In this example, a film is formed from ceramic and ferromagnetic elements on a glass slide by a RF magnetron sputtering method, and heat treatment is applied at a temperature from 200 to 350° C., thereby forming the ultra-fine crystal of ferromagnetic material. It cannot be avoided to use an organic film that has high heat resistance as the organic film of this electromagnetic radiation absorbing material, although the ceramic phase and ultra-fine crystal of ferromagnetic material phase are formed on the organic film. Since the organic film which has high heat resistance is expensive, the electromagnetic radiation absorbing material that uses it is also expensive. Moreover, even when the ultra-fine crystal of ferromagnetic material is formed on the organic film having high heat resistance, there is a significant difference in the thermal expansion coefficient between the organic film and the ceramic phase that causes cracks, resulting in a material far from being flexible or tough.

As for the electromagnetic noise suppressor, it has been proposed to make a thin electromagnetic noise suppressor that has electromagnetic noise suppressing effect in the sub-microwave band by ferrite plating technology (Masaki ABE et al., Proceedings of the 131$^{st}$ Conference, pp 25-31, Jul. 4, 2003; The Magnetics Society of Japan).

The electromagnetic noise suppressor based on the ferrite plating technology is made by applying a reaction solution of chlorides of iron, nickel and zinc and an oxidation liquid comprising sodium nitrate and ammonia acetate on a polyimide sheet placed on a rotary substrate, so as to form a ferrite compound film having a thickness of 3 μm by plating by a spin spray process. This electromagnetic noise suppressor has, despite smaller thickness, electromagnetic noise suppressing effect similar to that of the conventional electromagnetic noise suppressor made in a sheet 50 μm thick by dispersing the fine particles of flake-shaped metal in the organic binding agent, and is said to be advantageously applied to small electoronic apparatuses.

However, thickness of the ferromagnetic layer of this electromagnetic noise suppressor is from 3 to 11 μm and power loss of the electromagnetic noise suppressor at 1 GHz is about 0.2 even when formed with a large thickness, resulting in insufficient electromagnetic noise suppressing effect in low frequency portion of the sub-microwave band. When the thickness of the ferromagnetic material increases, sufficient robustness and flexibility cannot be achieved since the ferrite layer formed on the polyimide is hard and does not contain organic binding agent. Moreover, since it is made in a wet process, it requires tedious processes such as removal of impurities and drying, and does not satisfy the needs of industry.

It has also been proposed to make an electromagnetic noise suppressor comprising a ultra-fine crystal of a ferromagnetic material film containing alumina ceramics phase and ultra-fine crystal phase of ferromagnetic material of iron or cobalt (Shigehiro OHNUMA et al., Proceedings of the 131$^{st}$ Conference, pp 17-24, Jul. 4, 2003; The Magnetics Society of Japan). This proposal relates to an electromagnetic noise suppressor having a thickness of 1 μm made by forming layer of ferromagnetic element and ceramic element by high-frequency magnetron sputtering on a substrate, annealing at a low temperature so that ultra-fine crystals of ferromagnetic material precipitate in the ceramic phase of high resistivity and dividing by forming a slit so as to increase resistivity of the film further, which is claimed to have high noise suppressing effect.

However, this electromagnetic noise suppressor has electromagnetic radiation absorbing property similar to that of the conventional electromagnetic noise suppressor made in a sheet 50 μm thick by dispersing the fine particles of flake-shaped metal in the organic binding agent and power loss of about 0.2 at 1 GHz, resulting in insufficient electromagnetic noise suppressing effect in the effective frequency band. Also, it is necessary to apply heat treatment in order to form the ultra-fine crystals of ferromagnetic material in the ceramic phase and a micro slit must be formed by photolithography or by means of a dicing saw in order to increase the resistivity of the thin magnetic film, making the process tedious. Also because it is a thin ceramic film, it is prone to cracks, resulting in a material which is far from being flexible or robust.

Electrical and electoronic apparatuses are required to have flame retarding property (in accordance with UL94 V-0, V-1 or VTM-0, VTM-1) to ensure safety, and the electromagnetic noise suppressor used in such an apparatus is also required to have flame retarding property (in accordance with UL94 V-0, V-1 or VTM-0, VTM-1). The UL refers to standards specified by Underwriters Laboratory Inc. of the United States for the safety of electrical apparatuses, and UL94 is a standard relating to flame retarding property. Flame retarding property specified in UL94 V-0, V-1 or VTM-0, VTM-1 will hereinafter be referred to simply as flame retarding property.

Japanese Patent Application, First Publication No. 2000-196281 discloses an electromagnetic radiation absorbing material that has flame retarding property made by applying a coating material containing a high-polymer binding agent, a soft magnetic material powder and a phosphorus-based flame retarding agent on a supporting body thereby forming an electromagnetic radiation absorbing layer.

However, in the case in which the soft magnetic material powder is used as the electromagnetic radiation absorbing material, a large quantity of the soft magnetic material powder must be used in order to achieve sufficient effect of absorbing electromagnetic radiation, the amount being 100 parts by weight for 5 to 12 parts by weight of the high-polymer binding agent. Also, in the case in which the soft magnetic material powder is used as the electromagnetic radiation absorbing material, the electromagnetic radiation absorbing layer must be made thick in order to achieve sufficient effect of absorbing electromagnetic radiation. As a result, the electromagnetic radiation absorbing material becomes heavy because the electromagnetic radiation absorbing layer has a high specific gravity and is thick. Also there has been a problem in that it is difficult to reduce the space requirement because the electromagnetic radiation absorbing layer is provided on the support material and is thick. Moreover, since the soft magnetic material powder is a metal powder, it can easily generate heat and ignite. Therefore, a large amount of the flame retarding agent must be added in order for the electromagnetic radiation absorbing material to exhibit sufficient flame retarding property. Also, because the electromagnetic radiation absorbing material consists mostly of soft magnetic material powder with a small proportion occupied by the polymer binding agent, it is less flexible and is brittle.

Japanese Patent Application, First Publication No. 2002-84091 proposes an electromagnetic radiation absorbing sheet formed by stacking an electromagnetic radiation absorbing material consisting of ferrite powder or soft magnetic material powder mixed in a resin as an electromagnetic radiation absorbing material that has flame retarding property and a flame retarding material.

However, in the case of a ferrite powder or the soft magnetic material powder is used as the electromagnetic radiation absorbing material, a large amount of the material must be used in order to achieve sufficient effect of absorbing electromagnetic radiation, the amount being about 90% by weight of the electromagnetic radiation absorbing material. Also, when ferrite powder or the soft magnetic material powder is used as the electromagnetic radiation absorbing material, the electromagnetic radiation absorbing layer must be made thick in order to achieve sufficient effect of absorbing electromagnetic radiation. As a result, the electromagnetic radiation absorbing material is heavy because the electromagnetic radiation absorbing layer has a high specific gravity and is thick. Also, there has been a problem in that it is difficult to reduce the space requirement because the electromagnetic radiation absorbing material has a large thickness. Moreover, since ferrite powder and soft magnetic material powder can easily generate heat and ignite, it may be difficult to prevent it from burning simply by laminating a flame retarding material. Also, because the electromagnetic radiation absorbing material consists mostly of ferrite powder and soft magnetic material powder with a small proportion occupied by a resin, it is less flexible and is brittle.

Japanese Patent Application, First Publication No. Hei 7-212079 discloses an electromagnetic interference suppressor that comprises an electrically conductive support member and an insulating soft magnetic material layer provided on at least one surface of the electrically conductive support member, where the insulating soft magnetic material layer contains soft magnetic material powder and an organic binding agent.

This electromagnetic interference suppressor has a large thickness and contains much magnetic material in the entire region of the insulating soft magnetic material layer, and is therefore heavy. It is also not sufficiently tough and flexible, and does not meet the requirements for high-density packaging.

With the background described above, an object of the present invention is to provide an electromagnetic noise suppressor that has high electromagnetic noise suppressing effect in the sub-microwave band, requires small installation space and is light in weight, articles such as electronic components and printed wiring board that are provided with electromagnetic noise suppressing means and a manufacture method that these can be manufactured easily.

Another object of the present invention is to provide an electromagnetic noise suppressor that is flexible and has high strength.

Still another object of the present invention is to provide an electromagnetic noise suppressor that has a sufficient flame retarding property.

A further object of the present invention is to provide an electromagnetic noise suppressor that also has an electromagnetic radiation shielding property.

DISCLOSURE OF INVENTION

The electromagnetic noise suppressor of the present invention includes a base material containing a binding agent and a composite layer formed by integrating the binding agent that is a part of the base material and a magnetic material. This electromagnetic noise suppressor has high electromagnetic noise suppressing effect in the sub-microwave band and enables it to reduce the space requirement and weight.

The composite layer is desirably a layer formed by physical vapor deposition of a magnetic material on the base material surface. In such a composite layer, the magnetic material is dispersed in the binding agent so that the magnetic material and the binding agent are integrated to provide high electromagnetic noise suppressing effect. The composite layer does not contain impurity ions so that there is no possibility of damage to the electronic circuit by the impurity ions.

The electromagnetic noise suppressor of the present invention has maximum transmission attenuation of electromagnetic radiation per unit thickness of the composite layer preferably in a range from $-0.5$ to $-500$ dB/µm. In such a composite layer, the magnetic material is dispersed in the binding agent so that the magnetic material and the binding agent are integrated to provide high electromagnetic noise suppressing effect.

The electromagnetic noise suppressor of the present invention has maximum transmission attenuation of electromagnetic radiation, preferably in a range from $-10$ to $-50$ dB. Such an electromagnetic noise suppressor has even higher electromagnetic noise suppressing effect.

The electromagnetic noise suppressor of the present invention has maximum reflective attenuation at the frequency where it exhibits maximum transmission attenuation of electromagnetic radiation, preferably in a range from $-6$ to $-50$ dB. Such an electromagnetic noise suppressor has even higher electromagnetic noise suppressing effect.

The electromagnetic noise suppressor of the present invention has power loss at 1 GHz preferably in a range from $-0.3$ to $-0.65$ dB. Such an electromagnetic noise suppressor has even higher electromagnetic noise suppressing effect.

The thickness of the composite layer is preferably in a range from 0.005 to 20 µm, more preferably from 0.005 to 3 µm, even more preferably from 0.005 to 1 µm, and most preferably in a range from 0.005 to 0.3 µm. Such an electromagnetic noise suppressor has further higher electromagnetic noise suppressing effect and enables it to reduce the space requirement and weight.

The electromagnetic noise suppressor of the present invention has specific gravity desirably in a range from 0.9 to 1.5. Such an electromagnetic noise suppressor has a composite layer thin enough. In such a composite layer, the magnetic material is dispersed in the binding agent so that the magnetic material and the binding agent are integrated to provide high electromagnetic noise suppressing effect.

The electromagnetic noise suppressor of the present invention may also be constituted from a plurality of electromagnetic noise suppressors stacked one on another. Such an electromagnetic noise suppressor has even higher electromagnetic noise suppressing effect due to larger total amount of the magnetic material.

The binding agent is preferably a resin or a rubber. When a resin or a rubber is used for the binding agent, an electromagnetic noise suppressor that is flexible and has high strength can be made.

Alternatively, the binding agent is preferably a hardening resin. The binding agent, when the binding agent comprises a hardening resin, the magnetic material can be dispersed in the binding agent that has not yet cured more uniformly. After the binding agent has cured, the magnetic material does not crystallize into fine particles, and such a composite layer can be obtained where the binding agent and the magnetic material are integrated at the atomic level.

The elastic modulus in shear of the binding agent is preferably in a range from $1\times10^4$ to $1\times10^{10}$ Pa, and more preferably in a range from $1\times10^4$ to $5\times10^7$ Pa. When the elastic modulus in shear of the binding agent is set in this range, the magnetic material is dispersed in the binding agent so that the binding agent and the magnetic material are integrated, thereby forming a composite layer having high electromagnetic noise suppressing effect.

It is preferable that the electromagnetic noise suppressor of the present invention further has a thermally conductive layer containing a thermally conductive filling agent. Such an electromagnetic noise suppressor has a high heat dissipating property.

It is preferable that the electromagnetic noise suppressor of the present invention further has a support layer. Such an electromagnetic noise suppressor has high flexibility and high strength, and is easier to handle, even when the base material that constitutes the composite layer is made thinner.

The base material preferably contains a flame-retarding agent of non-halogen and non-antimony material (hereinafter referred to as non-halogen, non-antimony flame retarding agent). The electromagnetic noise suppressor containing such a base material has sufficient flame retarding performance.

Alternatively, it is preferable that the electromagnetic noise suppressor of the present invention further have a flame retarding resin layer. Such an electromagnetic noise suppressor has sufficient flame retarding performance.

The base material preferably contains an electrically conductive filler. The electromagnetic noise suppressor having such a base material has electromagnetic radiation shielding property as well, and does not aggravate electromagnetic coupling due to the reflection of electromagnetic radiation.

The electrically conductive filler is preferably an electrically conductive fine powder of at least one kind selected from a group consisting of metal powder, metal fiber, metal-coated fine particles, fine carbon particles and carbon nanotubes. The base material containing such an electrically conductive fine powder has higher electromagnetic radiation shielding property.

Alternatively, it is preferable that the electromagnetic noise suppressor of the present invention further have an electrically conductive layer. Such an electromagnetic noise suppressor has electromagnetic radiation shielding property as well, and does not aggravate electromagnetic coupling due to the reflection of electromagnetic radiation.

The electrically conductive layer is preferably at least one kind selected from the group consisting of metal foil, fabric of metal fibers, fabric of electrically conductive fibers, interlaced metal wires, interlaced electrically conductive fibers, organic polymer layer containing an electrically conductive filling agent dispersed therein and electrically conductive film. The electromagnetic noise suppressor having such an electrically conductive layer has further higher electromagnetic radiation shielding property.

The electrically conductive film preferably includes a support film and a metal layer having a thickness in a range from 5 to 500 nm formed on the support film by physical vapor deposition. The electromagnetic noise suppressor having such an electrically conductive film has high flexibility and enables it to reduce the space requirement and weight.

The metal layer is preferably formed by an opposing target type magnetron sputtering process. The opposing target type magnetron sputtering process is highly evaluated in terms of environment conservation and productivity.

The base material preferably contains a dielectric powder. The electromagnetic noise suppressor having such a base material achieves impedance matching with the space and makes the undesirable reflection of electromagnetic radiation less likely to occur.

The dielectric material powder is preferably at least one kind selected from a group consisting of barium titanate-based ceramic, zirconium titanate-based ceramic and lead perovskite-based ceramic. The base material containing such a dielectric material powder has higher effect of suppressing the undesirable reflection of electromagnetic radiation.

The method of manufacturing the electromagnetic noise suppressor of the present invention includes a vapor deposition process of physically vapor-depositing a magnetic material onto the surface of a base material containing a binding agent to form a composite layer on the surface of the base material. Such a manufacturing method makes it easily to manufacture the electromagnetic noise suppressor of the present invention that has the composite layer constituted from the binding agent and the magnetic material integrated together.

In the method of manufacturing the electromagnetic noise suppressor of the present invention, it is desirable that the magnetic material be applied by physical vapor deposition on the surface of the base material containing the binding agent by means of opposing target type magnetron sputtering process. Such a manufacturing method causes the magnetic material to be dispersed in the binding agent so that the magnetic material and the binding agent are integrated, thereby making it possible to easily manufacture the electromagnetic noise suppressor having further higher electromagnetic noise suppressing effect.

In the method of manufacturing the electromagnetic noise suppressor of the present invention, it is desirable that the magnetic material be applied to the surface of the base material containing the binding agent by physical vapor deposition with particle energy in a range from 5 to 1000 eV. Such a manufacturing method causes the magnetic material to be dispersed in the binding agent so that the magnetic material and the binding agent are integrated, thereby making it possible to easily manufacture the electromagnetic noise suppressor having further higher electromagnetic noise suppressing effect.

In the method of manufacturing the electromagnetic noise suppressor of the present invention, it is desirable that the amount of the magnetic material deposited is in a range from 0.5 to 200 nm in terms of thickness of the magnetic material film. Such a manufacturing method causes the magnetic material to be dispersed in the binding agent so that the magnetic material and the binding agent are integrated, thereby making it possible to easily manufacture the electromagnetic noise suppressor having further higher electromagnetic noise suppressing effect.

Another method of manufacturing the electromagnetic noise suppressor of the present invention includes a stack fabricating process of fabricating a stack by stacking other layers on a base material containing a binding agent, and a vapor deposition process of physically vapor-depositing a magnetic material onto the surface of the base material containing a binding agent to form a composite layer on the surface of the base material. Such a manufacturing method makes it easy to manufacture the electromagnetic noise suppressor of the present invention that has the composite layer constituted from the binding agent and the magnetic material integrated together and another layer.

An article with an electromagnetic noise suppressing function of the present invention is an article with at least a part of the surface thereof covered by the electromagnetic noise suppressor of the present invention. The article with an electromagnetic noise suppressing function enables it to dispose the electromagnetic noise suppressor in a small space near a noise source and efficiently suppress electromagnetic noise in a sub-microwave band.

A method of manufacturing the article with an electromagnetic noise suppressing function of the present invention includes a coating process of coating at least a part of the surface of the article with a binding agent and a vapor deposition process of physically vapor-depositing a magnetic material onto the surface of a base material to form a composite layer on the surface of the base material. Such a manufacturing method makes it easy to manufacture the article with an electromagnetic noise suppressing function that can efficiently suppress electromagnetic noise in a sub-microwave band.

BEST MODE FOR CARRYING OUT THE INVENTION

The present invention will now be described in detail.

The electromagnetic noise suppressor of the present invention comprises a base material containing a binding agent and a composite layer formed by integrating the binding agent that is a part of the base material and a magnetic material.

Figure 1:
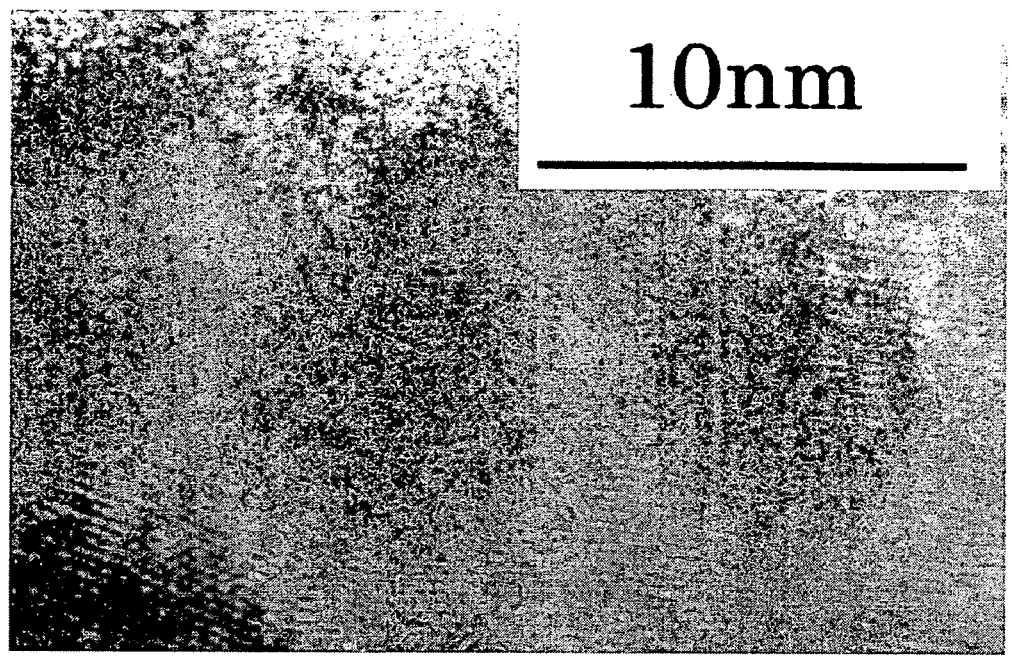
FIG. 1 shows an image of a composite layer of an electromagnetic noise suppressor of the present invention observed with a high-resolution transmission electron microscope.
Figure 2:
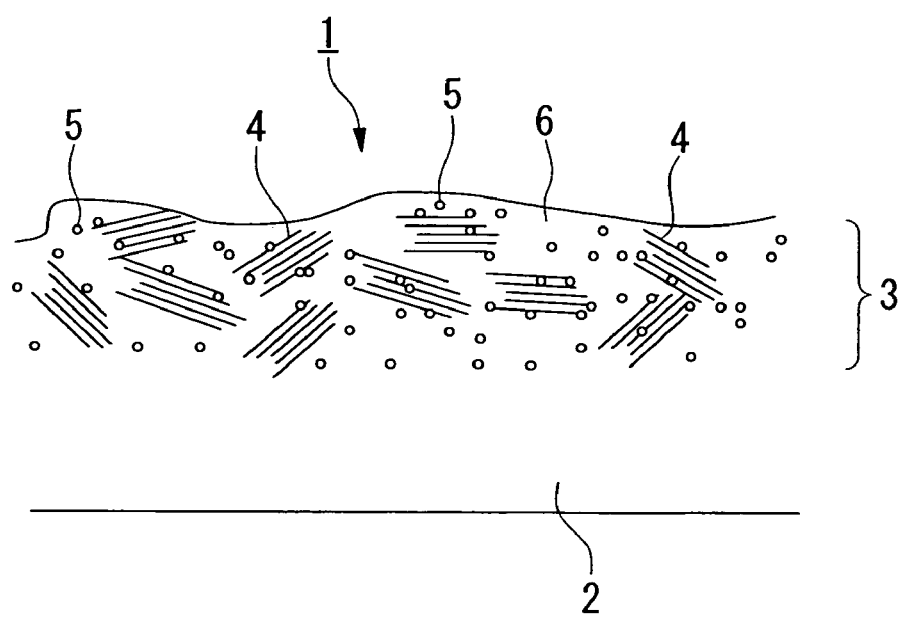
FIG. 2 is a schematic diagram showing the vicinity of the composite layer in an example.

More specifically, as shown in high-resolution transmission electron microscope image of FIG. 1 and the sketch of FIG. 2 which simplifies the electron microscope image, the electromagnetic noise suppressor 1 comprises the base material 2 containing the binding agent and the composite layer 3 consisting of atoms of the magnetic material mixed with molecules of the binding agent that is a part of the base material 2.

<Composite Layer>

The composite layer 3 is, for example, a layer formed by physical vapor deposition of a magnetic material on the surface of the base material 2, where the magnetic material applied by physical vapor deposition is dispersed in the binding agent in the atomic state, without forming a homogeneous film.

As shown in FIG. 2, the composite layer 3 consists of a portion where very small crystals of the magnetic material atoms disposed at a spacing of several angstroms in crystal lattice 4 is observed, a portion where only the binding agent 6 is observed without the magnetic material in a very small region, and a portion where atoms of the magnetic material 5 are dispersed without crystallizing in the binding agent. Thus it is considered that the magnetic material and the binding agent are integrated in a complex heterogeneous structure on the nanometer scale, without any grain boundary that shows the presence of fine particles of the magnetic material in crystal structure.

The thickness of the composite layer 3 is the depth of infiltration of the atoms of the magnetic material into the surface layer of the base material 2, that is dependent on such factors as the weight of the magnetic material deposited, kind of the binding agent and the conditions of physical vapor deposition, and is roughly in a range from 1.5 to 3 times the thickness of the magnetic material layer formed by the vapor deposition. The thickness of the magnetic material layer formed by the vapor deposition means the thickness of the layer formed by the vapor deposition of the magnetic material on a hard base material that does not allow infiltration of the atoms of the magnetic material.

Figure 3:
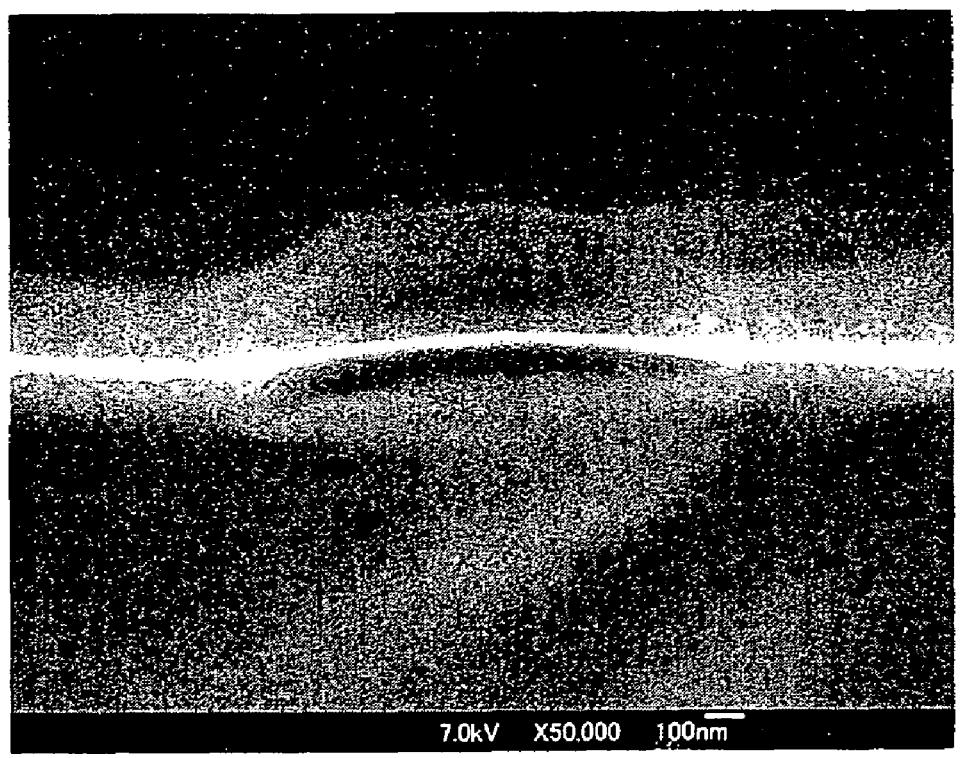
FIG. 3 is a SEM image of a base material coated with magnetic material by physical vapor deposition in a sectional view.

The thickness of the composite layer 3 can be determined from the image of a cross section taken by a transmission electron microscope or a scanning electron microscope (SEM). An SEM image of a cross section of the base material with a magnetic material layer formed by physical vapor deposition is shown in FIG. 3. This shows the cross section of the base material, excluding protrusions on the surface that will be described later, where the composite layer (white horizontal line at the center) having a thickness of 40 nm (0.04 µm) is formed by vapor deposition of the magnetic material in a amount equivalent to 30 nm in thickness onto an elastic material containing about 45% by weight of inorganic filler such as wet silica.

By forming the composite layer 3 with thickness of 0.005 µm or more, atoms of the magnetic material can be dispersed in the binding agent and integrated therewith, supposedly providing a large loss characteristic in high-frequency region due to morphological anisotropy, thus achieving sufficient electromagnetic noise suppressing effect. When the thickness of the composite layer exceeds 20 µm, on the other hand, a clear crystalline structure and then a homogeneous film of the magnetic material is formed to become a bulk magnetic material. This leads to a decrease in morphological anisotropy and less electromagnetic noise suppressing effect. Therefore, thickness of the composite layer 3 is preferably 3 µm or less, more preferably 1 µm or less, and most preferably 0.3 µm or less.

When the magnetic material is deposited so as to form a homogeneous film, eddy currents are generated because of the low resistivity of the magnetic material, resulting in diminishing electromagnetic noise suppressing effect of the magnetic material while reflecting function becoming dominant instead. Thus the film reflects electromagnetic noise generated by electronic circuits and components, instead of suppressing it, thus causing adverse effect on the electronic circuits. Therefore, homogeneous magnetic material film should not be formed during physical vapor deposition of the magnetic material on the base material 2. Surface resistivity (D.C. resistivity) of the composite layer 3 is preferably in a range from about $1 \times 10^1$ to $1 \times 10^{10}$ Ω/□.

<Base Material>

(Binding Agent)

Examples of the binding agent that is the main component of the base material 2 include, but are not limited to, organic materials, for example, resins such as polyolefine resin, polyamide resin, polyester resin, polyether resin, polyketone resin, polyimide resin, polyurethane resin, polysiloxane resin, phenol resin, epoxy resin, acrylic resin and polyacrylate resin; diene rubbers such as natural rubber, isoprene rubber, butadiene rubber and styrene butadiene rubber; non-diene rubbers such as butyl rubber, ethylene propylene rubber, urethane rubber and silicone rubber. The binding agent may also be of thermoplastic or thermosetting in nature, or a material that has not yet cured. The resin or rubber described above that is modified, mixed or copolymerized may also be used.

The binding agent may also be an inorganic material that has a low elastic modulus in shear that will be described later, such as an aero gel or foamed silica that has high void ratio and such a level of hardness that can capture fine particles. It may also be used in the form of composite material with the organic material described above.

The binding agent preferably has a low elastic modulus in shear in view of the ease of atoms of the magnetic material infiltrating into the binding agent during the physical vapor deposition of the magnetic material. The elastic modulus in shear is preferably in a range from $1 \times 10^4$ to $1 \times 10^{10}$ Pa, and more preferably in a range from $1 \times 10^4$ to $5 \times 10^7$ Pa. The elastic modulus in shear is measured at the normal temperature according to a procedure specified in JIS K 6254. A desirable value of elastic modulus in shear may be obtained by heating the binding agent to a temperature of 100 to 300° C., although the temperature must be controlled so as not to decompose or vaporize the material. When physical vapor deposition is carried out at the normal temperature, the binding agent is preferably an elastic material having hardness of about 80° (JIS-A).

When elastic modulus in shear of the binding agent is low, atoms of the magnetic material are more likely to be dispersed in the surface layer of the base material due to infiltration of the atoms of the magnetic material into the base material 2 or deformation and fluidization of the binding agent caused by collision of the atoms of the magnetic material during the physical vapor deposition of the magnetic material onto the base material 2.

Figure 4:
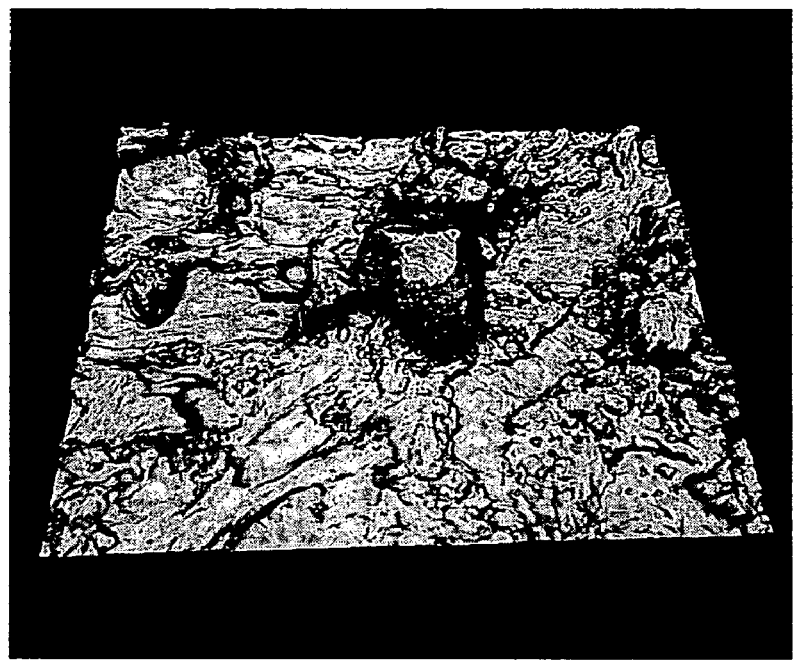
FIG. 4 is a laser microscope image of the surface of the base material coated with magnetic material by physical vapor deposition (73.5 µm along one side, in perspective view).
Figure 5:
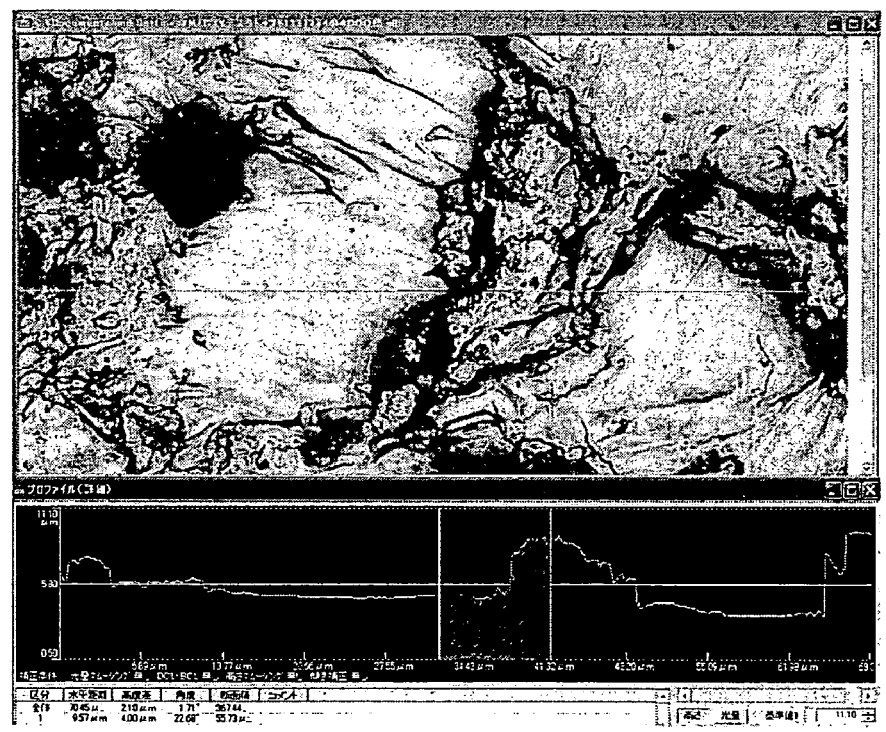
FIG. 5 is a laser microscope image of measuring the section of the base material coated with magnetic material by physical vapor deposition.
Figure 6:
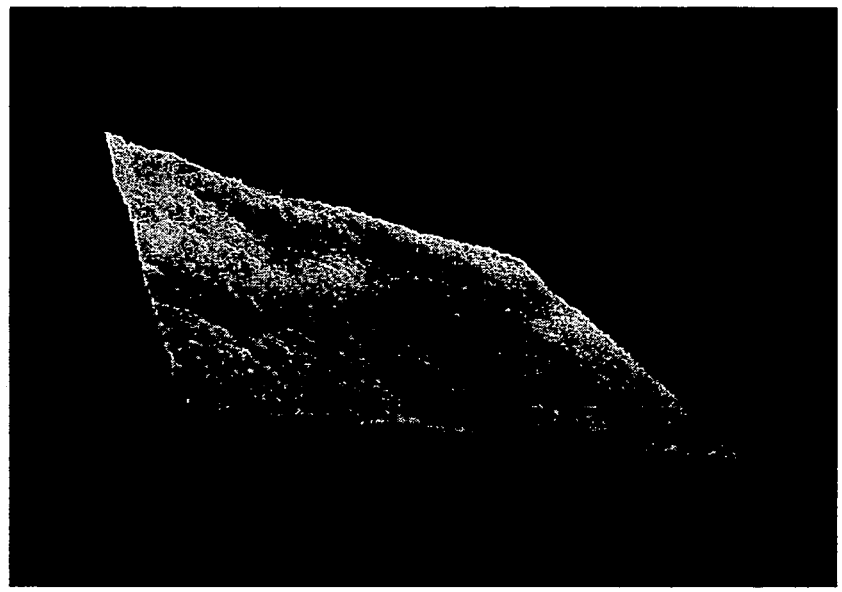
FIG. 6 is a laser microscope image of the surface of the base material before being coated with magnetic material by physical vapor deposition (73.5 µm along one side, in perspective view).
Figure 7:
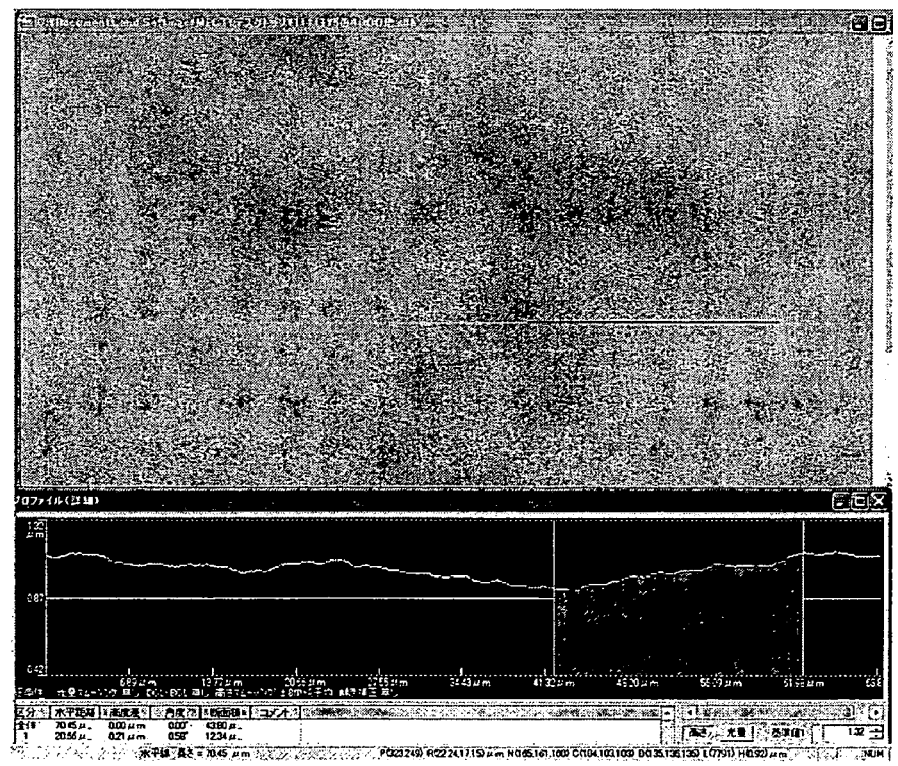
FIG. 7 is a laser microscope image of measuring the section of the base material before being coated with magnetic material by physical vapor deposition.

FIG. 4 is a laser microscope image of the surface of the base material coated with magnetic material by vapor deposition, showing the presence of bumps and recesses on the surface. FIG. 5 shows the measurement of surface roughness, indicating that the bumps are about 6 µm in height. FIG. 6 that is a laser microscope image of the surface of the base material before vapor deposition, on the other hand, shows that the surface before vapor deposition is flat. FIG. 7 shows the measurement of cross section, indicating that mean surface roughness is 0.05 µm. From FIGS. 4 to 7, it can be seen that vapor deposition resulted in deformation or fluidization of the base material.

It is preferable that the binding agent have high elastic modulus in shear after physical vapor deposition of the magnetic material, in order to maintain the heterogeneous structure described previously. By processing the binding agent to have a high elastic modulus in shear after physical vapor deposition of the magnetic material, it is made possible to surely prevent the atoms of the magnetic material or clusters thereof from coagulating and crystallizing into fine particles on the nanometer scale. Specifically, elastic modulus in shear is preferably in a range from $1 \times 10^7$ Pa or higher in a temperature range in which the electromagnetic noise suppressor is used. It is preferable to crosslink the binding agent after physical vapor deposition of the magnetic material, in order to obtain the desired value of elastic modulus in shear.

In this regard, the binding agent is preferably a thermosetting resin or a resin that is cured when exposed to an energy beam (ultraviolet light, electron beam) which allows the elastic modulus to below during vapor deposition and can be increased by crosslinking after the vapor deposition.

Size of the gap between molecules through which the atoms of the magnetic material can penetrate may be represented by gas permeability. While it is ideal to evaluate the gap between molecules of the binding agent by using the permeability of argon gas or krypton gas of which atom has a size comparable to that of the magnetic material, these gases are not commonly used in the measurement of gas permeability. Therefore, permeability of carbon dioxide may be used instead. Resins that have high values of permeability to carbon dioxide gas at the normal temperature include polyphenylene oxide, polymethylpentene, nylon 11, mixture or copolymer of high-impact polystyrene or other rubber component and other component having carbon dioxide gas permeability of $1 \times 10^{-9}$ [cm$^3$ (STP) cm/(cm$^2 \times$s$\times$cmHg)] or higher, or polybutadiene, polyisoprene, styrene butadiene rubber or silicone rubber having carbon dioxide gas permeability of $1 \times 10^{-8}$ [cm$^3$ (STP) cm/(cm$^2 \times$s$\times$cmHg)] or higher. Among these, rubbers such as silicone rubber are particularly preferable in view of the elastic modulus in shear.

In order to prevent oxidization of the magnetic material, the binding agent is preferably a resin that has low permeability to oxygen, such as polyethylene, poly-trifluorochloroethylene or polymethyl methacrylate having oxygen permeability of $1 \times 10^{-10}$ [cm$^3$ (STP) cm/(cm$^2 \times$s$\times$cmHg)] or lower, or polystyrene terephthalate or polyacrylonitrile having oxygen permeability of $1 \times 10^{-12}$ [cm$^3$ (STP) cm/(cm$^2 \times$s$\times$cmHg)] or lower.

The binding agent may also contain silane coupling agent, titanate coupling agent, nonionic surfactant, polar resin oligomer or the like, so that part of the magnetic material that has been turned into plasma or ionized can react with the binding agent and be stabilized. Adding such an additive enables it to not only prevent oxidization but also prevent a homogeneous film from being formed by the coagulation of atoms so as to prevent the reflection of electromagnetic radiation by the homogeneous film, thereby improving the absorbing property.

It is also preferable to process the surface of the base material 2 so as to add unevenness to the surface. Mean surface roughness is preferably in a range from about 0.5 to 10 µm. While there is no restriction on the method of adding unevenness to the surface, sand blasting, etching or transfer of a rough surface may be employed.

The base material is preferably a foamed material since it contains voids. The foamed material preferably has such a structure that is constituted from fine cells and continuous voids and does not have a skin layer on the surface. Cell size is about 100 µm or less, and preferably 50 µm or less. Void ratio is preferably in a range from 5 to 50%.

(Non-Halogen, Non-Antimony Flame Retarding Agent)

The base material 2 may contain non-halogen, non-antimony flame retarding agent added thereto in order to give flame retarding property to the electromagnetic noise suppressor of the present invention.

It is essential that the flame retarding agent not contain halogen element or antimony. Compounds that contain a halogen element or antimony are regarded as imposing a load on the environment, and it is inevitable that commercial products not contain a halogen element or antimony.

However, non-halogen material cannot be regarded as being completely free of halogen elements. It is because chlorine exists in the natural environment and also the material synthesizing process uses halogen compounds such as epichlorohydrin in the case of synthesis of epoxy resin, halogen element remains in the product material even when it has been refined, which is very difficult to remove completely. According to the present invention, therefore, a material is defined as halogen-free when the contents of chlorine and bromine therein are both not higher than 0.09% as measured in accordance to the halogen-free copper-clad plate test method (JPCA-ES-01) of the JPCA Standards.

The non-halogen, non-antimony flame retarding agent may be one of known materials, either in liquid or solid phase.

Selection of the non-halogen, non-antimony flame retarding agent is based on the kind of resin or rubber that is used as the binding agent. For example, phosphorus-based flame retarding agent, nitrogen-based flame retarding agent, metal hydroxide, metal oxide, silicone-based flame retarding agent or platinum compound may be used as the non-halogen, non-antimony flame retarding agent.

Phosphorus-based flame retarding agents include triphenyl phosphate, tricresyl phosphate, trixylenyl phosphate, triethyl phosphate, cresylphenyl phosphate, xylenyl-diphenyl phosphate, cresyl(di-2,6-xylenyl) phosphate, 2-ethylhexyl-diphenyl phosphate, dimethylmethyl phosphate, red phosphorus, yellow phosphorus, etc.

Nitrogen-based flame retarding agents include guanidine-based flame retarding agents such as guanidine sulfaminate, guanidine phosphate; urea-granyl-based flame retarding agents such as urea-granyl phosphate; melamine-based flame retarding agent such as melamine sulfate and poly-melamine phosphate.

A phosphazene-based flame retarding agent that is a compound of phosphorus and nitrogen and has a double bond may also be used. The phosphazene compounds such as propoxyphosphazene, phenoxyphosphazene or aminophosphazene may be used as the phosphazene-based flame retarding agent.

As the metal hydroxide, aluminum hydroxide, magnesium hydroxide, dolomite, hydrotalcite, calcium hydroxide, barium hydroxide, zirconium hydroxide, hydrate of tin oxide, etc. may be used. Other inorganic flame retarding agents include metal powder such as aluminum, iron, titanium, manganese, zinc, molybdenum, cobalt, bismuth, chromium, nickel, copper, tungsten or tin, metal oxide such as silica, aluminum oxide, iron oxide, titanium oxide, manganese oxide, magnesium oxide, zirconium oxide, zinc oxide, molybdenum oxide, cobalt oxide, bismuth oxide, chromium oxide, tin oxide, nickel oxide, copper oxide or tungsten oxide, and compound such as zinc borate, zinc metaborate, barium metaborate, zinc carbonate, magnesium carbonate, calcium carbonate or barium carbonate.

As the silicone-based flame retarding agent, silicone powder having an epoxy group or a methacryl group may be used.

As the platinum compound, platinum hexachlorate (IV), dinitrodiamine platinum (II), tetramine dichloroplatinum (II), etc., may be used.

As the flame retarding agent, besides the so-called additive flame retarding agent that is simply added to the binding agent, such a reactive flame retarding agent may also be used that reacts with the skeleton of the binding agent and introduces into the binding agent a compound that includes flame retarding elements such as nitrogen or phosphorus.

Flame retarding agents are divided into a type that resists flames and a type that resists glowing, and it is effective to use flame retarding agents in combination of a plurality of types in accordance to the application. Since a flame retarding agent may compromise other properties of the electromagnetic noise suppressor while making the electromagnetic noise suppressor difficult to burn, type and amount of the flame retarding agent must be set for proper trade-off of the properties.

The amount of the non-halogen, non-antimony flame retarding agent to be added varies depending on the types of the binding agent and the flame retarding agent. In the case of the phosphorus-based flame retarding agent, for example, 0.5 to 20 parts by weight of the flame retarding agent is preferably added for 100 parts by weight of the binding agent. In the case of metal hydroxide, 50 to 300 parts by weight of the flame retarding agent is preferably added for 100 parts by weight of the binding agent. In the case of the platinum compound, for example, 0.01 to 1 part by weight of the flame retarding agent is preferably added for 100 parts by weight of the binding agent. When the amount of non-halogen, non-antimony flame retarding agent is insufficient, sufficient flame retarding property may not be given to the electromagnetic noise suppressor. When excessive amount of non-halogen, non-antimony flame retarding agent is added, desired level of elastic modulus in shear of the binding agent may not be obtained and at least one of the mechanical strength of the binding agent, such as tear strength and tensile strength may decrease.

The electromagnetic noise suppressor shows sufficient flame retarding property when the base material 2 thereof includes the non-halogen, non-antimony flame retarding agent. Since the magnetic material is integrated with the binding agent at the atom level in the composite layer 3, it is made possible to suppress such a problem as the electromagnetic noise suppressor becomes easier to burn due to the catalyst effect or increase in thermal conductivity due to the magnetic material powder with decreasing self-extinguishing performance as in the case of the electromagnetic noise suppressor containing the conventional magnetic material powder dispersed in the binding agent. As a result, the amount of the non-halogen, non-antimony flame retarding agent can be significantly reduced in comparison to the conventional electromagnetic noise suppressor.

(Electrically Conductive Filler)

An electrically conductive filler may be added to the base material 2 in order to give shielding property as the electromagnetic noise reflecting effect to the electromagnetic noise suppressor of the present invention. The electromagnetic noise suppressor 10 shown in FIG. 8 includes a support layer 8, the base material 2 stacked on the support layer 8 and the composite layer 3 where atoms of the magnetic material are mixed with a part of the base material 2. In the base material 2, a dielectric material powder 11 and the electrically conductive filler 12 are dispersed in the binding agent 6.

The electrically conductive filler 12 is preferably an electrically conductive powder of at least one type selected from a group consisting of metal powder, metal fiber, metal-coated fine particles, fine carbon particles and carbon nano-tube, in order to further improve the shielding property.

While the shape of the electrically conductive filler 12 varies depending on the kind of material, it may be metal particles of indefinite shape, needle shaped such as carbon nano-tubes or a structured sphere of carbon, and there is no restriction on the shape as long as the material increases electrical conductivity when added. Size of the electrically conductive filler 12 is preferably 10 μm or less in the case of particles or indefinite shape, or 5 μm or less in fiber diameter in the case of fibers. Larger size increases the thickness of the base material 2 and makes it difficult to make a thin product.

The amount of the electrically conductive filler 12 dispersed in the base material is preferably from 10 to 50% by volume of the base material 2 (100% by volume). When the content is less than 10% by volume, it becomes difficult to stably achieve electrical conductivity and, when the content exceeds 50% by volume, elastic modulus in shear of the base material 2 becomes so high that it is difficult to form the composite layer 3 through integration with the magnetic material.

Intrinsic volume resistivity (may also be referred to as intrinsic resistivity) of the base material 2 containing the electrically conductive filler 12 is preferably 500 Ω·cm or less as measured according to JIS K 7194, and more preferably 50 Ω·cm or less.

Figure 8:
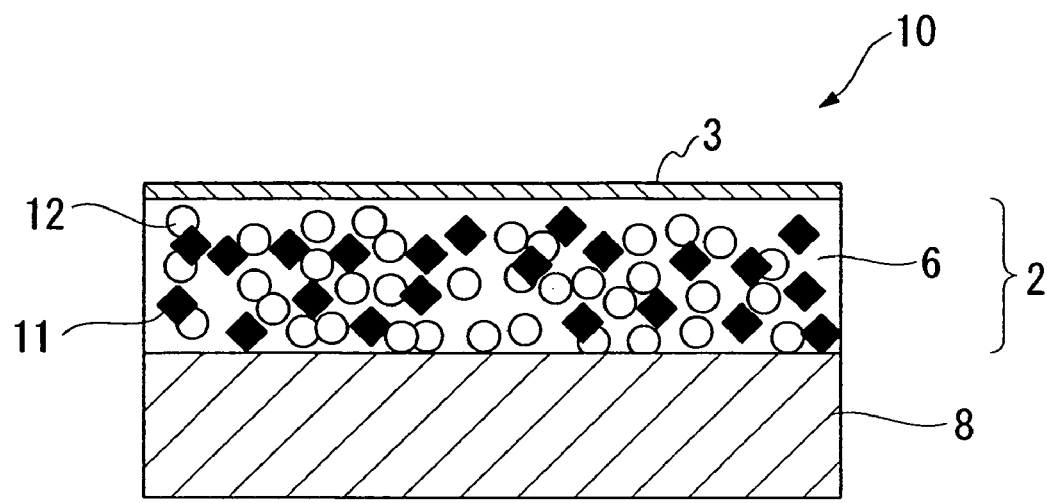
FIG. 8 is a schematic sectional view showing an example of electromagnetic noise suppressor of the present invention.

In the electromagnetic noise suppressor shown in FIG. 8, the composite layer 3 suppresses the noise generated by electronic components and circuits, the electrically conductive filler 12 dispersed in the base material 2 shields the noise generated from the substrate or other component outside of the electronic components and suppresses the electromagnetic coupling from increasing due to reflection of unnecessary electromagnetic radiation.

(Dielectric Material Powder)

An electrically conductive powder 11 may be contained in the base material 2 in order suppress the reflection of unnecessary electromagnetic radiation.

The electrically conductive powder 11 is preferably such a material that has high dielectric constant in high-frequency region, and relatively flat frequency characteristic of the dielectric constant. Since addition of the electrically conductive powder 11 achieves impedance matching with the space, reflection of unnecessary electromagnetic radiation becomes less likely to occur.

It is preferable to use at least one kind of dielectric material powder selected from a group consisting of barium titanate-based ceramic, zirconium titanate-based ceramic and lead provskite-based ceramic for the electrically conductive powder 11, in order to prevent the reflection of unnecessary electromagnetic radiation becomes from occurring.

While there is no restriction on the particle shape of the dielectric material powder 11, substantially spherical particles are preferred. Particle size of the dielectric material powder 11 is preferably 5 μm or less. When larger than 5 μm, the dielectric material powder 11 cannot be dispersed in the base material and it becomes difficult to make a thin product. Particle size is more preferably 1 μm or less.

The amount of the dielectric material powder 11 to be added is preferably from 5 to 50% by volume of the base material 2 (100% by volume). When the content is less than 5% by volume, the effect of dielectric loss in high-frequency region cannot be achieved. When the content exceeds 50% by volume, elastic modulus in shear of the base material 2 becomes so high that it is difficult to form the composite layer 3 through integration with the magnetic material.

In the case in which both the dielectric material powder 11 and the electrically conductive filler 12 are added together, they may be added in such quantities that achieve the respective effects, but the total amount of the dielectric material powder 11 and the electrically conductive filler 12 is preferably not more than 50% by volume of the base material 2 (100% by volume). When the total amount exceeds 50% by volume, elastic modulus in shear of the base material 2 becomes so high that it is difficult to form the composite layer 3 through integration with the magnetic material.

(Other Additives)

In addition to the above, the binding agent may also contain reinforcement fillers, dispersants, anti-aging agents, anti-oxidizing agents, colorants, thixotropy enhancing agents, plasticizers, lubricants, antistatic agents, heat resistance enhancing agents and ultraviolet absorbents. Care should be exercised, however, since adding a hard material leads to collision with the atoms of the magnetic material, thus resulting in insufficient dispersion. substituent may also be improved by coating with silicon oxide or silicon nitride by vapor deposition, after the vapor deposition of the magnetic material.

<Support Layer>

Figure 9:
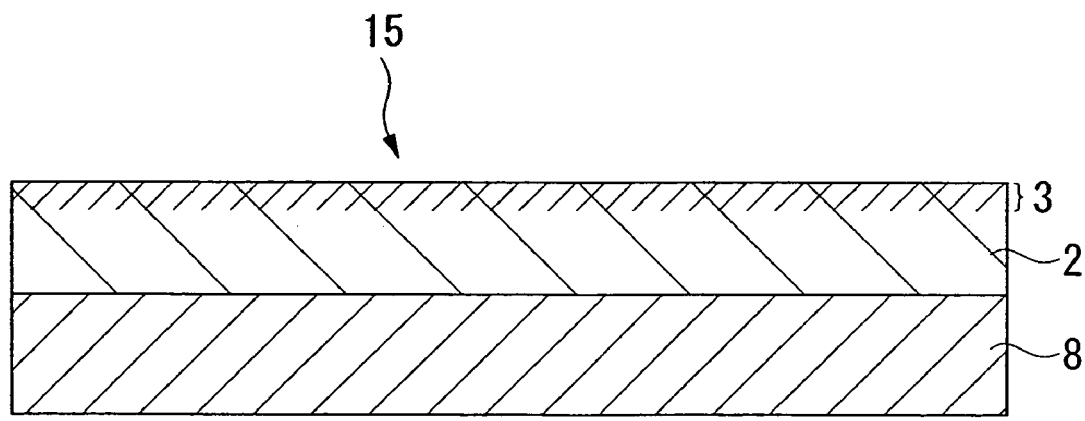
FIG. 9 is a schematic sectional view showing another example of the electromagnetic noise suppressor of the present invention.

In the case in which the base material 2 is difficult to handle due to small thickness or elastic modulus in shear in the operating temperature range, the support layer 8 may be provided to form electromagnetic noise suppressor 15 as shown in FIG. 9. The support layer 8 may be either made of a material similar to that of the base material 2, or metal foil or ceramic foil that has flexibility. It is preferable that rigidity of the support layer 8 be higher than that of the binding agent 6 that constitutes the base material 2, and elastic modulus in shear be higher. It is desirable that the support layer 8 be thin, of which thickness is preferably 50 μm or less, more preferably 25 μm or less.

<Heat Conduction Layer>

The electromagnetic noise suppressor of the present invention may be provided with a heat conduction layer so as to have heat dissipating property.

The heat conduction layer is, for example, a sheet containing thermally conductive filler. The thermally conductive filler may be a metal such as copper or aluminum, a low-melting point alloy of such metals as aluminum or indium, metal oxide such as alumina, silica, magnesia, red oxide, beryllia or titania, metal nitride such as aluminum nitride, silicon nitride or boron nitride, or a compound such as silicon carbide, but is not limited to these materials.

Mean particle size of the thermally conductive filler is preferably in a range from 0.1 to 100 μm, and more preferably from 1 to 50 μm. When mean particle size is less than 0.1 μm, specific surface area of the particles becomes too large and it becomes difficult to fill with high density. When mean particle size exceeds 100 μm, the heat conduction layer may have finely roughened surface, resulting in resistance to heat transmission through contact.

Content of the thermally conductive filler is preferably in a range from 10 to 85% by volume, depending on the kind of filler. When the content is less than 10% by volume, required level of heat conductivity may not be obtained. When the content exceeds 85% by volume, the sheet may become very brittle.

While there is no restriction on the material that makes the heat conduction layer, silicone rubber, urethane rubber or the like is preferably used for the reason of heat resistance and weatherability. The electromagnetic noise suppressor having the heat conduction layer is particularly useful for the application of dissipating heat from semiconductor that generates much heat such as power transistors or thyristors.

<Flame Retarding Resin Layer>

The electromagnetic noise suppressor of the present invention may be provided with a flame retarding resin layer so as to have flame retarding property.

Figure 10:
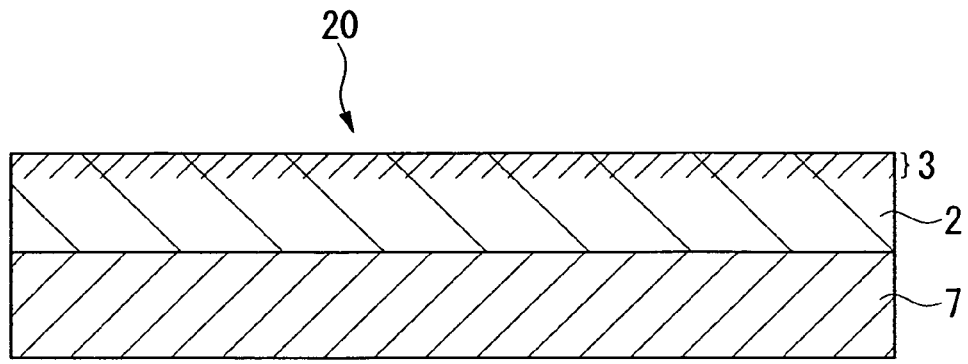
FIG. 10 is a schematic sectional view showing another example of the electromagnetic noise suppressor of the present invention.
Figure 11:
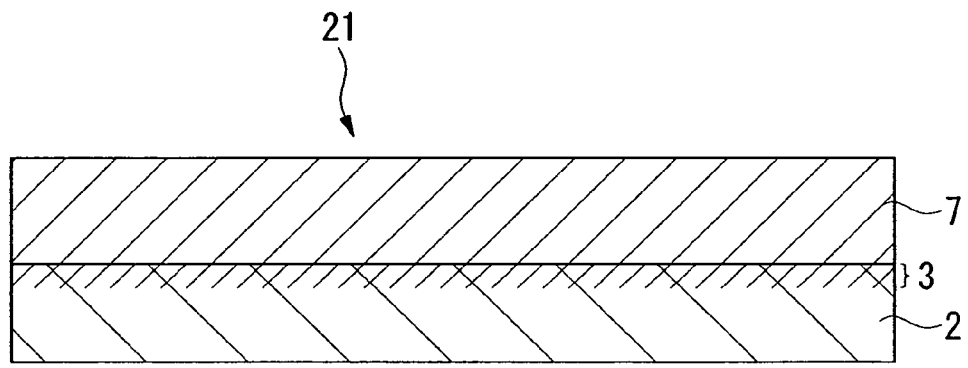
FIG. 11 is a schematic sectional view showing another example of the electromagnetic noise suppressor of the present invention.
Figure 12:
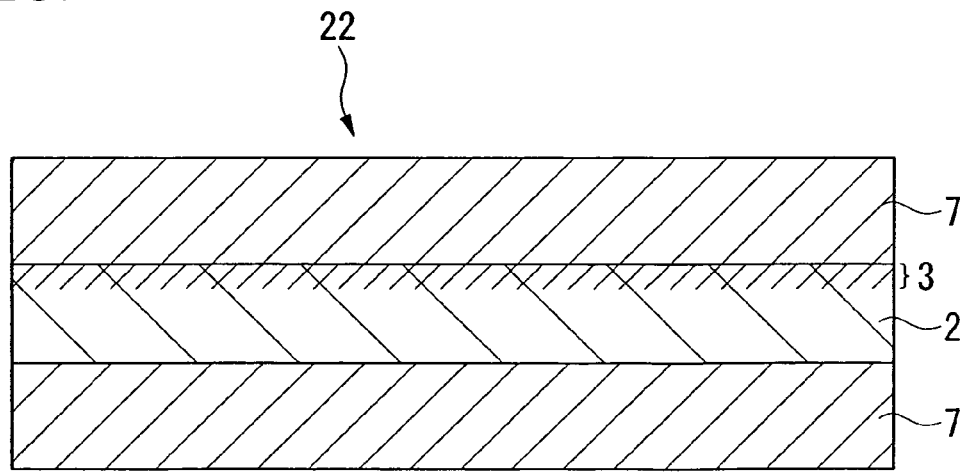
FIG. 12 is a schematic sectional view showing another example of the electromagnetic noise suppressor of the present invention.

The electromagnetic noise suppressor having the flame retarding resin layer may be formed as an electromagnetic noise suppressor 20 that comprises the flame retarding resin layer 7, the base material 2 that is stacked on the flame retarding resin layer 7 and the composite layer 3 consisting of atoms of the magnetic material mixed with molecules of the binding agent that is a part of the base material 2, as shown in FIG. 10. It may also be formed as an electromagnetic noise suppressor 21 that comprises the base material 2, the composite layer 3 consisting of atoms of the magnetic material mixed with molecules of the binding agent that is a part of the base material 2 and the flame retarding resin layer 7 that is stacked on the surface of the composite layer 3, as shown in FIG. 11, or an electromagnetic noise suppressor 22 that comprises the flame retarding resin layer 7, the base material 2 stacked on the surface thereof, the composite layer 3 consisting of atoms of the magnetic material mixed with molecules of the binding agent that is a part of the base material 2 and the flame retarding resin layer 7 that is stacked on the surface of the composite layer 3, as shown in FIG. 12.

The flame retarding resin layer 7 is formed from a flame retarding resin layer. The flame retarding resin layer is a resin that is hard to ignite and, even when ignited, extinguishes in a short time.

As the flame retarding resin layer, resins that have high decomposition temperatures and do not generate much combustible material when decomposed, or that have high critical oxygen indices may be used. Specifically, fluororesin, polyimide resin, polyamideimide resin, polyethersulfone resin, polyether-etherketone resin, polyether-imide resin, polyphenylene sulfide resin or liquid crystal polymer may be used. The flame retarding resin layer preferably has flame retarding property of UL94 VTM-0, VTM-1 or UL94 V-0, V-1.

Even a resin that is poor in flame retarding property may be used as the flame retarding resin layer of the present invention, if it acquires flame retarding property of UL94 VTM-0, VTM-1 or UL94 V-0, V-1 by adding a flame retarding agent or combining with a flame retarding resin layer. However, it is desirable that a flame retarding agent based on halogen or antimony that imposes a load on the environment is not be used.

The flame retarding resin layer may contain reinforcement fillers, flame retarding agents, auxiliary flame retarding agents, anti-aging agents, anti-oxidizing agents, colorants, plasticizers, lubricants, heat resistance enhancing agents or the like.

While there is no limitation to the thickness of the flame retarding resin layer 7, it is preferably thin in order to produce a thin and compact electromagnetic noise suppressor. Specifically, the thickness is preferably 50 µm or less, more preferably 25 µm or less.

Since the electromagnetic noise suppressor of the present invention has such a constitution as the magnetic material is integrated with the binding agent at the atomic level in the composite layer 3, it is made possible to suppress problems such as the electromagnetic noise suppressor becoming easier to burn due to the catalyst effect or an due to increase in thermal conductivity caused by the magnetic material powder with decreasing self-extinguishing performance as in the case of the electromagnetic noise suppressor containing the conventional magnetic material powder dispersed in the binding agent. As a result, the electromagnetic noise suppressor of the present invention is rendered sufficient flame retarding property by simply providing the flame retarding resin layer 7.

(Electrically Conductive Layer)

An electrically conductive layer may be provided to the electromagnetic noise suppressor of the present invention in order to give shielding property for reflecting electromagnetic noise.

Figure 13:
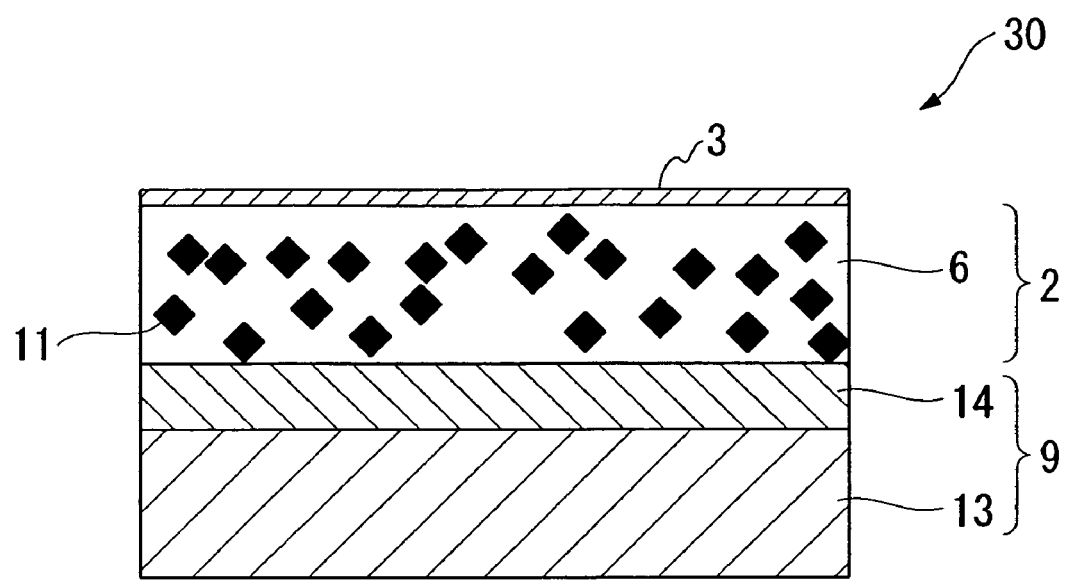
FIG. 13 is a schematic sectional view showing another example of the electromagnetic noise suppressor of the present invention.

The electromagnetic noise suppressor 30 shown in FIG. 13 comprises an electrically conductive layer 9, the base material 2 stacked on the electrically conductive layer 9 consisting of the dielectric material powder 11 dispersed in the binding agent 6 and the composite layer 3 where atoms of the magnetic material are mixed with a part of the base material 2. In this example, the electrically conductive layer 9 is constituted from an electrically conductive film comprising a support film 13 and a metal layer 14 formed by physical deposition of metal on the support film 13.

Figure 14:
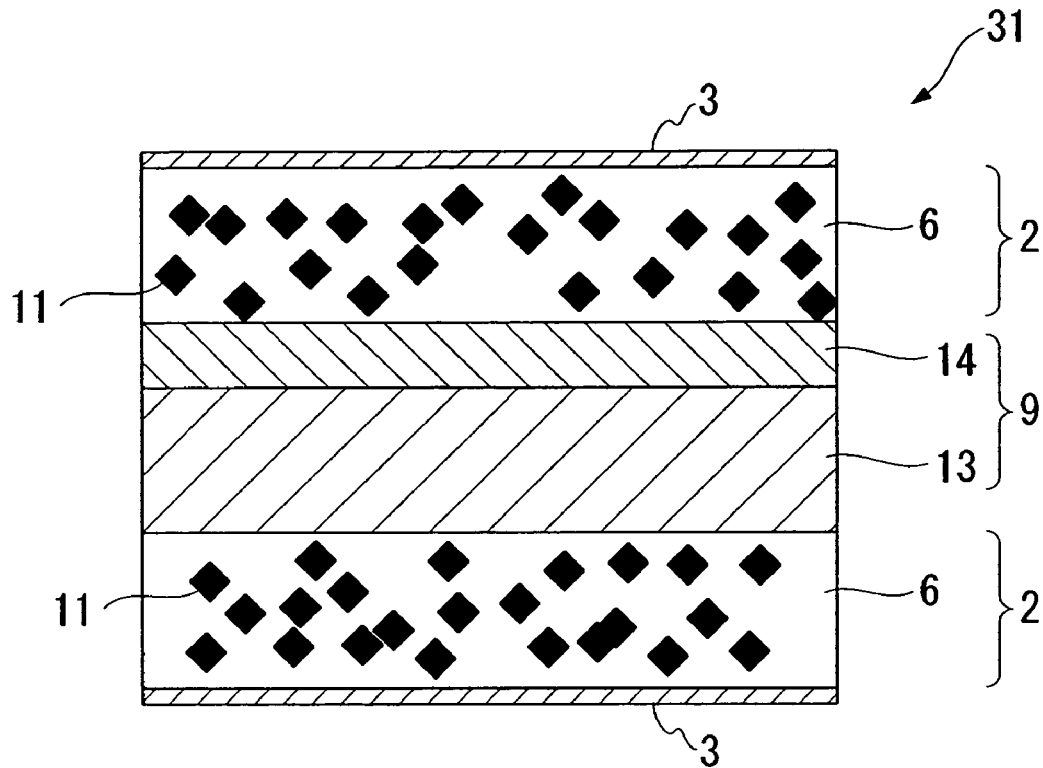
FIG. 14 is a schematic sectional view showing another example of the electromagnetic noise suppressor of the present invention.

In the electromagnetic noise suppressor 31 shown in FIG. 14, the base material 2 consisting of the dielectric material powder 11 dispersed in the binding agent 6 is provided on both sides of the electrically conductive layer 9 that consists of the dielectric material powder 11 having the support film 13 and the metal layer 14, and the composite layer 3 is provided on the surface of the base material 2.

Figure 15:
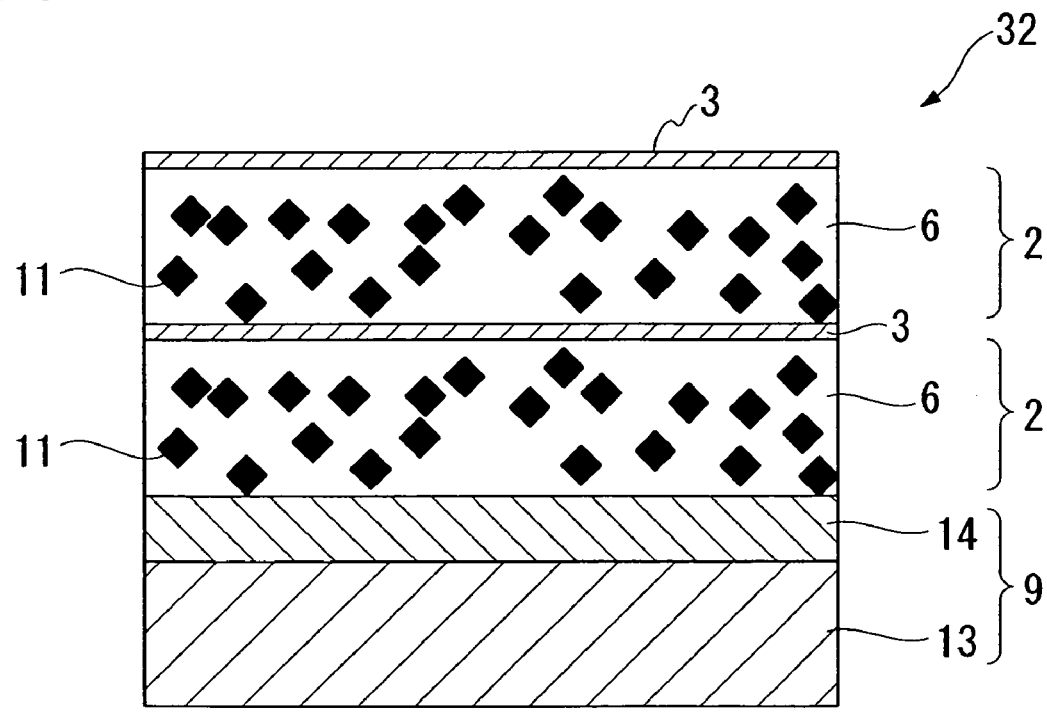
FIG. 15 is a schematic sectional view showing another example of the electromagnetic noise suppressor of the present invention.

In the electromagnetic noise suppressor 32 shown in FIG. 15, the base material 2 consisting of the dielectric material powder 11 dispersed in the binding agent 6 and the composite layer 3 are provided in plurality on one side of the electrically conductive layer 9 that consists of the support film 13 and the metal layer 14.

In the electromagnetic noise suppressor 30 shown in FIG. 13, one composite layer 3 is provided via the base material 2 on one side of the electrically conductive layer 9, although the composite layers 3 may be provided via the base material 2 on both sides of the electrically conductive layer 9 as shown in FIG. 14, or a plurality of the composite layers 3 may be provided via the base material 2 on one side of the electrically conductive layer 9 as shown in FIG. 15, in the electromagnetic noise suppressor of the present invention. In the aspects shown in FIGS. 13 and 15, the metal layer 14 may be provided either on the side of the electrically conductive layer 9 opposite to the base material 2 or on the base material 2 side. The metal layer 14 is preferably provided on the base material 2 side in order to protect the thin metal layer 14 in packaged condition.

Figure 16:
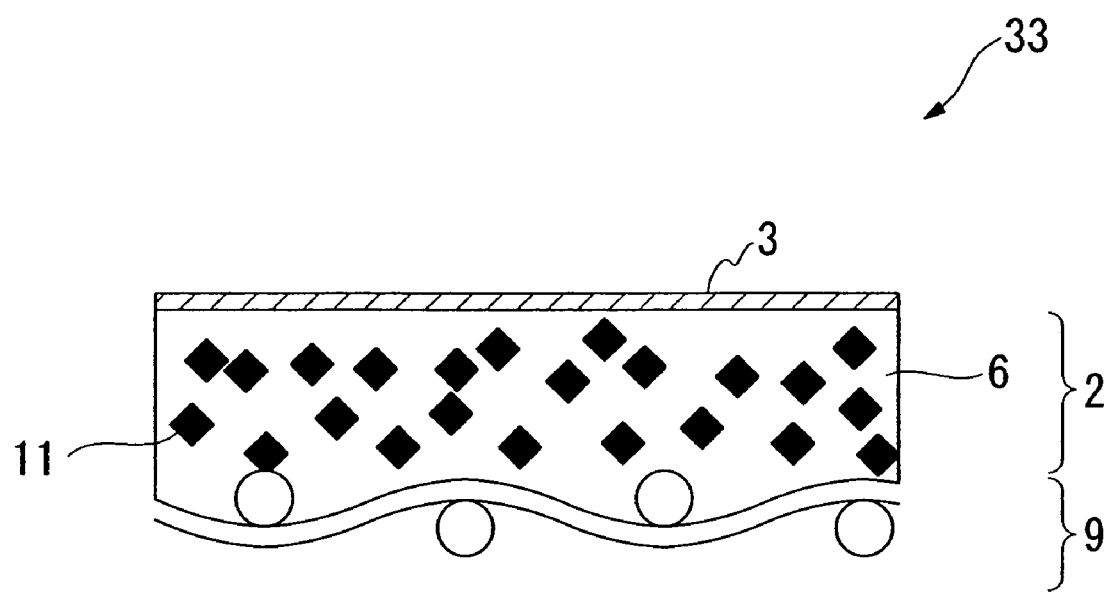
FIG. 16 is a schematic sectional view showing another example of the electromagnetic noise suppressor of the present invention.

The electromagnetic noise suppressor 33 shown in FIG. 16 is an example of an aspect where the electrically conductive layer 9 is made by interlacing of metal on the surface of which the base material 2 consisting of the dielectric material powder 11 dispersed in the binding agent 6 is provided and the composite layer 3 is provided where atoms of the magnetic material are mixed with a part of the base material 2.

Intrinsic volume resistivity of the electrically conductive layer 9 is preferably 500 Ω□cm or less as measured according to JIS K 7194, and more preferably 50 Ω□cm or less.

The electrically conductive layer 9 is preferably selected from a group consisting of metal foil, fabric of metal fibers, fabric of electrically conductive fibers, interlaced metal wires, interlaced electrically conductive fibers, organic polymer layer containing an electrically conductive filling agent dispersed therein and electrically conductive film.

The metal foil may be made of aluminum, nickel, tin, copper, phosphor bronze, nickel silver, brass or other copper alloy. The fabric of metal fibers may be, for example, made of nickel or stainless steel fibers. The fabric of electrically conductive fibers may be, for example, a nonwoven fabric of carbon fibers or polyester fibers coated with copper and nickel in two layers of plating. The interlaced electrically conductive fibers may be a mesh of nickel, tin, copper, phosphor bronze, nickel silver, brass or other copper alloy. The interlaced electrically conductive fibers may be, for example, a mesh of fibers plated with copper, nickel or other metal.

The electrically conductive layer 9 may be an organic polymer layer having electrically conductive filler dispersed therein. While there is no restriction on the organic polymer, it may be an insulating organic polymer. The organic polymer used in the electrically conductive layer may be, for example, resin such as polyolefine, polyester, polyether□ polyketone, polyurethane or the like, or elastomer such as silicone, isoprene, butadiene, styrene butadiene, urethane or ethylene propylene. The electrically conductive filler used in the electrically conductive layer may be metal particles, carbon fiber, carbon nano-tubes, fine carbon particles or the like.

The electrically conductive film may be, for example, one that consists of the support film 13 and the metal layer 14. In the case in which the electrically conductive film including the support film 13 and the metal layer 14 is used as the electrically conductive layer 9, thickness of the metal layer 14 is preferably in a range from 5 to 500 nm. When the thickness is less than 5 nm, electrical conductivity of the metal layer becomes unstable and may not be able to provide electromagnetic radiation shielding effect. Thickness exceeding 500 nm makes it economically disadvantageous. Thickness in a range from 5 to 150 nm is preferable in order to make the electromagnetic noise suppressor 30 lighter in weight, smaller in thickness and flexible.

The support film 13 may be made of, for example, a resin such as polyolefine, polyester, polyether, polyketone, polyurethane or the like, or an elastomer such as silicone, isoprene, butadiene, styrene butadiene, urethane or ethylene propylene. A flexible film such as polyimide film or polyester film may also be used.

The metal layer 14 may be formed by plating the support film 13 with a metal, laminating a metal foil on the support film 13, or physical vapor deposition of a metal on the support film 13. Among these, physical vapor deposition of a metal on the support film 13 makes it possible to obtain the metal layer 14 that satisfies the requirement of thickness from 5 to 500 nm and is uniform.

In the plating process, a metal such as nickel, tin, copper, phosphor bronze, nickel silver, brass or other copper alloy may be used. In the lamination process, a foil made of aluminum, copper or nickel may be used.

The physical vapor deposition of a metal to obtain the metal layer 14 is preferably carried out by opposing target type magnetron sputtering process. The opposing target type magnetron sputtering process, which is a dry process, does not require disposal of waste liquid and is safer and more favorable with regards to the environment than the plating process, which is a wet process that uses a plating liquid, and is regarded as a better process that can form the metal layer from uniform thin film while easily adjusting the film thickness with high productivity.

In the electromagnetic noise suppressor that has the electrically conductive layer 9, the composite layer 3 suppresses the noise generated by electronic components and circuits, and the electrically conductive layer 9 shields the noise generated from the substrate or other component outside of the electronic components and suppresses the electromagnetic coupling from increasing due to reflection of unnecessary electromagnetic radiation.

(Electromagnetic Noise Suppressor)

In the case in which the magnetic material has a size on the order of micrometers, it is necessary to use a large amount of the magnetic material with a high density and use thick and heavy electromagnetic noise suppressor in order to achieve high transmission absorbing rate. In the case in which the magnetic material having a size on the order of nanometers is integrated with the binding agent to form a complicated heterogeneous structure, a property different from the case of using the magnetic material on the order of micrometers is obtained, thus resulting in higher magnetic permeability and broader frequency band of absorption. Thus, it becomes unnecessary to use a large amount of the magnetic material with a high density and use thick and heavy electromagnetic noise suppressor in order to achieve a high transmission absorbing rate as in the above case.

Although it is difficult to directly observe the state of the magnetic material in the composite layer 3, it can be determined that the composite layer 3 has a complicated heterogeneous structure where the magnetic material having a size on the order of nanometers is integrated with the binding agent, by measuring the maximum transmission attenuation of electromagnetic radiation (dB/µm) per unit thickness of the composite layer 3 of the electromagnetic noise suppressor.

When maximum transmission attenuation of electromagnetic radiation per unit thickness of the composite layer 3 is in a range from −0.5 to −500 dB/µm, it is indicated that the magnetic material having a size on the order of nanometers is integrated with the binding agent. According to the present invention, it is necessary that maximum transmission attenuation of electromagnetic radiation per unit thickness of the composite layer 3 be in a range from −0.5 to −500 dB/µm. When this index is lower than −0.5 dB/µm (for example, −0.4 dB/µm) or higher than −500 dB/µm (for example, −600 dB/µm), the effect of suppressing electromagnetic noise or it becoming necessary to increase the thickness of the electromagnetic noise suppressor in order to obtain the desired effect of suppressing electromagnetic noise, thus resulting in limited space available for the electronic devices.

Maximum transmission attenuation of electromagnetic radiation refers to the maximum attenuation of transmission measured in the frequency band in which it is desired to suppress the electromagnetic noise. It is determined by measuring the electromagnetic radiation transmitted through the composite layer 3 while changing the frequency in bands such as from 10 MHz to 1 GHz, from 100 MHz to 3 GHz, from 1 to 3 GHz, from 3 to 20 GHz, from 20 to 50 GHz and 50 to 100 GHz, and taking the electromagnetic radiation transmission attenuation at the frequency where the electromagnetic radiation is attenuated most. The maximum transmission attenuation of electromagnetic radiation is −11.9 dB at 3.0 GHz where the curve of the electromagnetic radiation transmission attenuation (thick line) shows the lowest level in the graph shown in FIG. 21, −30.2 dB at 8.0 GHz where the curve of the electromagnetic radiation transmission attenuation (thick line) shows the lowest level in the graph shown in FIG. 22 and −32.9 dB at 15.7 GHz where the curve of the electromagnetic radiation transmission attenuation (thick line) shows the lowest level in the graph shown in FIG. 23.

Even when the electromagnetic radiation transmitted through the composite layer 3 is weak, it must have a practical value for the application, and it is necessary that the attenuation be in a range from −6 to −50 dB which is regarded as effective in suppressing the electromagnetic noise, and in a range from −10 to −50 dB at the peak.

Similarly, reflection of the electromagnetic radiation is preferably low in order to achieve electromagnetic noise suppressing effect, and reflection attenuation in a frequency band where transmission attenuation shows the maximum value is preferably in a range from −6 to −50 dB and more preferably from −10 to −50 dB.

The electromagnetic noise suppressor of the present invention can achieve a high power loss that represents the electromagnetic noise suppressing effect, supposedly because vapor deposition of a small amount of magnetic material onto the base material affects the quantum effect of granular particles of nanometer scale, magnetic anisotropy of the material, magnetic morphological anisotropy or anisotropy due to external magnetic field, although theoretical explanation has not been presented.

Figure 33:
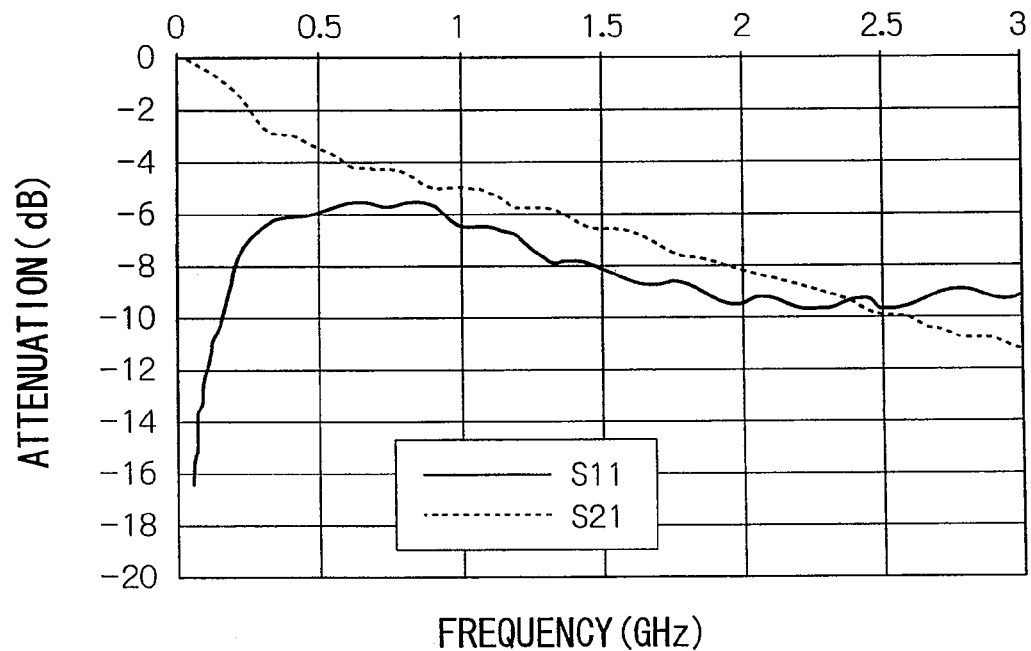
FIG. 33 is a graph showing the frequency characteristic of reflecting attenuation of transmitted noise in the electromagnetic noise suppressor of Example 17.
Figure 34:
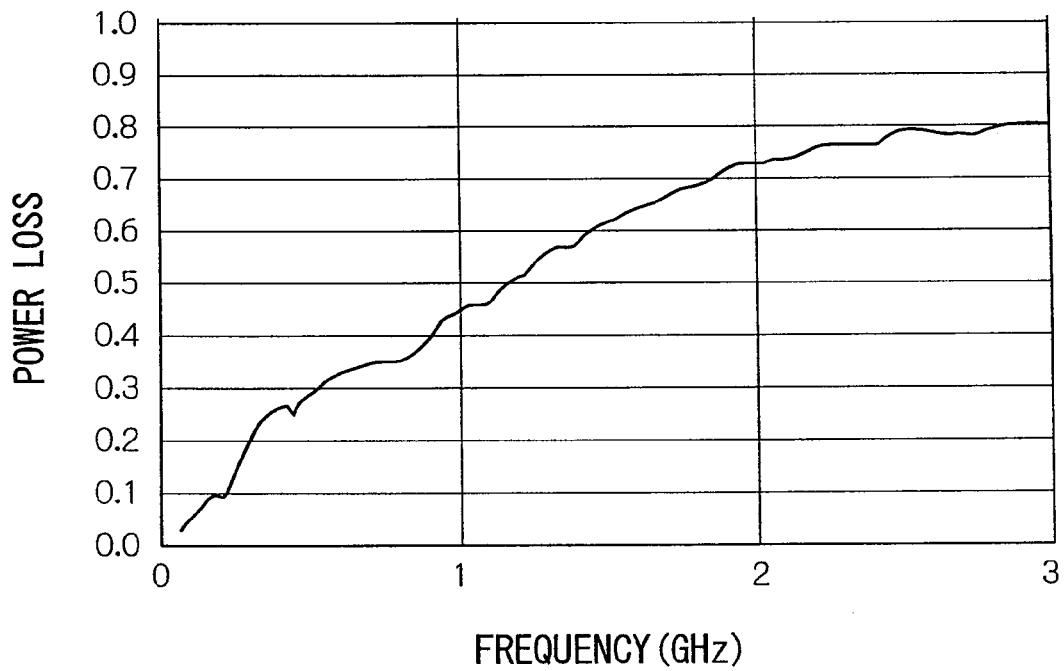
FIG. 34 is a graph showing the frequency characteristic of power loss of transmitted noise in the electromagnetic noise suppressor of Example 17.
Figure 35:
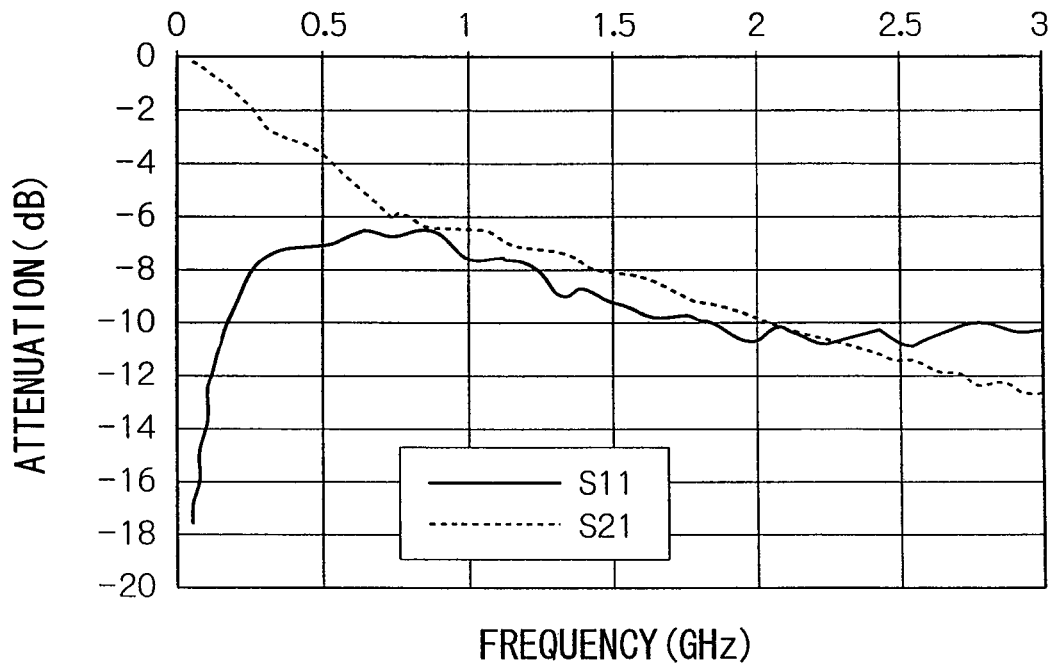
FIG. 35 is a graph showing the frequency characteristic of reflecting attenuation of transmitted noise in the electromagnetic noise suppressor of Example 18.
Figure 36:
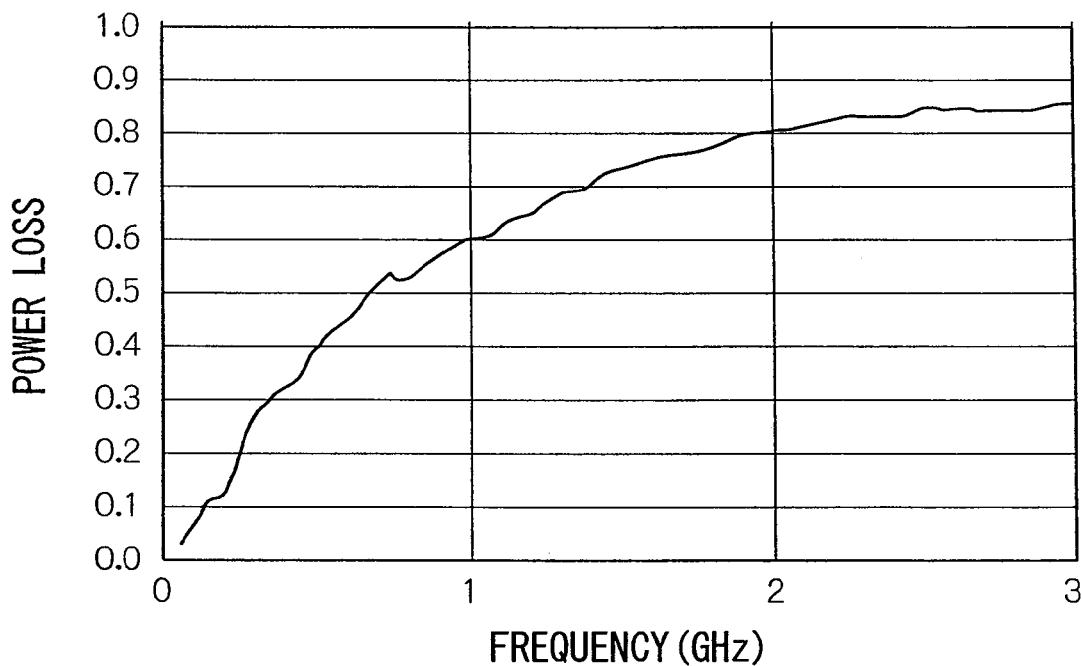
FIG. 36 is a graph showing the frequency characteristic of power loss of transmitted noise in the electromagnetic noise suppressor of Example 18.
Figure 37:
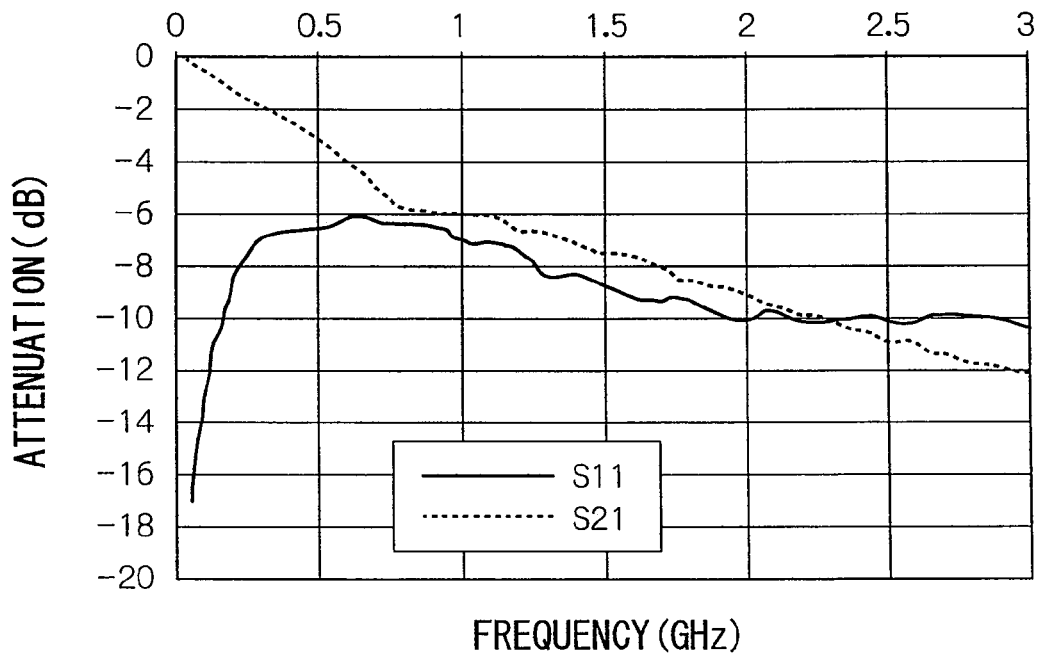
FIG. 37 is a graph showing the frequency characteristic of reflecting attenuation of transmitted noise in the electromagnetic noise suppressor of Example 19.
Figure 38:
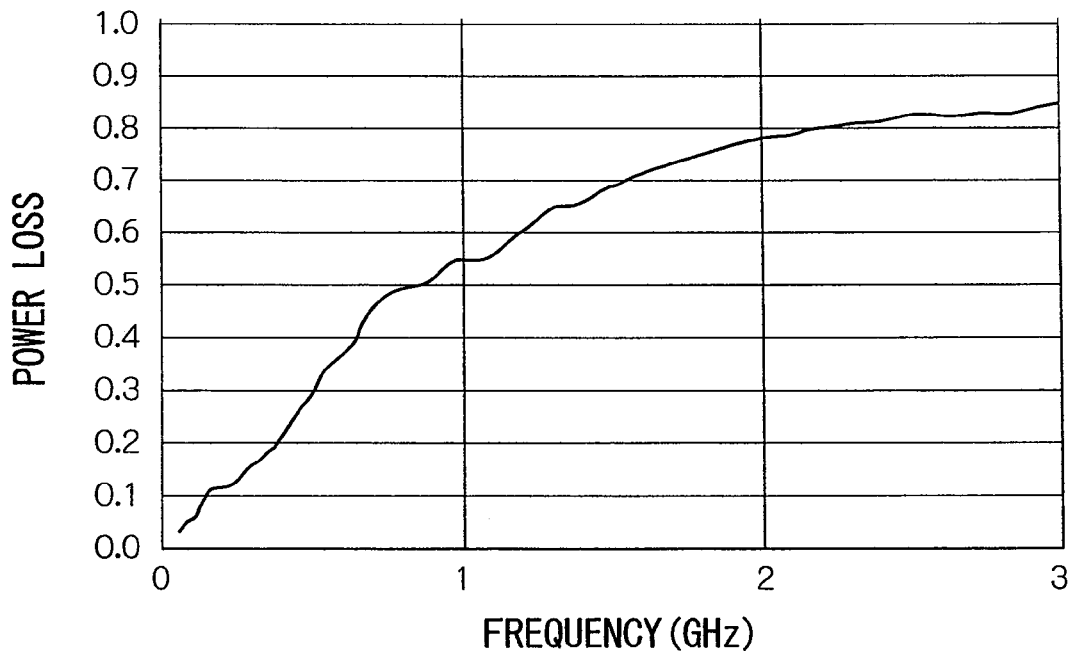
FIG. 38 is a graph showing the frequency characteristic of power loss of transmitted noise in the electromagnetic noise suppressor of Example 19.
Figure 39:
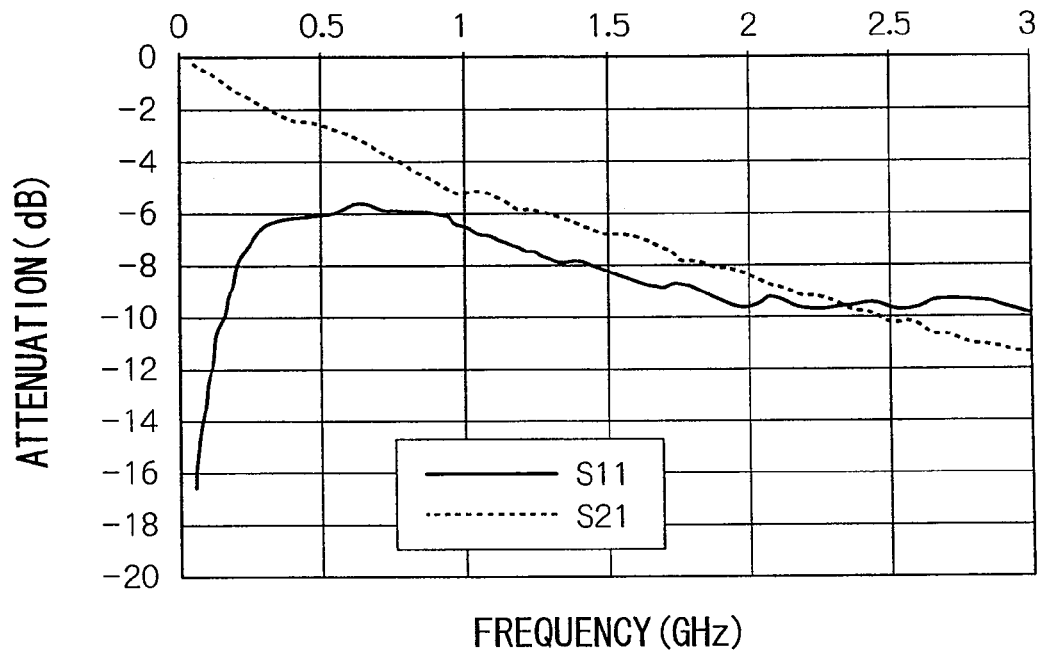
FIG. 39 is a graph showing the frequency characteristic of reflecting attenuation of transmitted noise in the electromagnetic noise suppressor of Example 20.
Figure 40:
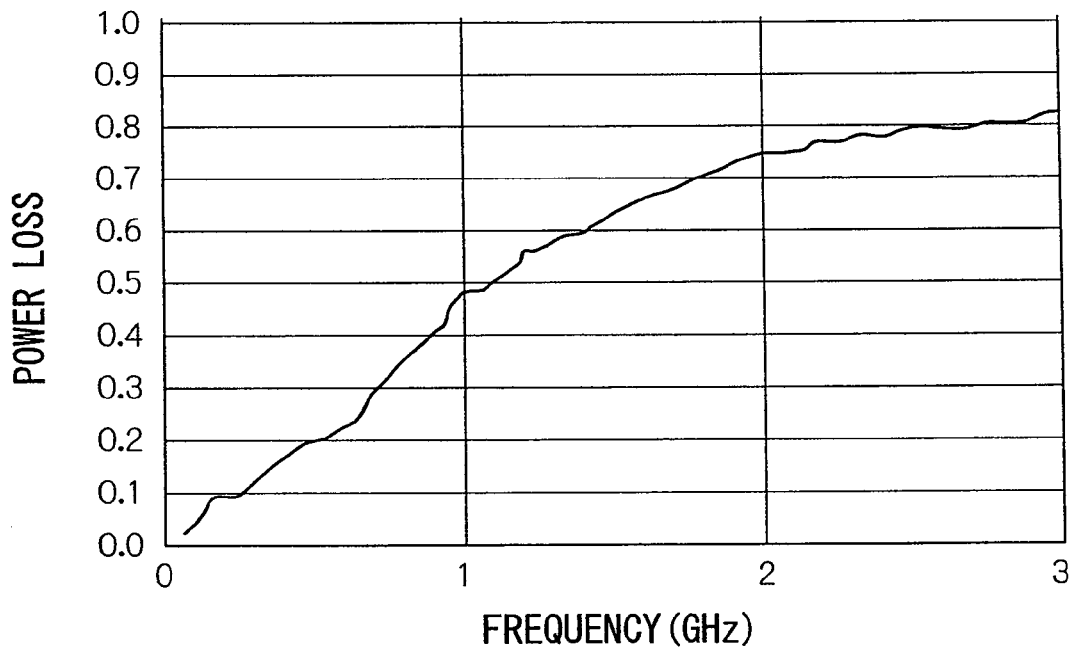
FIG. 40 is a graph showing the frequency characteristic of power loss of transmitted noise in the electromagnetic noise suppressor of Example 20.
Figure 41:
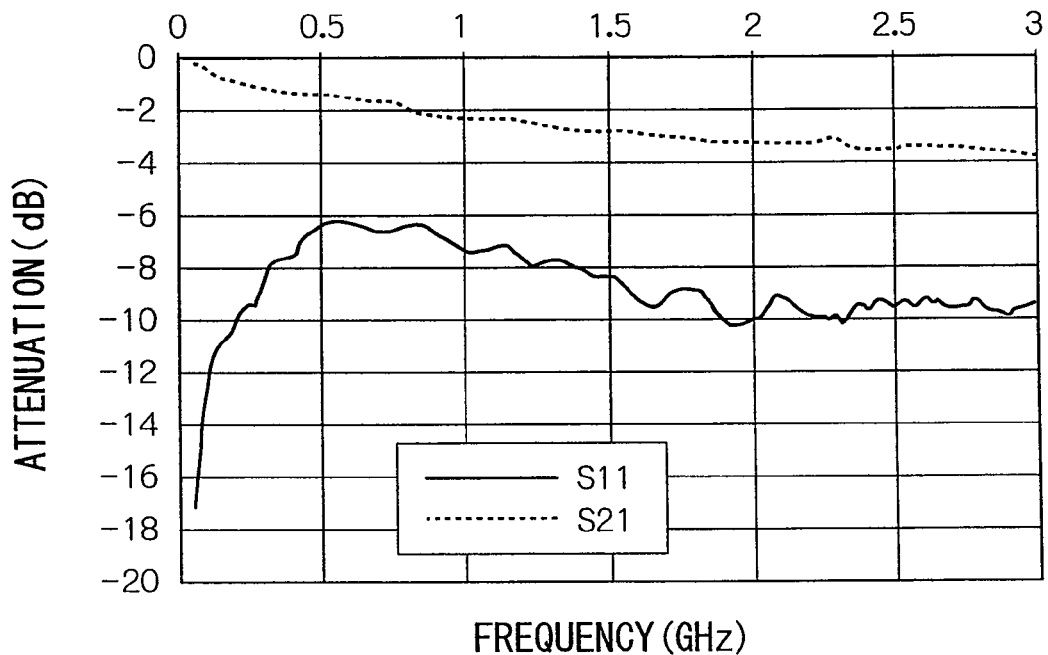
FIG. 41 is a graph showing the frequency characteristic of reflecting attenuation of transmitted noise in comparative Example 11.
Figure 42:
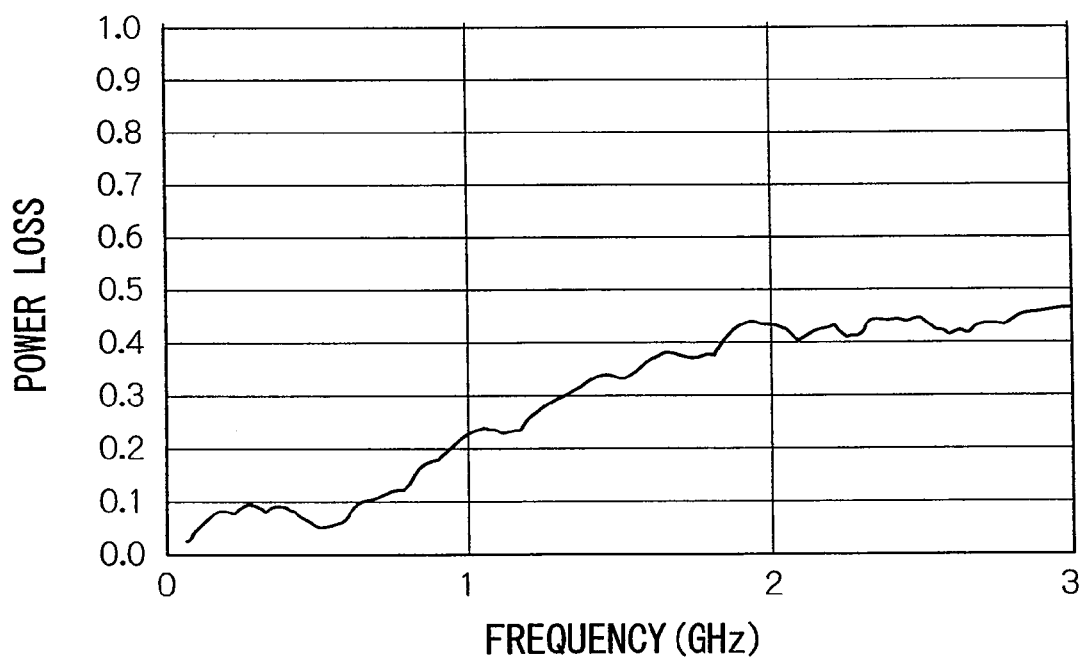
FIG. 42 is a graph showing the frequency characteristic of power loss of transmitted noise in comparative Example 11.

The power loss can be determined by measuring the changes in S11 (reflection characteristic) and S21 (transmission characteristic) as shown in FIG. 33 and calculating by the following formula from the values of S11 and S22 at a particular frequency. Values of power loss fall within a range from 0 to 1.

$$\text{Power loss (Ploss/Pin)} = 1 - (|\Gamma|^2 + |T|^2)$$

$$S11 = 20\log|\Gamma|$$

$$S21 = 20\log|T|$$

Where Γ is the reflection coefficient and T is the transmission coefficient.

Power loss is a comprehensive index of reflection and transmission characteristics of electromagnetic noise suppressing function, and it is required that reflection attenuation and transmission attenuation have practical values. Thus the electromagnetic noise suppressor of the present invention preferably has power loss at 1 GHz in a range from 0.3 to 0.65, more preferably from 0.4 to 0.65.

In order for the electromagnetic noise suppressor to function sufficiently, it is preferable that the reflection attenuation be larger than transmission attenuation while reflection attenuation is not less than −6 dB and transmission attenuation is not less than −3 dB (for example, reflection attenuation is −7 dB and transmission attenuation is −4 dB), that is power loss is not less than 0.3. Smaller power loss cannot be regarded as the result of sufficient electromagnetic noise suppressing function. It is more preferable that reflection attenuation be not less than −10 dB and transmission attenuation be not less than −3 dB (for example, reflection attenuation is −11 dB and transmission attenuation is −4 dB), that is power loss is not less than 0.4. Sufficient electromagnetic noise suppressing function can be achieved when both the reflection attenuation and the transmission attenuation are −10 dB or higher (for example, reflection attenuation is −12 dB and transmission attenuation is −11 dB). While it is desired to obtain power loss higher than 0.65 in view of better characteristics, it has not been possible to obtain power loss higher than 0.65 at 1 GHz with the present technologies whatever selections are made with regards to the magnetic material contained in the electromagnetic noise suppressor and the conditions of vapor deposition onto the binding agent.

Power loss of the electromagnetic noise suppressor in a range from 0.3 to 0.65 can be achieved by carrying out physical vapor deposition with high energy when forming the electromagnetic noise suppressor, and properly selecting the conditions of vapor deposition, the amount of the magnetic material deposited and other factors so as to accomplish the state that the binding agent and the magnetic material are integrated at the nanometer level as the basic prerequisite.

Figure 27:
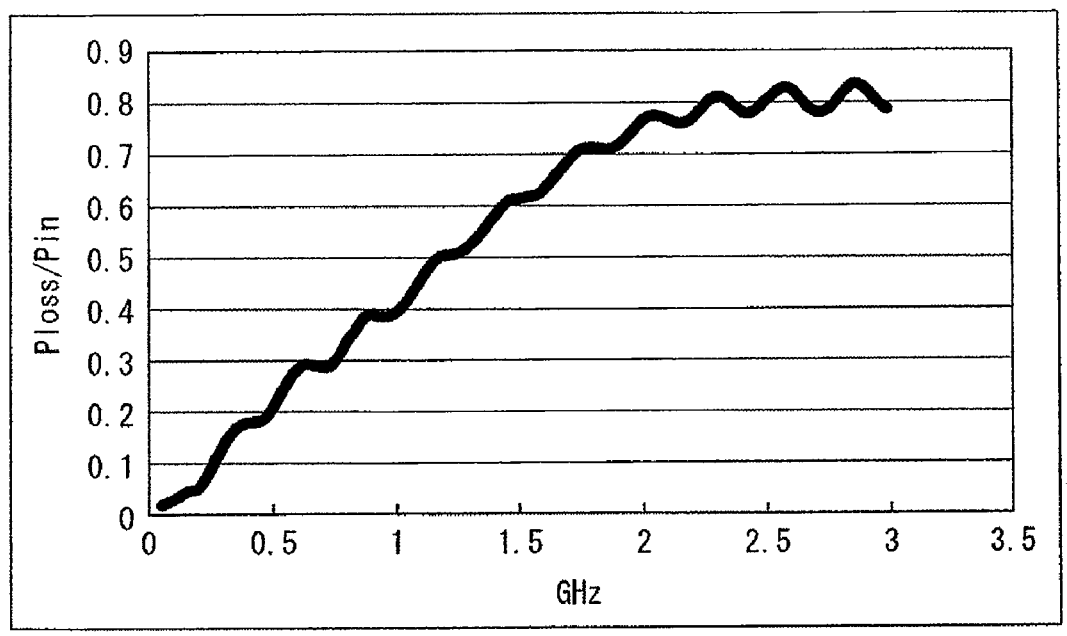
FIG. 27 is a graph showing power loss characteristic of the electromagnetic noise suppressor in a frequency range from 0.05 to 3 GHz of Example 8.
Figure 28:
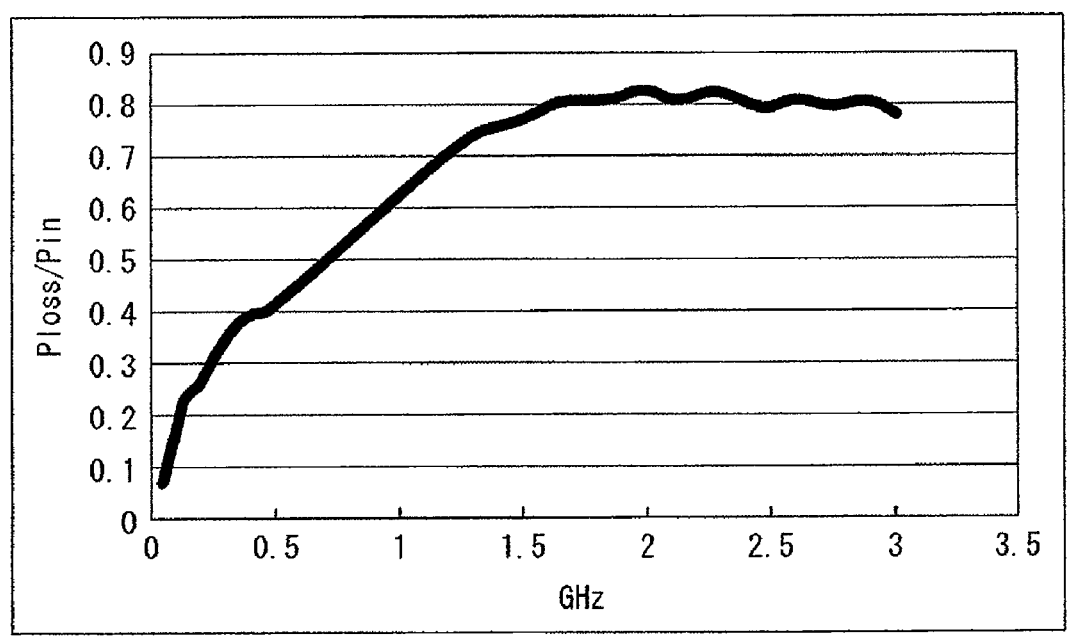
FIG. 28 is a graph showing power loss characteristic of the electromagnetic noise suppressor in a frequency range from 0.05 to 3 GHz of Example 9.
Figure 29:
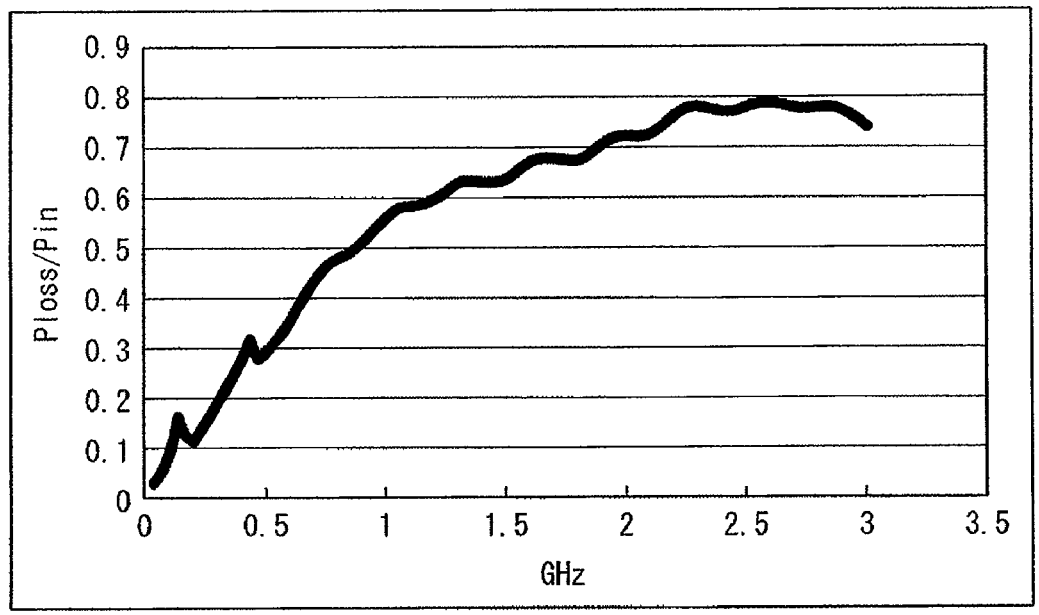
FIG. 29 is a graph showing power loss characteristic of the electromagnetic noise suppressor in a frequency range from 0.05 to 3 GHz of Example 10.
Figure 30:
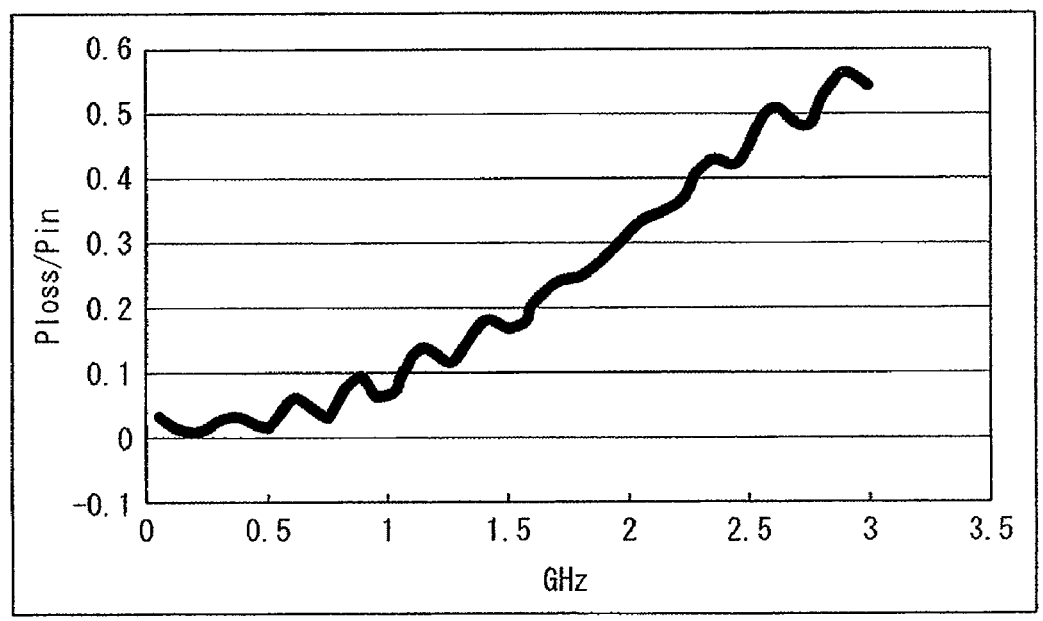
FIG. 30 is a graph showing power loss characteristic of the electromagnetic noise suppressor in a frequency range from 0.05 to 3 GHz of Comparative Example 5.
Figure 31:
FIG. 31 is a graph showing power loss characteristic of the electromagnetic noise suppressor in a frequency range from 0.05 to 3 GHz of Comparative Example 6.
Figure 32:
FIG. 32 is a graph showing power loss characteristic of the electromagnetic noise suppressor in a frequency range from 0.05 to 3 GHz of Comparative Example 7.

As shown in FIGS. 30 to 32, power loss curve of the conventional electromagnetic noise suppressor is convex downward, in which the power loss shows a relatively small increase with the frequency around 1 GHz, and shows larger increase beyond a frequency higher than 1 GHz, with an inflection point at a frequency higher than 1 GHz. Power loss curve of the electromagnetic noise suppressor of the present invention, in contrast, is convex upward in which the power loss shows a steep increase in a frequency region from below 1 GHz to 1.5 GHz, then the increase slows down beyond 1.5 GHz or 2 GHz, as shown in FIGS. 27 to 29. Thus the electromagnetic noise suppressor of the present invention has sufficient power loss at frequencies around 1 GHz where it is expected to have practical effect.

The electromagnetic noise suppressor of the present invention contains a small amount of the magnetic material that forms the composite layer 3. Therefore, increase in the specific gravity of the electromagnetic noise suppressor is several percentage points at the most over that of the base material that consists solely of binding agent. Consequently, specific gravity of the electromagnetic noise suppressor is from 0.9 to 1.5 in the case in which a resin or rubber is used as the binding agent. As a result, satisfactory property and sufficient mechanical strength of the binding agent can be maintained since smaller amounts of the magnetic material is used than the case of the conventional electromagnetic noise suppressor.

The electromagnetic noise suppressor of the present invention may have either planar configuration such as a sheet or a three-dimensional structure. The shape may also be adapted to the shape of an article when it is used to cover the surface of the article.

A plurality of electromagnetic noise suppressors each having a single composite layer formed thereon may also be stacked one on another, thereby providing a plurality of composite layers. Total thickness of the stacked electromagnetic noise suppressors is preferably in a range from about 20 to 200 μm. It is preferable that the thickness of the base material be determined in accordance with the total thickness of the electromagnetic noise suppressor.

In the stacked electromagnetic noise suppressor, the composite layers of the electromagnetic noise suppressors that constitute the individual layers may be the same or different from each other.

In the electromagnetic noise suppressor, since some of the electromagnetic radiation is reflected and may affect the electronic circuits and components that emit the electromagnetic radiation, reflection can be suppressed by such a graded configuration as the thickness of the composite layers to be stacked is gradually increased, starting with the layer on the electronic component side.

<Method of Manufacturing Electromagnetic Noise Suppressor>

The method of manufacturing an electromagnetic noise suppressor will now be described.

The method of manufacturing the electromagnetic noise suppressor of the present invention includes a vapor deposition process where the composite layer is formed on the base material surface by physical vapor deposition of the magnetic material on the base material.

(Vapor Deposition Process)

First, general description of physical vapor deposition (PVD) will be given.

In physical vapor deposition (PVD), a material is vaporized in a vacuum vessel and is deposited on a substrate that is placed in the vicinity of the vaporized material, so as to form a thin film. The process is divided by the method of evaporation into vaporization process and sputtering process. Vaporization processes include EB vapor deposition and ion plating, and sputtering processes include high frequency sputtering, magnetron sputtering and opposing target type magnetron sputtering process.

In the EB vapor deposition, since the vapor particle has small energy of 1 eV, less damage is caused to the substrate and the film tends to become porous and have insufficient strength, while the specific resistivity of the film increases.

In the ion plating process, since ions of argon gas and vaporized particles are accelerated and collide with the substrate, particle energy is about 1 KeV, higher than in the case of EB. Therefore a film having high adhesive force can be obtained, although it cannot be avoided that particles having sizes on the order micrometers, called droplets, are deposit on the surface and cause interrupt of the discharge. An oxide film may be formed by introducing a reactive gas such as oxygen.

In magnetron sputtering, although the target (material to be vaporized) is utilized with less efficiency, growth rate is higher since strong plasma is generated by the effect of magnetic field and a high energy of several tens of electron volts (eV) is given to the particle. In the high frequency sputtering, an insulating target may be used.

Among the magnetron sputtering processes, the opposing target type magnetron sputtering process is a process where plasma is generated between opposing targets and is confined by the magnetic field, while the substrate is placed outside of the opposing targets so as to form a desired thin film without causing damage from the plasma. Therefore, a film of the same composition as that of the target made of dense material can be formed without need to sputter the thin film of the substrate again and mitigating the collision of the sputtered atoms with further higher growth rate.

While the magnetic flux passes through the target made of the magnetic material and therefore sputtering rate is determined by the thickness of the target or it becomes difficult to establish electric discharge in the case of conventional magnetron sputtering, magnetic field is generated in the direction perpendicular to the target surface to be sputtered in the case of opposing target type magnetron sputtering process so that the magnetic field is maintained even when a magnetic material is used as the target and sputtering can be carried out at a high rate regardless of the thickness of the target.

For the reasons described above, the opposing target type magnetron sputtering process is preferable among the various processes of physical vapor deposition for manufacturing the electromagnetic noise suppressor of the present invention.

In the case in which the binding agent is a resin (or a rubber), covalent bonding energy of the resin is about 4 eV. Bonding energies of C—C, C—H, Si—O and Si—C, for example, are 3.6 eV, 4.3 eV, 4.6 eV and 3.3 eV, respectively. In the opposing target type magnetron sputtering process, in contrast, the vaporized particles have high energies and therefore collide while breaking part of the chemical bonding of the resin.

Therefore, it is supposed that when the binding agent made of resin (or rubber) has a sufficiently low elastic modulus in the present invention, molecules of the resin vibrate and are sometimes broken when the magnetic material is deposited, resulting in localized mixing of the atoms of the magnetic material and the resin and interaction with the resin, so that the composite layer having a heterogeneous structure on the scale of nanometers is formed.

It is preferable to apply the magnetic material with particle energy of 5 eV or higher to the binding agent by physical vapor deposition since it enables it to disperse a large amount of the magnetic material in the binding agent at the same time. Since a large amount of the magnetic material can be processed in a single deposition run, the electromagnetic noise suppressor having high electromagnetic noise suppressing effect can be easily made. Since velocity of the binding agent in vibration thereof is lower than the velocity of the particle, rate of vapor deposition is preferably set to be slow in accordance to the timing of relaxation of the binding agent, about 60 nm/min or less while it depends on the kind of magnetic material.

As the magnetic material to be vaporized in the vapor deposition process, a metal-based soft magnetic material, an oxide-based soft magnetic material and/or a nitride-based soft magnetic material is mainly used. Either one of these materials or a mixture of two or more of these materials may be used.

As the metal-based soft magnetic material, iron or an iron alloy is commonly employed. As the iron alloy, Fe—Ni, Fe—Co, Fe—Cr, Fe—Si, Fe—Al, Fe—Cr—Si, Fe—Cr—Al, Fe—Al—Si or Fe—Pt alloy may be used. Either one of these materials or a mixture of two or more of these materials may be used. Besides iron and iron alloy, cobalt, nickel or an alloy thereof may also be used. Nickel has resistance against oxidation and is therefore preferably used independently.

As the oxide-based soft magnetic material, ferrite is preferably used. Specifically, $MnFe_2O_4$, $CoFe_2O_4$, $NiFe_2O_4$, $CuFe_2O_4$, $ZnFe_2O_4$, $MgFe_2O_4$, $Fe_3O_4$, Cu—Zn-ferrite, Ni—Zn-ferrite, Mn—Zn-ferrite, $Ba_2Co_2Fe_{12}O_{22}$, $Ba_2Ni_2Fe_{12}O_{22}$, $Ba_2Zn_2Fe_{12}O_{22}$, $Ba_2Mn_2Fe_{12}O_{22}$, $Ba_2Mg_2Fe_{12}O_{22}$, $Ba_2Cu_2Fe_{12}O_{22}$ or $Ba_3Co_2Fe_{24}O_{41}$, may be used. These variations of ferrite may be used either independently or in a combination of two more kinds thereof.

As nitride-based soft magnetic material, $Fe_2N$, $Fe_3N$, $Fe_4N$, $Fe_{16}N_2$, etc. are known. These nitride-based soft magnetic materials have high magnetic permeability and high corrosion resistance, and are preferably used.

During the physical vapor deposition of the magnetic material onto the binding agent, since atoms of the magnetic material infiltrate the binding agent in the form of plasma or ions, composition of the magnetic material dispersed in the binding agent is not necessarily the same as that of the magnetic material before it is vaporized. The magnetic material may have reacted with part of the binding agent and changed into paramagnetic material or antiferromagnetic material.

The amount of the magnetic material deposited on the binding agent in a single deposition run is preferably 200 nm or less in terms of thickness of the magnetic material layer. When deposited to larger thickness, limitation of the capacity of the binding agent to include the magnetic material is reached such that the magnetic material cannot be dispersed in the binding agent and is deposited on the surface, thereby forming a continuous bulk film that has uniform conductivity. Therefore, the amount of the magnetic material to be deposited is preferably 100 nm or less, and more preferably 50 nm or less. In view of the electromagnetic noise suppressing effect, the amount of the magnetic material to be deposited is preferably 0.5 nm or more.

Since less amount of deposition leads to lower electromagnetic noise suppressing effect, the total amount of the magnetic material can be increased by stacking a plurality of electromagnetic noise suppressors thereby to provide a plurality of composite layers. The total amount of deposition is preferably in a range from 10 to 500 nm in terms of total thickness of the magnetic material, while it depends on the required level of electromagnetic noise suppression. Part of the layers to be stacked may also be formed as bulk metal layers that have continuity, so as to have reflectivity to electromagnetic radiation. The layers may also be formed in composite structure with the dielectric material layer so as to control the electromagnetic noise suppressing effect.

The amount of deposition can be determined by measuring the thickness the magnetic material layer deposited on the hard substrate layer made of glass or silicon.

While there is no restriction on the thickness of the binding agent used in the vapor deposition process, it is preferably as small as possible in order to make an electromagnetic noise suppressor compact. Specifically, the thickness is preferably 50 μm or less, and more preferably 10 μm or less.

(Process to Fabricate Stack)

In the case in which the electromagnetic noise suppressor of the present invention has layers other than the base material and the composite layer, such as a support layer, heat conduction layer, flame retarding resin layer or electrically conductive layer, the manufacturing process includes a stack fabricating process where the stack having the base material that includes the binding material and other layers is made, and a vapor deposition process where the composite layer is formed on the base material surface by physical vapor deposition of the magnetic material on the base material.

The stack can be formed by, for example, exclusion lamination of the binding agent onto various films that constitute other layers; application of the binding agent to the various films; and lamination of base material film containing the binding agent and various films by means of adhesive agent or the like.

<Article with Electromagnetic Noise Suppressing Function>

The article with an electromagnetic noise suppressing function of the present invention is an article of which surface is at least partly covered by the electromagnetic noise suppressor of the present invention.

The article may be an electronic component, a printed wiring board where electronic components are mounted, electric connector, flat cable, key top member for pushbutton switch, insert sheet for preform, semiconductor integrated circuit, etc.

Specific examples of the article with an electromagnetic noise suppressing function of the present invention will be described below.

(Electronic Component)

The electromagnetic noise suppressor of the present invention is capable of suppressing electromagnetic radiation generated by electronic components of various electoronic apparatuses. Specifically, among the electronic components mounted on an electoronic apparatus, those which may malfunction under the influence of incoming electromagnetic noise or those that generate electromagnetic radiation that may cause malfunction of other electronic components are covered by the electromagnetic noise suppressor of the present invention, thereby to control electromagnetic noise that is generated by the electronic components or that may affect other electronic components. Such electoronic apparatuses include any electronic components that transmit and/or receive signals. The article with an electromagnetic noise suppressing function of the present invention is an article of which the surface is at least partly covered by the electromagnetic noise suppressor of the present invention.

(Printed Wiring Board)

The article with an electromagnetic noise suppressing function of the present invention is at least one printed wiring board, of an electoronic apparatus having printed wiring board, of which at least one surface is covered by the electromagnetic noise suppressor of the present invention over part or entire surface thereof. That is, the printed wiring board may be covered over the entire surface either on both sides or on one side thereof, or partly on both sides or on one side thereof. The printed wiring board may be entirely covered by the electromagnetic noise suppressor so as to absorb incoming electromagnetic radiation as long as electromagnetic radiation generated by the electronic components mounted on the printed wiring board do not adversely affect the other electronic components mounted on the same printed wiring board.

In the case in which electromagnetic radiation generated by the electronic components mounted on the printed wiring board has an adversel effect on the other electronic components mounted on the same printed wiring board, electronic components other than those which generate the harmful electromagnetic radiation may be enclosed by a shield box or the electromagnetic noise suppressor, while covering the electronic components that generate the harmful electromagnetic radiation individually with the electromagnetic noise suppressor.

Since the electromagnetic noise suppressor of the present invention has flexibility, it is capable of securely covering the electronic components while adapting to the deformation of the printed wiring board even when the printed wiring board deforms due to stress, in the case in which the printed wiring board is flexible.

Figure 17:
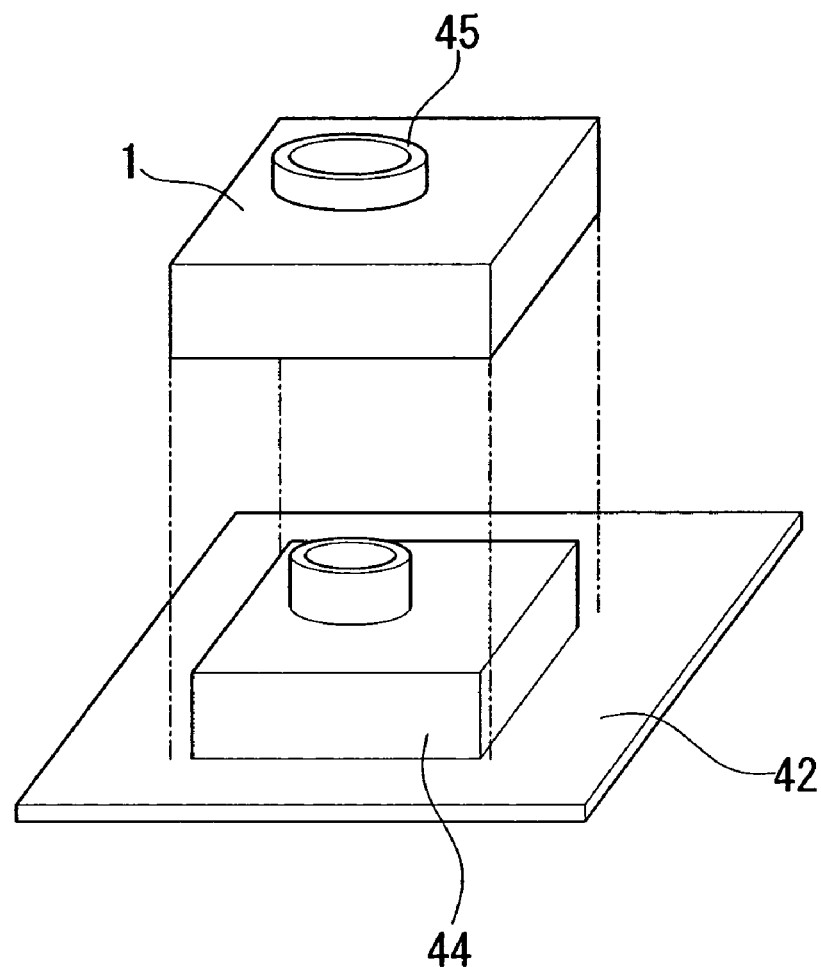
FIG. 17 is a perspective view of a camera module that is an example of an article with an electromagnetic noise suppressing function of the present invention.
Figure 18:
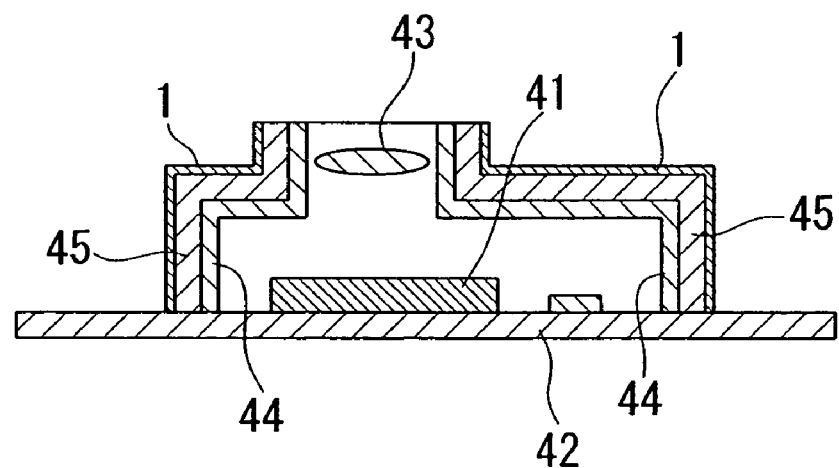
FIG. 18 is a sectional view of a camera module that is an example of an article with an electromagnetic noise suppressing function of the present invention.

FIG. 17 and FIG. 18 show a camera module as an example of the article with an electromagnetic noise suppressing function. The camera module comprises a printed wiring board 42 that has an image sensor 41 mounted on the surface thereof, a lens 43 that corresponds to the image sensor 41, a camera holder 44 that holds the lens 43 and encloses the image sensor 41 on the printed wiring board 42, an outer case 45 that fits on the outside of the camera holder 44, and the electromagnetic noise suppressor 1 that covers the surface of the outer case 45.

Covering of the outer case 45 with the electromagnetic noise suppressor 1 is carried out, for example, as follows. The outer case 45 that is a structure formed from a resin by injection molding is dipped in epoxy resin solution that is a binding agent so as to cover the surface with epoxy resin of B stage having a thickness of 15 µm. Then a composite layer is formed on the epoxy resin by physical vapor deposition to equivalent thickness of 45 nm. The outer case 45 having the electromagnetic noise suppressing function is fitted onto the camera holder 44, thereby shielding the camera module from noise.

Figure 19:
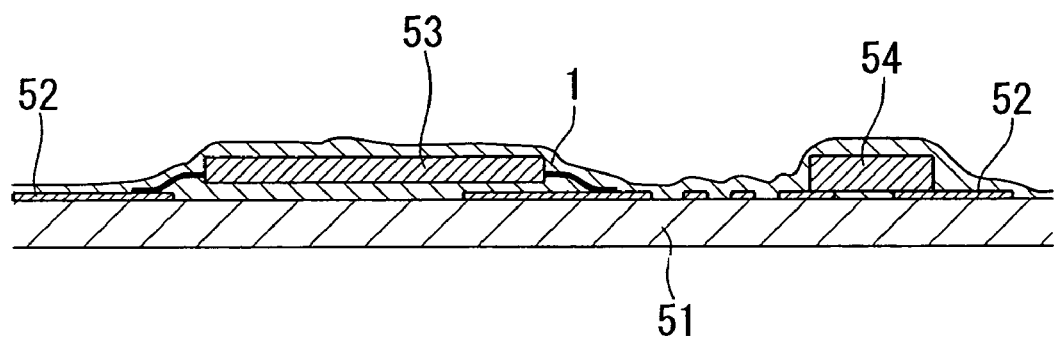
FIG. 19 is a sectional view of a printed wiring board with electronic components mounted thereon as an example of an article with an electromagnetic noise suppressing function of the present invention.

FIG. 19 shows a printed wiring board as another example of the article with an electromagnetic noise suppressing function. The printed wiring board comprises a circuit 52 formed on a substrate 51, a semiconductor package 53 and a chip component 54 that are connected to the circuit 52, and the electromagnetic noise suppressor 1 that covers the surface of the printed wiring board together with the circuit 52, the semiconductor package 53 and the chip component 54.

Covering of the printed wiring board with the electromagnetic noise suppressor 1 is carried out, for example, as follows. An insulating binding agent is applied to the printed wiring board to a thickness of about 50 µm so as to cover the circuit 52, the semiconductor package 53 and the chip component 54. The magnetic material is applied onto the binding agent by physical vapor deposition so as to form the composite layer. This process is not a wet process and does not require washing operation to remove ions, and is capable of easily producing the electromagnetic noise suppressing function.

(Electric Connector)

In the case in which the article with an electromagnetic noise suppressing function of the present invention has at least a printed wiring board and an electric connector that transmits signals to the circuit and the electromagnetic noise suppressor of the present invention is provided on at least a part of the electric connector, then electromagnetic radiation is prevented from entering from the outside into the electric connector and generating signals which cause malfunctions. In this case, too, since the electromagnetic noise suppressor of the present invention has flexibility, it is capable of securely covering the flexible connector while adapting to the deformation of the connector even when the connector deforms due to external stress, in the case in which the electric connector is flexible. Examples of the article as described above include mobile telephone and mobile telephone with camera.

(Key Top Member for Pushbutton Switch)

The article with an electromagnetic noise suppressing function of the present invention may be a key top member for pushbutton switch covered with the electromagnetic noise suppressor of the present invention. A specific example of the key top member for pushbutton switch is a key top member for pushbutton switch having the electromagnetic noise suppressor of the present invention stacked below a decorative sheet that is provided with a pressing portion.

The decorative sheet may be made of a thermoplastic resin such as polyester, polyurethane, polycarbonate, acryl, vinyl chloride, polyethylene or polypropylene. When the ease of printing and forming is taken into consideration, polyester, polycarbonate, acryl or alloy or copolymer thereof is preferably used.

The decorative sheet may bear letters, symbols, pictures or the like printed at predetermined positions thereon as required. There is no restriction on the printing method, and a conventional printing method may be employed. Decoration may also be made by plating, vapor deposition, hot stamping, laser marking or other method.

The pressing portion may be formed by providing recess in the decorative sheet by drawing process or the like, and filling the recess with a resin, elastomer or the like, or by bonding a molding of pushbutton shape made of resin or elastomer on one side of a flat decorative sheet. There is no restriction on the resin or elastomer that fill the recess of the decorative sheet or that are provided on the decorative sheet.

The electromagnetic noise suppressor is stacked on the lower surface of the decorative sheet that is provided with the pressing portion. In the case of the decorative sheet having the recess filled with resin, elastomer or the like, the electromagnetic noise suppressor is applied so as to cover both the bottom of the resin, elastomer or the like that fills the recess and the surface of the decorative sheet where the recess is provided. In the case of the decorative sheet provided with the molding of pushbutton shape, the electromagnetic noise suppressor is applied to the surface opposite to that where the decorative sheet is provided.

The article with an electromagnetic noise suppressing function of the present invention is exemplified by a key top member for pushbutton switch comprising a click sheet having click members arranged thereon and key tops provided on the click sheet, where the electromagnetic noise suppressor of the present invention is provided on one side of the click sheet.

The key top member for pushbutton switch may have such a constitution as the click member has an inverted dome shape and a movable contact made from an electrically conductive film is provided at least on the inner surface of the dome-shaped click member (bottom surface of the click sheet), so that depressing the key top causes the click member to deform and make contact with a fixed contact provided on the printed wiring board that is provided below.

The electromagnetic noise suppressor may be provided either on the key top side surface of the click sheet, or on the surface opposite to the key top. In the case in which the electromagnetic noise suppressor is provided on the surface opposite to the key top, the electromagnetic noise suppressor is provide so as to be electrically insulated from the movable contact. That is, the electromagnetic noise suppressor may be provided on the surface of the click sheet except for the portion where the movable contact is provided, or the electromagnetic noise suppressor may be provided over the entire surface of the click sheet with the movable contact being provided via an insulating film in at least upper portion on the inner surface of the dome-shaped click member.

When the electromagnetic noise suppressor is electrically insulated from the movable contact, interference with other keys can be suppressed during key scan. When the electromagnetic noise suppressor is provided over the entire surface on one side of the dome-shaped click member, electromagnetic radiation in millimeter wavelength band can be prevented from leaking.

The click sheet is preferably made of a polyester resin such as polyethylene terephthalate, polyethylene naphthalate, in view of the property to deform when pressed, property to restore by resilience when the pressure is removed, moldability and other factors. While there is no restriction on the material that makes the movable contact, silver, copper, carbon or the like is preferably used.

(Insert Sheet for Preform)

The article with an electromagnetic noise suppressing function of the present invention may be an insert sheet for a preform that has the electromagnetic noise suppressor of the present invention provided on at least one side thereof.

The insert sheet for a preform is formed on the surface of a molded article used in the front panel of an AV apparatus, instrument panel of an automobile, pushbutton or the like, and comprises a translucent base material and a translucent printing layer. The translucent printing layer may be provided over one surface of the translucent base material, or the translucent printing layer may be sandwiched by two translucent base layers. The insert sheet for preform of the present invention is particularly useful when formed on the surface of a molded article used in a pushbutton switch.

In the case of an insert sheet that has the translucent printing layer provided over one surface of the translucent base material, the electromagnetic noise suppressor is preferably provided on a surface different from the translucent printing layer, while it may be provided on either surface of the translucent base material in the case in which the translucent printing layer is sandwiched by two translucent base layers.

An electrically conductive layer is preferably provided on the surface opposite to the translucent base material of the electromagnetic noise suppressor. The electrically conductive layer may be, for example, a metal foil, vapor-deposited metal film or printed electrically conductive paste. Providing the electrically conductive layer enables it to reflect electromagnetic radiation, prevent it from escaping to the outside and absorb the reflection. Antenna effect can be suppressed and metallic gloss can be provided by decreasing the Q value of resonance.

(Semiconductor Integrated Circuit)

To give electromagnetic noise suppressing function to a semiconductor integrated circuit, the magnetic material is applied to a thickness of about 10 to 50 nm by physical vapor deposition to form a composite layer on an organic insulating film of thickness from 200 nm to 100 μm that is formed from polyimide, polyparaxylene, polytetrafluoroethylene, polyaryl ether, polyxylene, polyadamantane ether, polybenzoxazole or benzocyclobutene resin. The composite layer may also be formed partially by using a mask as required. Since this is a dry process, there is no influence of ionic impurity and there is no need of cleaning, and the process is preferable for the application to semiconductor wafers. When the electromagnetic noise suppressor having heterogeneous structure of nanometer scale is provided in the vicinity of microscopic semiconductor circuit, it is made possible to suppress the resonance of a digital circuit during pulse transmission and suppress radiation noise from being generated by impedance mismatch, thereby to improve the transmission characteristic such as transmission speed, even with a small amount of magnetic material.

(Action)

The electromagnetic noise suppressor of the present invention described above has a high resonance frequency supposedly because the composite layer is formed where the magnetic material and the binding agent are integrated so that even a small amount of the magnetic material can achieve the quantum effect originating from the heterogeneous structure of nanometer scale, magnetic anisotropy of the material, morphological magnetic anisotropy or anisotropy due to external magnetic field, although theoretical explanation has not been presented. It is considered that such a feature enables it to achieve high magnetic characteristics and electromagnetic noise suppressing effect in a high frequency band with just a small amount of the magnetic material.

Since the electromagnetic noise suppressor of the present invention can achieve the electromagnetic noise suppressing effect even with a small amount of the magnetic material, the amount of the magnetic material can be reduced significantly, resulting in weight reduction.

Also since the electromagnetic noise suppressor of the present invention can achieve sufficient electromagnetic noise suppressing effect even with the composite layer of small thickness, the electromagnetic noise suppressor can be formed with small thickness, so as to decrease the space requirement.

In the case in which the composite layer is formed by physical vapor deposition of the magnetic material onto the base material, the magnetic material is dispersed in the binding agent so that the magnetic material and the binding agent are integrated to provide high electromagnetic noise suppressing effect. The composite layer does not contain impurity ions so that there is no possibility of damage on the electronic circuit by the impurity ions.

Since the amount of the magnetic material can be reduced significantly, decrease in flexibility and in strength of the resin or rubber due to the magnetic material can me minimized in the case in which the binding agent is resin or rubber.

Moreover, if the binding agent is a hardening resin, the magnetic material is distributed uniformly in the binding agent prior to curing and, after curing, the magnetic material can be suppressed from crystallizing into fine particles even when the electromagnetic noise suppressor is used at a high temperature, thus improving the weatherability.

The article with an electromagnetic noise suppressing function of the present invention (for example, printed wiring board or semiconductor integrated circuit) enables it to dispose the noise suppressor in the vicinity of the noise source and efficiently suppress electromagnetic noise in high-frequency band.

EXAMPLES (Evaluation)

Figure 20:
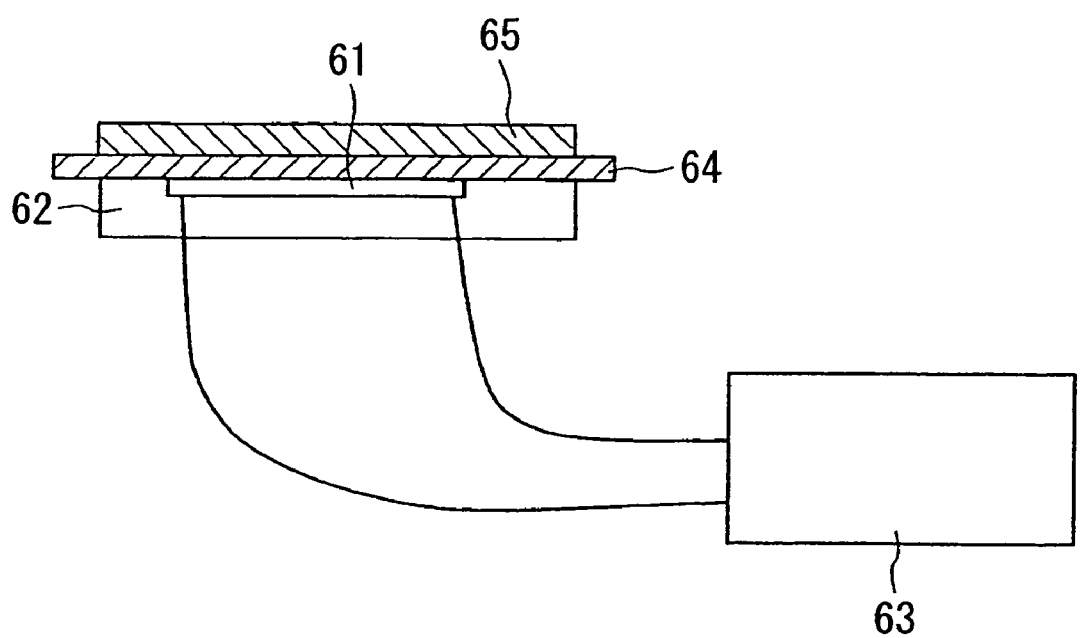
FIG. 20 is a schematic diagram of a setup for measuring the electromagnetic noise suppressing characteristic.

Electromagnetic noise suppressing characteristic (transmission attenuation and reflection attenuation) in the vicinity of the electromagnetic noise suppressor was measured in Examples 1 to 4 and Comparative Example 1 at measuring frequency of 2 GHz by disposing a test sheet 65 of the electromagnetic noise suppressor via an insulation film 64 on a test fixture 62, using the test fixture 62 (TF-3A manufactured by KEYCOM Corporation) whereon a micro-strip line 61 of 50 Ω is formed and a network analyzer 63 (vector network analyzer 37247C manufactured by Anritsu Company Ltd.) that is connected to the micro-strip line 61 as shown in FIG. 20.

Example 1

A composite layer was formed by sputtering Mn—Zn-based high magnetic permeability ferrite to equivalent thickness of 3 nm by opposing target type magnetron sputtering process on a polyethylene phthalate (hereinafter referred to as PET) film used as the base material having a thickness of 12 µm, elastic modulus in shear of $3.8 \times 10^9$ (Pa), carbon dioxide gas permeability of $1 \times 10^{-11}$ [$cm^3$ (STP) cm/($cm^2 \times s \times cmHg$)] and mean surface roughness of 1.8 µm. Surface resistivity of the composite layer was measured by DC 4-terminal method. The film was trimmed to a predetermined size, and ten sheets of this film were stacked one on another via polyester adhesive. The stack was consolidated by vacuum press thereby making the electromagnetic noise suppressor measuring 138 µm in total thickness. Then specific gravity and electromagnetic noise suppressing characteristic were measured. The results are shown in Table 1.

Example 2

A silicone rubber having a thickness of 20 µm, elastic modulus in shear of $1 \times 10^7$ (Pa), carbon dioxide gas permeability of $2.2 \times 10^{-7}$ [$cm^3$ (STP) cm/($cm^2 \times s \times cmHg$)] was provided as the base material on a PET film used as the support layer having a thickness of 25 µm, and thereon composite layer was formed by sputtering Fe—Ni-based soft magnetic metal to equivalent thickness of 20 nm by the opposing target type magnetron sputtering process. Surface resistivity of the composite layer was measured by DC 4-terminal method. The film was trimmed to a predetermined size, and thereby making the electromagnetic noise suppressor measuring 45 µm in total thickness. Then specific gravity and electromagnetic noise suppressing characteristic were measured. The results are shown in Table 1.

Example 3

A urethane gel having a thickness of 10 µm, elastic modulus in shear of $1.7 \times 10^6$ (Pa), carbon dioxide gas permeability of $5.3 \times 10^{-8}$ [$cm^3$ (STP) cm/($cm^2 \times s \times cmHg$)] was provided as the base material on a PET film used as the support layer having a thickness of 25 µm, and thereon a composite layer was formed by sputtering Fe—Si—Al-based soft magnetic metal to equivalent thickness of 15 nm by magnetron sputtering process (non-opposing target type). Surface resistivity of the composite layer was measured by DC 4-terminal method. Urethane gel was applied to the composite layer to a thickness of 2 µm, and sputtering was carried out again. This process was repeated to form three composite layers thereby to obtain the electromagnetic noise suppressor measuring 79 µm in total thickness. Then specific gravity and electromagnetic noise suppressing characteristic were measured. The results are shown in Table 1.

Example 4

Three composite layers were formed by sputtering Fe—Si—Al-based soft magnetic metal to equivalent thickness of 15 nm similarly to Example 3, except for employing the opposing target type magnetron sputtering process, thereby to obtain the electromagnetic noise suppressor measuring 79 µm in total thickness. Characteristics were evaluated similarly to Example 3. The results are shown in Table 1.

Comparative Example 1

A paste made by adding 5 parts by weight of a polyurethane resin, 1 part by weight of an isocyanate compound as a curing agent and 30 parts by weight of a solvent (1:1 mixture of cyclohexanon and toluene) to 94 parts by weight of Fe—Ni-based soft magnetic metal powder of flake shape (mean particle size 15 µm, aspect ratio 65) was applied by bar coating method to a support fixture for application to form a film having a thickness of 1.1 mm after drying. The film was fully dried, pressed under heat in vacuum and cured at 85° C. for 24 hours, before being removed from the support fixture for application, thereby to obtain the electromagnetic noise suppressor having a thickness of 1 mm. Then specific gravity and electromagnetic noise suppressing characteristic were measured. The results are shown in Table 1.

TABLE 1

| | Example 1 | Example 2 | Example 3 | Example 4 | Comparative Example 1 |
|---|---|---|---|---|---|
| Support layer | None | PET | PET | PET | None |
| Thickness of support layer (μm) | — | 25 | 25 | 25 | — |
| Base material | PET | Silicone rubber | Urethane gel | Urethane gel | None |
| Elastic modulus in shear (Pa) | $3.8 \times 10^9$ | $1 \times 10^7$ | $1.7 \times 10^6$ | $1.7 \times 10^6$ | — |
| Carbon dioxide gas permeability [$cm^3$ (STP) cm/($cm^2 \times s \times cmHg$)] | $1 \times 10^{-11}$ | $2.2 \times 10^{-7}$ | $5.3 \times 10^{-8}$ | $5.3 \times 10^{-8}$ | — |
| Thickness of base material (μm) | 12 | 20 | 10 | 10 | — |
| Magnetic material | Mn—Zn-based ferrite | Fe—Ni | Fe—Si—Al | Fe—Si—Al | Fe—Ni |
| Deposited amount (equivalent thickness, nm) | 3 | 20 | 15 | 15 | — |
| Physical vapor deposition method | Opposing target type | Opposing target type | Magnetron | Opposing target type | — |
| Surface resistivity (Ω/□) | $3 \times 10^7$ | $2 \times 10^2$ | $1 \times 10^3$ | $4 \times 10^5$ | $1 \times 10^6$ |
| Number of layers stacked | 10 | 1 | 3 | 3 | — |
| Thickness of adhesive (μm) | 2 | — | 2 | 2 | — |
| Total thickness of electromagnetic noise suppressor (μm) | 138 | 45 | 79 | 79 | 1000 |
| The amount of magnetic material deposited (equivalent thickness, nm) | 30 | 20 | 45 | 45 | — |
| Specific gravity | 1.3 | 1.2 | 1.2 | 1.2 | 6.1 |
| Transmission attenuation (dB, measured at frequency 2 GHz) | −7 | −8 | −15 | −18 | −6 |
| Reflection attenuation (dB, measured at frequency 2 GHz) | −20 | −10 | −12 | −14 | −8 |
| Rupture strength (MPa) | 205 | 10.5 | 21 | 21 | 2.5 |
| Rupture elongation (MPa) | 149 | 450 | 687 | 687 | 7 |
| Appearance | Comparable strength to base material | Thin, light in weight and expandable | Thin, light in weight and flexible | Thin, light in weight and flexible | Heavy and brittle |
| Evaluation | Good | Good | Good | Good | Poor |

In Table 1, specific gravity is that of the composite layer and the support material combined (measured together with PET when PET is used as the base material). Rupture strength and rupture elongation were measured without the support layer.

Table 1 shows that the electromagnetic noise suppressors of Examples 1 to 4 and Comparative Example 1 have substantially similar electromagnetic noise suppressing characteristic. However, the electromagnetic noise suppressor of Comparative Example 1 has high specific gravity of 6.1 and is brittle, and is prone to breakage when subjected to impact. The electromagnetic noise suppressor of Example 1, in contrast, has strength and flexibility that are comparable to those of polyethyleneterephthalate used as the base material. The electromagnetic noise suppressor of Example 2 has small total thickness of 45 μm, light in weight, expandable and flexible, thus showing robustness and ease of processing. The electromagnetic noise suppressor of Example 3 is also thin, light in weight and flexible. Comparison between Example 3 and Example 4 shows that the opposing target type magnetron sputtering process is superior to the conventional magnetron sputtering process (non-opposing target) in achieving uneven distribution of ultra-fine particles of magnetic material.

(Evaluation)

Examples 5 to 7 and Comparative Examples 2 to 4 were evaluated as follows.

Observation of surface: Surface was observed with magnification factor of 4000 by a laser microscope VK-9500 manufactured by KEYENCE CORPORATION.

Surface resistivity was measured by DC 4-terminal method at voltage of 10V using MCP-T600 manufactured by Dia Instruments Co., Ltd. Measurements at 5 points were averaged.

The thickness of the composite layer was determined from electron microscope photograph (50000×) of a cross section of the electromagnetic noise suppressor using a scanning electron microscope (SEM) JEM-2100F manufactured by JEOL Ltd.

Electromagnetic noise suppressing characteristic: S11 (reflection characteristic) and S21 (transmission characteristic) were measured by S parameter method using a near field electromagnetic noise suppressor measuring instrument manufactured by KEYCOM Corporation. Vector network analyzer 37247C manufactured by Anritsu Company Ltd. and test fixtures TF-3A and TF-18A manufactured by KEYCOM Corporation were used.

Example 5

Silicone rubber having a thickness of 20 μm, elastic modulus in shear of $3.8 \times 10^9$ Pa at normal temperature, carbon dioxide gas permeability of $2.2 \times 10^{-7}$ [$cm^3$ (STP) cm/($cm^2 \times s \times cmHg$)] at normal temperature (containing wet silica) was provided as the base material on a PET film used as the support layer having a thickness of 12 μm, and thereon composite layer was formed by sputtering Fe—Ni-based soft magnetic metal to equivalent thickness of 30 nm by physical vapor deposition of opposing target type magnetron sputtering process. Sputtering was carried out by applying a low negative voltage so as to impart energy of 8 eV to the vaporized particles while maintaining the base material at the normal temperature. Surface resistivity of the composite layer was measured by DC 4-terminal method. The film was trimmed to a predetermined size, and thereby making the electromagnetic noise suppressor measuring 32 μm in total thickness. Surface was observed before and after sputtering. Then a thin portion was sliced by means of a microtome from the electromagnetic noise suppressor thus obtained and, after polishing the cut surface by ion beam, thickness of the composite layer was measured. The measurement of electromagnetic noise suppressing characteristic was also conducted.

Figure 21:
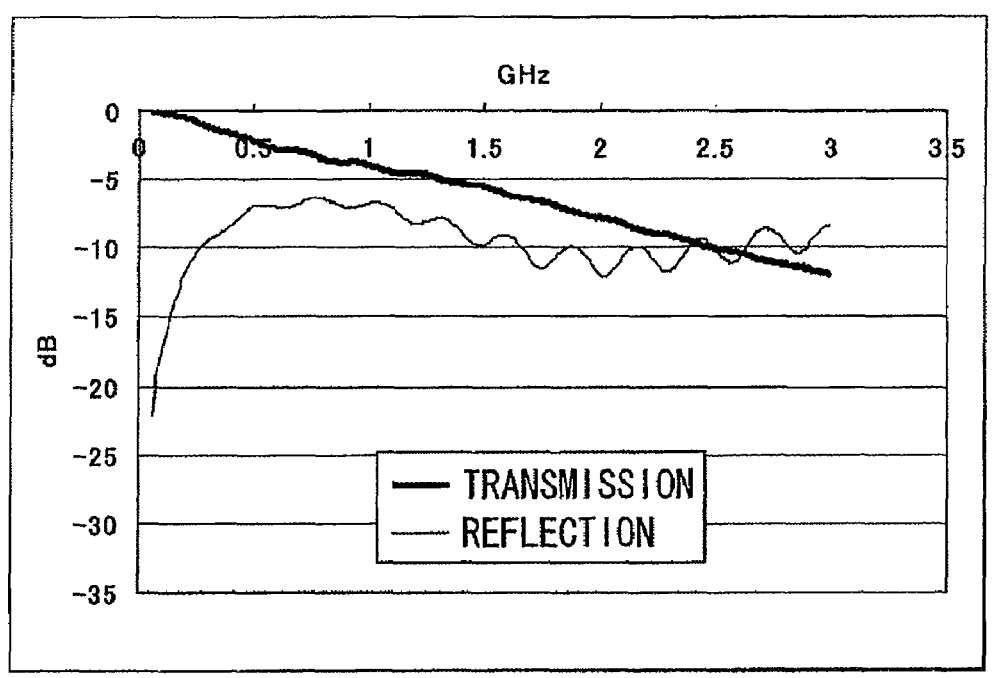
FIG. 21 is a graph showing transmission attenuation and reflection attenuation of the electromagnetic noise suppressor in a frequency range from 0.05 to 3 GHz of example 5, with intensity of incoming electromagnetic radiation being set to reference (0).

The results are shown in Table 2. Results of surface observation are shown in FIGS. 4 to 7, observation of the composite layer on the cross section is shown in FIG. 3, and electromagnetic noise suppressing characteristic at frequencies from 0.05 to 3 GHz are shown in FIG. 21. In FIG. 21, thick line shows transmission attenuation when incoming electromagnetic radiation is set to reference value (0), and thin line shows reflection attenuation.

Example 6

A silicone gel having a thickness of 60 μm, elastic modulus in shear of $5 \times 10^4$ Pa at normal temperature, carbon dioxide gas permeability of $2 \times 10^{-7}$ [$cm^3$ (STP) cm/($cm^2 \times s \times cmHg$)] at normal temperature was provided as the base material on a support layer similar to that of Example 5, and thereon a composite layer was formed by physical vapor deposition of Fe—Ni-based soft magnetic metal to equivalent thickness of 80 nm by biased magnetron sputtering method thereby to obtain an electromagnetic noise suppressor having total thickness of 72 μm. Sputtering was carried out by controlling the bias voltage so as to impart energy of 20 eV to the vaporized particles while maintaining the base material at the normal temperature. Surface resistivity, thickness of the composite layer and electromagnetic noise suppressing characteristic were measured similarly to Example 5.

Figure 22:
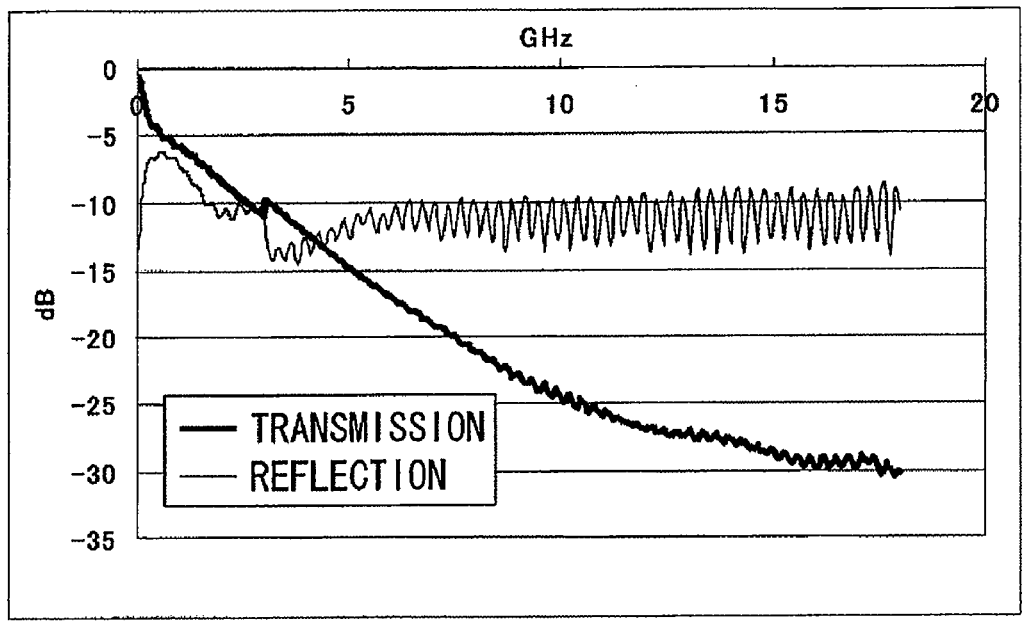
FIG. 22 is a graph showing transmission attenuation and reflection attenuation of the electromagnetic noise suppressor in a frequency range from 0.05 to 18 GHz of Example 6, with intensity of incoming electromagnetic radiation being set to reference (0).

The results are shown in Table 2. Electromagnetic noise suppressing characteristic at frequencies from 0.05 to 18 GHz is shown in FIG. 22. In FIG. 22, the thick line shows transmission attenuation when incoming electromagnetic radiation is set to reference value (0), and thin line shows reflection attenuation.

Example 7

A polyacrylonitrile sheet (hereinafter referred to as PAN) having a thickness of 100 μm, elastic modulus in shear of $1.7 \times 10^9$ Pa at the normal temperature, elastic modulus in shear of $1.5 \times 10^6$ Pa at 160° C., carbon dioxide gas permeability of $5.3 \times 10^{-8}$ [$cm^3$ (STP) cm/($cm^2 \times s \times cmHg$)] at the normal temperature and oxygen gas permeability of $2.8 \times 10^{-15}$ [$cm^3$ (STP) cm/($cm^2 \times s \times cmHg$)] at the normal temperature was provided as the base material, and thereon a composite layer was formed by physical vapor deposition of metal Ni to an equivalent thickness of 60 nm by opposing target type magnetron sputtering process thereby to obtain the electromagnetic noise suppressor having total thickness of 100 μm. Sputtering was carried out by controlling the bias voltage so as to impart energy of 100 eV to the vaporized particles while maintaining the base material temperature at 160° C. Surface resistivity, thickness of the composite layer and electromagnetic noise suppressing characteristic were measured similarly to Example 6.

Figure 23:
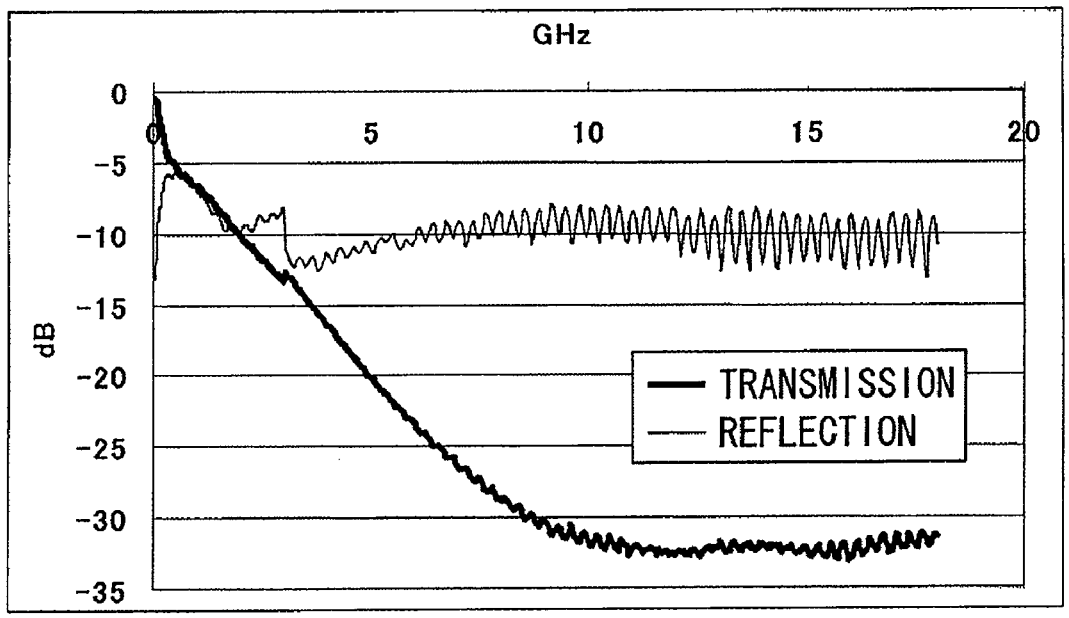
FIG. 23 is a graph showing transmission attenuation and reflection attenuation of the electromagnetic noise suppressor in a frequency range from 0.05 to 18 GHz of Example 7, with intensity of incoming electromagnetic radiation being set to reference (0).

The results are shown in Table 2. Electromagnetic noise suppressing characteristic at frequencies from 0.05 to 18 GHz is shown in FIG. 23. In FIG. 23, the thick line shows transmission attenuation when incoming electromagnetic radiation is set to reference value (0), and thin line shows reflection attenuation.

Comparative Example 2

A paste made by adding 5 parts by weight of a polyurethane resin, 1 part by weight of an isocyanate compound as a curing agent and 30 parts by weight of a solvent (1:1 mixture of cyclohexanone and toluene) to 94 parts by weight of Fe—Ni-based soft magnetic metal powder, of flake shape (mean particle size 15 μm, aspect ratio 65) having non-conductive film formed by oxidization of the surface, was applied by bar coating method to a support fixture for application to form a film having a thickness of 1.1 mm after drying. The film was fully dried, pressed under heat in vacuum and cured at 85° C. for 24 hours, before being removed from the support fixture for application, thereby to obtain the electromagnetic noise suppressor having a thickness of 1 mm. Then surface resistivity and electromagnetic noise suppressing characteristic were measured similarly to Example 6.

Figure 24:
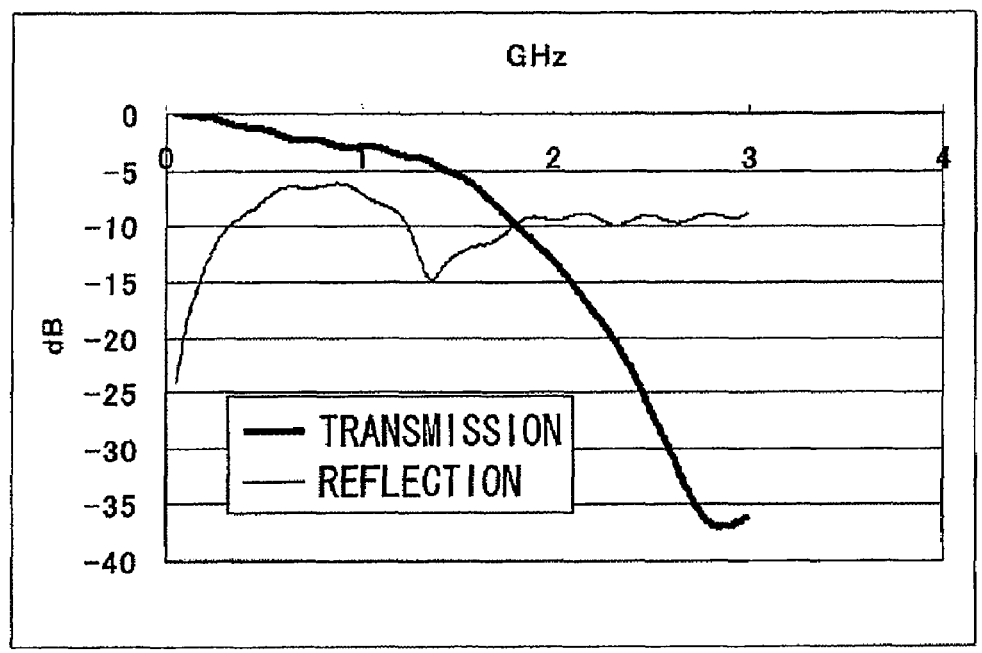
FIG. 24 is a graph showing transmission attenuation and reflection attenuation of the electromagnetic noise suppressor in a frequency range from 0.05 to 3 GHz of Comparative Example 2, with intensity of incoming electromagnetic radiation being set to reference (0).

The results are shown in Table 2. Electromagnetic noise suppressing characteristics at frequencies from 0.05 to 3 GHz is shown in FIG. 24. In FIG. 24, the thick line shows transmission attenuation when incoming electromagnetic radiation is set to reference value (0), and thin line shows reflection attenuation.

Comparative Example 3

Operations similar to those of Comparative Example 2 were carried out except for using an Fe—Ni-based soft magnetic metal powder having mean particle size of 8 μm and aspect ratio of 31 and forming a film 0.03 mm in thickness. Surface resistivity and electromagnetic noise suppressing characteristic were measured similarly to Example 6.

Figure 25:
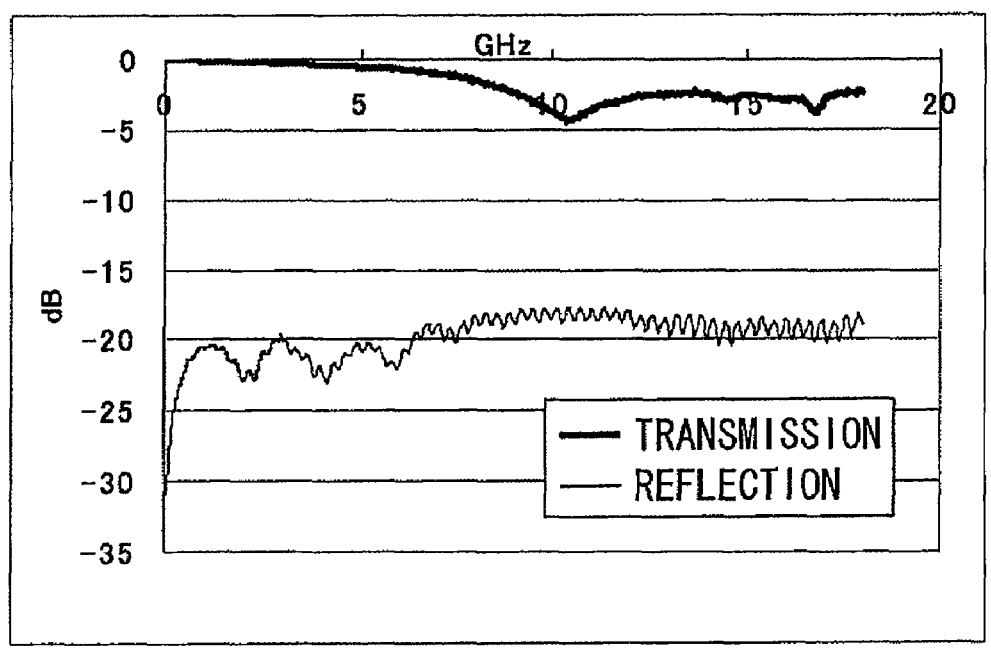
FIG. 25 is a graph showing transmission attenuation and reflection attenuation of the electromagnetic noise suppressor in a frequency range from 0.05 to 18 GHz of Comparative Example 3, with intensity of incoming electromagnetic radiation being set to reference (0).

The results are shown in Table 2. Electromagnetic noise suppressing characteristic at frequencies from 0.05 to 18 GHz are shown in FIG. 25. In FIG. 25, the thick line shows the transmission attenuation when incoming electromagnetic radiation is set to reference value (0), and thin line shows the reflection attenuation.

Comparative Example 4

Operations similar to those of Example 6 were carried out except for using an EB vapor deposition apparatus. Particle energy was 1 eV. A uniform film of magnetic material having a thickness of 80 nm (0.08 μm) was formed without forming a composite layer.

Figure 26:
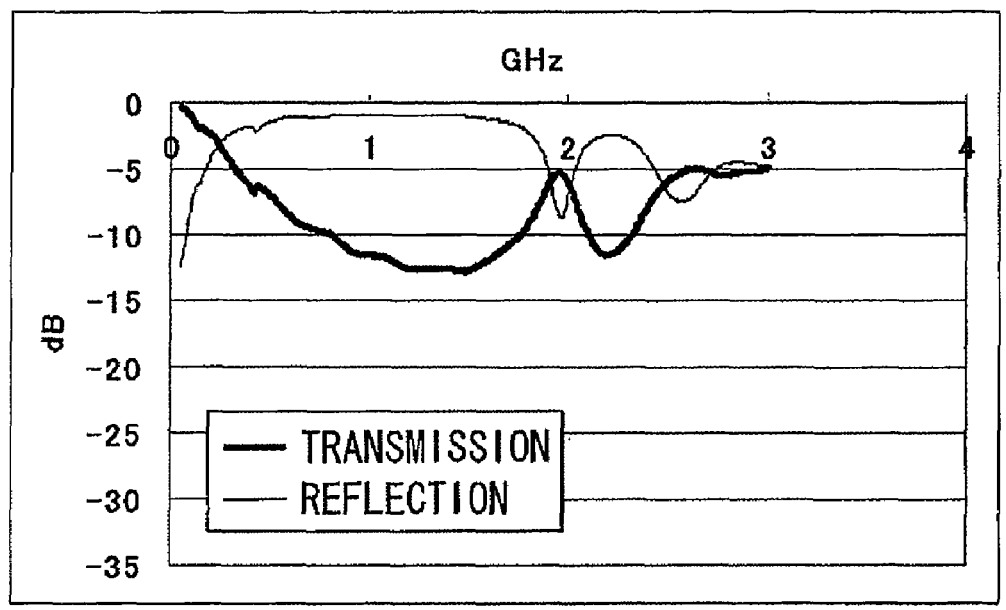
FIG. 26 is a graph showing transmission attenuation and reflection attenuation of the electromagnetic noise suppressor in a frequency range from 0.05 to 3 GHz of Comparative Example 4, with intensity of incoming electromagnetic radiation being set to reference (0).

The results are shown in Table 2. Electromagnetic noise suppressing characteristic at frequencies from 0.05 to 3 GHz is shown in FIG. 26. In FIG. 26, the thick line shows the transmission attenuation when incoming electromagnetic radiation is set to reference value (0), and the thin line shows the reflection attenuation.

TABLE 2

|  | Example 5 | Example 6 | Example 7 | Comparative Example 2 | Comparative Example 3 | Comparative Example 4 |
|---|---|---|---|---|---|---|
| Support layer | PET | PET | None | None | None | PET |
| Thickness of support layer (μm) | 12 | 12 | — | — | — | 12 |
| Base material | Silicone | Silicone | PAN | — | — | Silicone |
| Elastic modulus in shear during vapor deposition (Pa) | $1 \times 10^7$ | $5 \times 10^4$ | $1.5 \times 10^6$ | — | — | $5 \times 10^4$ |
| Thickness of base material (μm) | 20 | 60 | 100 | — | — | 60 |
| Magnetic material | Fe—Ni | Fe—Ni | Ni | Fe—Ni | Fe—Ni | Fe—Ni |
| Deposited amount (equivalent thickness, nm) | 30 | 80 | 60 | — | — | 80 |
| Particle energy (eV) | 8 | 20 | 100 | — | — | — |
| Thickness of composite layer (or layer containing magnetic material) (μm) | 0.04 | 15.0 | 1.1 | 1000 | 30 | 0.08 |
| Maximum transmission attenuation of electromagnetic radiation (dB) | −11.9 | −30.2 | −32.9 | −37.0 | −0.8 | −12.8 |
| Frequency for maximum transmission attenuation of electromagnetic radiation (GHz) | 3.0 | 18.0 | 15.7 | 2.8 | 10.5 | 1.5 |
| Reflection attenuation at the above frequency (dB) | −8.4 | −10.7 | −9.1 | −9.1 | −18.5 | −1.0 |
| Surface resistivity (Ω/□) | $2 \times 10^2$ | $5 \times 10^5$ | $1 \times 10^3$ | $1 \times 10^6$ | $1 \times 10^6$ | $3 \times 10^{-2}$ |
| Maximum transmission attenuation of electromagnetic radiation per unit thickness of composite layer (or layer containing magnetic material) (dB/μm) | 298 | 2.01 | 29.9 | 0.037 | 0.027 | 160 |
| Evaluation | Good | Good | Good | Poor | Poor | Poor |

From Table 2 and FIGS. 21 to 25, it can be seen that Examples 5 to 7 and Comparative Examples 2 and 3 have similar electromagnetic noise suppressing characteristics, that is they show similar curves of transmission attenuation and reflection attenuation, with large value of reflection attenuation and small value of transmission attenuation in low frequency region, and transmission attenuation increasing with the frequency.

In Examples 5 to 7, the amount of the magnetic material and maximum transmission attenuation of electromagnetic radiation show a correlation with each other, such that a larger amount of the magnetic material results in larger attenuation. The composite layer is thin and shows transmission attenuation and reflection attenuation characteristics comparable to those of Comparative Example 4.

In Comparative Example 2, the layer containing the magnetic material (the same as the electromagnetic noise suppressor in total thickness) is as thick as 1000 μm and shows transmission attenuation and reflection attenuation comparable to those of Example, although the layer includes less content of the binding agent and is therefore prone to breakage when subjected to impact. The transmission attenuation is also insufficient at low frequencies, and the band is narrower than that of the Examples.

In Comparative Example 3, although the layer is thin, absorbing characteristics becomes poorer accordingly, resulting in smaller value of maximum transmission attenuation of electromagnetic radiation per unit thickness of the layer including the magnetic layer similarly to Comparative Example 2. Maximum transmission attenuation of electromagnetic radiation does not reach −10 dB, which shows that practical electromagnetic noise suppressing effect cannot be obtained.

In Comparative Example 4, since vapor deposition was carried out with low particle energy, a uniform thin metal film was formed on the surface of the base material showing a behavior similar to metal as shown in FIG. 26 and a peak characteristics to metal, thus achieving transmission attenuation due to reflection. The electromagnetic noise suppressing effect is low and the function as an electromagnetic shield is preformed.

The electromagnetic noise suppressors of Examples 5 to 7 have large maximum transmission attenuation of electromagnetic radiation/thickness of composite layer, showing excellent electromagnetic noise suppressing characteristic per thickness, and is thin, light in weight, expandable and flexible while retaining the properties of the binding agent.

(Evaluation)

Examples 8 to 10 and Comparative Examples 5 to 7 were evaluated as follows.

Observation of surface: Surface was observed with magnification factor of 4000 by a laser microscope VK-9500 manufactured by KEYENCE CORPORATION.

Surface resistivity was measured by DC 4-terminal method at voltage of 10V using MCP-T600 manufactured by Dia Instruments Co., Ltd. Measurements at 5 points were averaged.

The thickness of the composite layer was determined from electron microscope photograph (50000×) of a cross section of the electromagnetic noise suppressor using a scanning electron microscope (SEM) JEM-2100F manufactured by JEOL Ltd.

Electromagnetic noise suppressing characteristic: S21 (transmission attenuation) and S11 (reflection attenuation) were measured by S parameter method using a near field electromagnetic noise suppressor measuring instrument manufactured by KEYCOM Corporation. Vector network analyzer 37247C manufactured by Anritsu Company Ltd. and test fixtures TF-3A manufactured by KEYCOM Corporation was used for micro-strip line of 50 Ω. Power loss at 1 GHz was determined from S21 and S11 at 1 GHz.

Example 8

Silicone rubber having a thickness of 20 μm, elastic modulus in shear of $1\times10^7$ Pa at normal temperature, carbon dioxide gas permeability of $2.2\times10^{-7}$ [$cm^3$ (STP) cm/($cm^2 \times s \times cmHg$)] at normal temperature (containing wet silica) was provided as the base material on a PET film used as the support layer having a thickness of 12 μm, and thereon composite layer was formed by sputtering Fe—Ni-based soft magnetic metal to equivalent thickness of 30 nm by physical vapor deposition of opposing target type magnetron sputtering process. Sputtering was carried out by applying a low negative voltage so as to impart energy of 8 eV to the vaporized particles while maintaining the base material at the normal temperature. Surface resistivity of the composite layer was measured by a DC 4-terminal method. The film was trimmed to a predetermined size, and thereby making the electromagnetic noise suppressor measuring 32 μm in total thickness. Then, a thin portion was sliced by means of a microtome from the electromagnetic noise suppressor thus obtained and, after polishing the cut surface by ion beam, thickness of the electromagnetic noise suppressing layer was measured. The measurement of electromagnetic noise suppressing characteristic was also conducted.

The results are shown in Table 3. Power loss characteristics at frequencies from 0.05 to 3 GHz are shown in FIG. 27.

Example 9

Acrylic adhesive layer (hereinafter referred to as AC, product name 1604N manufactured by Soken Chemical & Engineering Co., Ltd.) having a thickness of 25 μm, elastic modulus in shear of $6\times10^4$ Pa at normal temperature, carbon dioxide gas permeability of $2\times10^{-8}$ [$cm^3$ (STP) cm/($cm^2 \times s \times cmHg$)] at normal temperature was provided as the base material on a polyimide film (hereinafter referred to as PI) used as the support layer having a thickness of 6 μm, and thereon Fe—Ni-based soft magnetic metal was deposited to equivalent thickness of 30 nm by physical vapor deposition of biased magnetron sputtering process, thereby to obtain the electromagnetic noise suppressor having total thickness of 72 μm. Sputtering was carried out by controlling the bias voltage so as to impart energy of 10 eV to the vaporized particles while maintaining the base material at the normal temperature. Surface resistivity, thickness of the composite layer and electromagnetic noise suppressing characteristic were measured similarly to Example 8.

The results are shown in Table 3. Power loss characteristics at frequencies from 0.05 to 3 GHz are shown in FIG. 28.

Example 10

A PAN sheet having a thickness of 70 μm, elastic modulus in shear of $1.7\times10^9$ Pa at the normal temperature, elastic modulus in shear of $1.5\times10^6$ Pa at 160° C., carbon dioxide gas permeability of $5.3\times10^{-8}$ [$cm^3$ (STP) cm/($cm^2 \times s \times cmHg$)] at normal temperature and oxygen gas permeability of $2.8\times10^{-15}$ [$cm^3$ (STP) cm/($cm^2 \times s \times cmHg$)] at normal the temperature was provided as the base material, and thereon metal Ni was deposited to equivalent thickness of 50 nm by physical vapor deposition of opposing target type magnetron sputtering process thereby to obtain the electromagnetic noise suppressor having total thickness of 100 μm. Sputtering was carried out by controlling the bias voltage so as to impart energy of 20 eV to the vaporized particles while maintaining the base material temperature at 160° C. Surface resistivity, thickness of the composite layer and electromagnetic noise suppressing characteristic were measured similarly to Example 9.

The results are shown in Table 3. Power loss characteristic at frequencies from 0.05 to 3 GHz is shown in FIG. 29.

Comparative Example 5

A paste made by adding 5 parts by weight of a polyurethane resin, 1 part by weight of an isocyanate compound as a curing agent and 30 parts by weight of a solvent (1:1 mixture of cyclohexanone and toluene) to 94 parts by weight of Fe—Ni-based soft magnetic metal powder, of flake shape (mean particle size 15 μm, aspect ratio 65) having non-conductive film formed by oxidization of the surface, was applied by bar coating method to a support fixture for application to form a film having a thickness of 0.51 mm after drying. The film was fully dried, pressed under heat in a vacuum and was cured at 85° C. for 24 hours, before being removed from the support fixture for application, thereby to obtain the electromagnetic noise suppressor having a thickness of 0.5 mm. Then surface resistivity and electromagnetic noise suppressing characteristic were measured similarly to Example 9.

The results are shown in Table 3. Power loss characteristic at frequencies from 0.05 to 3 GHz is shown in FIG. 30.

Comparative Example 6

An amorphous film 2.5 μm in thickness was formed on a glass plate 0.6 mm thick using a high frequency magnetron sputtering apparatus and a Co—Fe—Al target in a stream of oxygen gas. Then a magnetic field of 19894 A/m (250 Oe) was applied so as to heat the sample to 300° C., thereby causing metallic crystals to precipitate.

It was confirmed, through observation under a transmission electron microscope, that the metallic crystal had nano-granular structure consisting of granules measuring several nanometers and insulating oxide. Surface resistivity and thickness of the amorphous film were measured similarly to Example 9. The film was divided by means of a dicing saw (blade thickness 0.15 mm) at 2.5 mm intervals so as to be insulated, and electromagnetic noise suppressing characteristic was measured.

The results are shown in Table 3. Power loss characteristic at frequencies from 0.05 to 3 GHz is shown in FIG. 31.

Comparative Example 7

An aqueous solution of ferrous chloride (16.6 mmol/l), nickel (II) chloride (15.3 mmol/l) and zinc chloride (0.18 mmol/l) and an oxidizing solution consisting of sodium nitrate (5 mmol/l) and ammonium acetate (65 mmol/l) were applied, each at a flow rate of 50 ml/min., to a PI film having a thickness of 50 μm by spin spray coating for about 15 hours until nickel-zinc-ferrite plating film 15 μm in thickness was formed, that was then washed in water thereby to obtain a specimen. Surface resistivity, thickness of the nickel-zinc-ferrite plating film and electromagnetic noise suppressing characteristic were measured similarly to Example 9.

The results are shown in Table 3. Power loss characteristics at frequencies from 0.05 to 3 GHz are shown in FIG. 32.

TABLE 3

|  | Example 8 | Example 9 | Example 10 | Comparative Example 5 | Comparative Example 6 | Comparative Example 7 |
|---|---|---|---|---|---|---|
| Support layer | PET | PI | None | None | Glass | PI |
| Thickness of support layer (μm) | 12 | 6 | — | — | 600 | 50 |
| Base material | Silicone | AC | PAN | — | — | — |
| Elastic modulus in shear during vapor deposition (Pa) | $1 \times 10^7$ | $6 \times 10^4$ | $1.5 \times 10^6$ | — | — | — |
| Thickness of base material (μm) | 20 | 25 | 70 | — | — | — |
| Magnetic material | Fe—Ni | Fe—Ni | Ni | Fe—Ni | Co—Fe—Al—O | Ni—Zn—Fe—O |
| Deposited amount (equivalent thickness, nm) | 30 | 50 | 50 | — | — | — |
| Particle energy (eV) | 8 | 10 | 20 | — | — | — |
| Thickness of composite layer (or layer containing magnetic material) (μm) | 0.04 | 0.06 | 0.15 | 500 | 2.0 | 15.0 |
| Transmission attenuation (dB at 1 GHz) | −4.0 | −7.8 | −12.6 | −0.8 | −0.9 | −1.9 |
| Reflection attenuation (dB at 1 GHz) | −6.8 | −6.8 | −4.1 | −9.6 | −11.2 | −11.0 |
| Power loss (at 1 GHz) | 0.39 | 0.62 | 0.56 | 0.064 | 0.11 | 0.28 |
| Surface resistivity (Ω/□) | $2 \times 10^2$ | $4 \times 10^3$ | $2 \times 10^4$ | $1 \times 10^6$ | $2 \times 10^0$ | $7 \times 10^7$ |
| Total thickness of electromagnetic noise suppressor (μm) | 32 | 31 | 70 | 500 | 602 | 65 |
| Power loss/thickness (μm) of composite layer (or layer containing magnetic material) | 9.75 | 10.3 | 3.73 | $1.3 \times 10^{-4}$ | 0.055 | 0.019 |
| Electromagnetic noise suppressing effect | Good | Good | Good | Insufficient | Insufficient | Insufficient |
| Evaluation | Rubber-like elasticity and flexibility | Surface shows adhesiveness and flexibility shows the property of the support member | Tough film | A little brittle and cannot expand | Hard and prone to cracking | Difficult to handle due to crack and/or delamination of ferrite layer |
| Evaluation | Good | Good | Good | Poor | Poor | Poor |

Table 3 shows that power loss at 1 GHz is 0.3 or higher in Examples 8 to 10, lower than 0.3 in Comparative Examples 5 to 7, and was lower than 0.1 in Comparative Example 1. This indicates that Examples of the present invention have high electromagnetic noise suppressing effect in the sub-microwave band around 1 GHz where practical effect is said to be high. It was also found that the composite layers of Examples are very thin and show far higher values of power loss per unit thickness of the composite layer, about four orders of magnitude higher when compared to Comparative Example 5.

FIGS. 27 to 29 that depict Examples show similar values, about 0.8, of power loss at 3 GHz, while FIGS. 30 to 31 that depict Comparative Examples show lower values of about 0.5.

Increase in power loss with increasing frequency is about 0.2 at 0.5 GHz and about 0.6 at 1 GHz as shown in FIG. 27 of Example, about 0.4 at 0.5 GHz and about 0.6 at 1 GHz in FIG. 28 and about 0.3 at 0.5 GHz and about 0.6 at 1 GHz in FIG. 29. That is, power loss increases rapidly with the frequency up to about 1 GHz in Examples. FIG. 30 that depicts the Comparative Example, in contrast, shows an increase in power loss of about 0.03 at 0.5 GHz and about 0.1 at 1 GHz. FIG. 31 shows an increase in power loss of about 0.04 at 0.5 GHz and about 0.1 at 1 GHz. FIG. 32 shows an increase in power loss of about 0.1 at 0.5 GHz and about 0.28 at 1 GHz. That is, power loss increases gradually with the frequency up to about 1 GHz in Comparative Examples.

The electromagnetic noise suppressors of Examples were thin and light in weight and had flexibility similarly to the support member, while the electromagnetic noise suppressors of Comparative Examples were thick, heavy and brittle.

(Evaluation)

Examples 11 to 16 and Comparative Examples 8 to 10 were evaluated as follows.

Observation of cross section was carried out with a transmission electron microscope H9000NAR manufactured by Hitachi, Inc.

Electromagnetic noise suppressing characteristic: S11 (reflection attenuation) and S21 (transmission attenuation) were measured by S parameter method using a near field electromagnetic noise suppressor measuring instrument manufactured by KEYCOM Corporation. Vector network analyzer 37247C manufactured by Anritsu Company Ltd. and test fixture TF-3A manufactured by KEYCOM Corporation was used for micro strip line of 50 Ω. Electromagnetic noise suppressing effect (Ploss/Pin) can be determined from the changes in S11 and S21 of the transmission characteristics by the following equation.

$$Ploss/Pin = 1 - (|S11|^2 + |S21|^2)$$

Combustion test was conducted according to vertical combustion test UL94 VTM. Five samples, measuring 200 mm in thickness, 50 mm in width and 0.1 mm in thickness were tested. Criteria of judgment are shown in Table 4.

TABLE 4

| (Unit: sec.) | 94VTM-0 | 94VTM-1 | 94VTM-2 |
|---|---|---|---|
| Flame retaining time of each sample ($t_1$ or $t_2$) | ≦10 | ≦30 | ≦30 |
| Total flame retaining time of each set through all processes ($t_1 + t_2$ of 5 samples) | ≦50 | ≦250 | ≦250 |

TABLE 4-continued

| (Unit: sec.) | 94VTM-0 | 94VTM-1 | 94VTM-2 |
|---|---|---|---|
| Sum of flame retaining time and smoking time after second flaming of each sample ($t_2 + t_3$) | ≦30 | ≦60 | ≦60 |
| Whether flame or smoke remained up to the marking line of 125 mm | No | No | No |
| Whether the indicator cotton as ignited by flaming material or dripping material | No | No | Yes |

Example 11

PAN having elastic modulus in shear of $1.7 \times 10^7$ Pa at normal temperature was dissolved in N,N-dimethylacrylamide (hereinafter denoted DMAc), to prepare a DMAc solution of PAN having concentration of 25% by weight. 20 Parts by weight of an aromatic condensed phosphate ester (PX-200 manufactured by DAIHACHI CHEMICAL INDUSTRY CO., LTD.) was added as a flame retarding agent to 400 parts by weight of the solution, and the solution was applied to PET to form a film having a thickness of 0.1 mm after drying, thereby obtaining a PAN sheet. A composite layer was formed by sputtering Fe—Ni-based soft magnetic metal to equivalent thickness of 20 nm on the PAN surface of the PAN sheet by physical vapor deposition of opposing target type magnetron sputtering process. Sputtering was carried out by applying a low negative voltage so as to impart energy of 8 eV to the vaporized particles while maintaining the PAN sheet at the normal temperature.

A thin portion was sliced by means of a microtome from the electromagnetic noise suppressor thus obtained and the cut surface, after being polished by an ion beam, was observed with a high-resolution transmission electron microscope. The thickness of the composite layer was 40 nm (0.040 μm).

The measurement of electromagnetic noise suppressing characteristic at 1 GHz and combustion test were also conducted. The results are shown in Table 5.

Example 12

3 Parts by weight of 2-methylimidazole (manufactured by Shikoku Corp.) as a curing agent, 20 parts by weight of triphenyl phosphate (hereinafter denoted as TPP, manufactured by DAIHACHI CHEMICAL INDUSTRY CO., LTD.) as a flame retarding agent, 50 parts by weight of aluminum hydroxide (hereinafter denoted as $Al(OH)_3$) and 50 parts by weight of magnesium hydroxide (hereinafter denoted as $Mg(OH)_2$) were added to 100 parts by weight of epoxy resin having elastic modulus in shear of $8.0 \times 10^6$ Pa before curing and elastic modulus in shear of $5 \times 10^9$ Pa after curing, and the mixture was applied to PET to form a film having a thickness of 0.1 mm, thereby to obtain an epoxy resin sheet (B stage). A composite layer was formed by sputtering Fe—Ni-based soft magnetic metal to equivalent thickness of 15 nm on the epoxy resin surface of the epoxy resin sheet by physical vapor deposition of the opposing target type magnetron sputtering process. Sputtering was carried out by applying a low negative voltage so as to impart energy of 8 eV to the vaporized particles while maintaining the epoxy resin sheet at the normal temperature. Then the sheet was heated at 40° C. for 6 hours, then at 120° C. for 2 hours to harden the epoxy resin, and then the PET was removed, thereby to obtain the electromagnetic noise suppressor.

A thin portion was sliced by means of a microtome from the electromagnetic noise suppressor thus obtained. The cut surface was polished by ion beam and was observed with high-resolution transmission electron microscope. The thickness of the composite layer was 25 nm (0.025 μm).

The measurement of electromagnetic noise suppressing characteristic at 1 GHz and combustion test were also conducted. The results are shown in Table 5.

Example 13

0.2 parts by weight of dinitrodiamine platinum (II) as flame retarding agent and 0.1 part by weight of acetylene black were added to 100 parts by weight of silicone rubber (dual component type) containing wet silica, and the mixture was subjected to vulcanization at 150° C. for 1 hour, thereby to obtain a silicon sheet having a thickness of 0.1 mm and elastic modulus in shear of $1.5 \times 10^7$ Pa after vulcanization. A composite layer was formed by sputtering Fe—Ni-based soft magnetic metal to equivalent thickness of 15 nm on one side of the silicone sheet by physical vapor deposition of the opposing target type magnetron sputtering process, thereby to obtain the electromagnetic noise suppressor. Sputtering was carried out by applying a low negative voltage so as to impart energy of 8 eV to the vaporized particles while maintaining the silicone sheet at the normal temperature.

A thin portion was sliced by means of a microtome from the electromagnetic noise suppressor thus obtained and the cut surface was polished by ion beam and the cross section of the composite layer was observed with high-resolution transmission electron microscope. The thickness of the composite layer was 30 nm (0.030 μm).

The measurement of electromagnetic noise suppressing characteristic at 1 GHz and combustion test were also conducted. The results are shown in Table 5.

Comparative Example 8

100 parts by weight of a solution A containing a binding agent prepared as described below was added to 300 parts by weight of Fe—Ni-based soft magnetic metal powder, of flake shape (mean particle size 15 μm, aspect ratio 65) having non-conductive film formed by oxidization of the surface, thereby to make a paste. The paste was applied by a bar coating method to a support fixture for application to form a film having a thickness of 0.1 mm after drying. The film was fully dried, pressed in a vacuum and cured at 85° C. for 24 hours, before being removed from the support fixture for application, thereby to obtain the electromagnetic noise suppressor. The electromagnetic noise suppressor was evaluated similarly to Example 11. The results are shown in Table 5.

Preparation of solution A: 60 parts by weight of a polyurethane resin, 20 parts by weight of an isocyanate compound as a curing agent and 20 parts by weight of an aromatic condensed phosphate ester (PX-200 manufactured by DAIHACHI CHEMICAL INDUSTRY CO., LTD.) as flame retarding agent were added to 400 parts by weight of a solvent (1:1 mixture of cyclohexanone and toluene), to prepare a solution A.

Comparative Example 9

100 Parts by weight of a silicone rubber (dual component type) containing wet silica, 0.2 parts by weight of dinitrodiamine platinum (II) as flame retarding agent and 1.0 parts by weight of acetylene black were added to 300 parts by weight of Fe—Ni-based soft magnetic metal powder, of flake shape (mean particle size 15 μm, aspect ratio 65) having non-conductive film formed by oxidization of the surface, and mixed with a mixing roll, thereby to make a composite magnetic material. The composite magnetic material was rolled into a sheet 0.1 mm in thickness with two rolls, and was subjected to vulcanization at 150° C. for 1 hour, thereby to obtain electromagnetic noise suppressor. The electromagnetic noise suppressor was evaluated similarly to Example 11. The results are shown in Table 5.

100EN manufactured by DU PONT□TORAY CO., LTD.), thereby to obtain a stack consisting of an epoxy resin of B stage and a film made of flame retarding resin. The thickness of the epoxy resin layer was 15 μm. A composite layer was formed by sputtering Fe—Ni-based soft magnetic metal to equivalent thickness of 10 nm on the epoxy resin surface of the stack by physical vapor deposition of an opposing target type magnetron sputtering process. Sputtering was carried out by applying a low negative voltage so as to impart energy

TABLE 5

|  | Example 11 | Example 12 | Example 13 | Comparative Example 8 | Comparative Example 9 |
| --- | --- | --- | --- | --- | --- |
| Binding agent | PAN | Epoxy resin TPP, Al(OH)$_3$, Mg(OH)$_2$ | Silicone | Urethane resin | Silicone |
| Flame retarding agent | Aromatic condensed phosphate ester | | Dinitrodiamine platinum (II), acetylene black | Aromatic condensed phosphate ester | Dinitrodiamine platinum (II), acetylene black |
| Magnetic material amount (equivalent thickness, nm) | 20 | 15 | 15 | — | — |
| Thickness of composite layer (μm) | 0.040 | 0.025 | 0.030 | — | — |
| Reflection attenuation (S11) (dB at 1 GHz) | −6.0 | −7.4 | −8.6 | −9.8 | −8.8 |
| Transmission attenuation (S21) (dB at 1 GHz) | −6.8 | −5.0 | −7.4 | −0.8 | −1.0 |
| Ploss/Pin (at 1 GHz) | 0.54 | 0.50 | 0.68 | 0.06 | 0.07 |
| Electromagnetic noise suppressing effect | Good | Good | Good | Insufficient | Insufficient |
| Flexible or not | Yes | Yes | Yes | Easily broken by external stress. | Yes |
| $t_1$ or $t_2$ (seconds) | 12-22 | 7-11 | 2-5 | Unable to evaluate | 26-41 |
| $t_1 + t_2$ of 5 samples (seconds) | 158 | 91 | 36 | | 264 |
| $t_2 + t_3$ (seconds) | 15-40 | 12-26 | 2-7 | | 45-64 |
| Whether flame or smoke remained up to the marking line of 125 mm | No | No | No | | No |
| Whether the indicator cotton was ignited by flaming material or dripping material | No | No | No | | No |
| UL94 Evaluation | VTM-1 | VTM-1 | VTM-0 | | Poor |

Table 5 shows that satisfactory values of Ploss/Pin at 1 GHz were achieved in Examples 11 to 13, indicating sufficient electromagnetic noise suppressing effect. In Comparative Examples 8 and 9, where the soft magnetic material powder and the binding agent were simply mixed, Ploss/Pin at 1 GHz was 0.1 or lower when the thickness was as small as 0.1 mm, indicating very low electromagnetic noise suppressing effect. In Comparative Example 8, it is difficult to form a thin film of about 0.1 mm, and flame retarding property could not be evaluated.

With regard to flame retarding property, the electromagnetic noise suppressors of Examples 11 to 13 demonstrated sufficient level of flame retarding property, satisfying the requirements of VTM-1 in Examples 11 and 12 and VTM-0 in Example 13. In Comparative Example 9, although the flame retarding agent comparable to that of Example 13 was added, sufficient flame retarding property could not be achieved since soft magnetic material powder was used.

Example 14

3 parts by weight of 2-methylimidazole (manufactured by Shikoku Corp.) as a curing agent was added to 100 parts by weight of epoxy resin having elastic modulus in shear of $8.0 \times 10^6$ Pa before curing and elastic modulus in shear of $5 \times 10^9$ Pa after curing, and the mixture was applied to a polyimide resin film having a thickness of 25 μm (KAPTON 100EN manufactured by DU PONT□TORAY CO., LTD.), thereby to obtain a stack consisting of an epoxy resin of B stage and a film made of flame retarding resin. The thickness of the epoxy resin layer was 15 μm. A composite layer was formed by sputtering Fe—Ni-based soft magnetic metal to equivalent thickness of 10 nm on the epoxy resin surface of the stack by physical vapor deposition of an opposing target type magnetron sputtering process. Sputtering was carried out by applying a low negative voltage so as to impart energy of 8 eV to the vaporized particles while maintaining the epoxy resin surface at the normal temperature. Then the sheet was heated at 40° C. for 6 hours, then at 120° C. for 2 hours to harden the epoxy resin, thereby to obtain the electromagnetic noise suppressor.

A thin portion was sliced by means of a microtome from the electromagnetic noise suppressor thus obtained and the cut surface was polished by an ion beam. Cross section of the composite layer was observed with a high-resolution transmission electron microscope. The thickness of the composite layer was 25 nm (0.025 μm).

The measurement of electromagnetic noise suppressing characteristic at 1 GHz and combustion test were also conducted. The results are shown in Table 6.

Example 15

A silicone rubber (dual component type) containing wet silica having elastic modulus in shear of $1.5 \times 10^7$ Pa after vulcanization was laminated by extrusion onto a polyethersulfon resin film 25 μm in thickness (Sumilite FS-13000 manufactured by SUMITOMO BAKELITE Co., Ltd.) and was vulcanized at 150° C. for 1 hour, thereby to obtain a stack. The thickness of the silicone rubber layer was 20 μm. A composite layer was formed by sputtering Fe—Ni-based soft magnetic metal to equivalent thickness of 15 nm on the silicone side of the stack by physical vapor deposition of the opposing target type magnetron sputtering process, thereby to obtain the electromagnetic noise suppressor. Sputtering was carried out by applying a low negative voltage so as to impart energy of 8 eV to the vaporized particles while maintaining the silicone sheet at the normal temperature.

A thin portion was sliced by means of a microtome from the electromagnetic noise suppressor thus obtained and the cut surface was polished by an ion beam and the cross section of the composite layer was observed with a high-resolution transmission electron microscope. The thickness of the composite layer was 30 nm (0.030 μm).

The measurement of electromagnetic noise suppressing characteristic at 1 GHz and combustion tests were also conducted. The results are shown in Table 6.

Example 16

PAN having an elastic modulus in shear of $1.7 \times 10^7$ Pa at the normal temperature was dissolved in DMAc to prepare a DMAc solution of PAN having a concentration of 25% by weight. This solution was applied to fluororesin film having a thickness of 50 μm (Aflex 50N-NT manufactured by ASAHI GLASS CO., LTD.) by means of a bar coater to form a PAN film having a thickness of 10 μm after drying, thereby to obtain a stack. A composite layer was formed by sputtering Fe—Ni-based soft magnetic metal to equivalent thickness of 20 nm on the PAN surface of the stack by physical vapor deposition of opposing target type magnetron sputtering process, thereby to obtain the electromagnetic noise suppressor. Sputtering was carried out by applying a low negative voltage so as to impart energy of 8 eV to the vaporized particles while maintaining the PAN sheet at the normal temperature.

A thin portion was sliced by means of a microtome from the electromagnetic noise suppressor thus obtained and, the cut surface was polished by an ion beam and was observed with a high-resolution transmission electron microscope. The thickness of the composite layer was 30 nm (0.030 μm).

The measurement of electromagnetic noise suppressing characteristic at 1 GHz and combustion test were also conducted. The results are shown in Table 6.

Comparative Example 10

100 parts by weight of a silicone rubber (dual component type) containing wet silica was added to 300 parts by weight of Fe—Ni-based soft magnetic metal powder, of flake shape (mean particle size 15 μm, aspect ratio 65) having non-conductive film formed by oxidization of the surface, and mixed with a mixing roll, thereby to make a composite magnetic material. The composite magnetic material having a thickness of 20 μm was laminated by extrusion onto a polyimide resin film having a thickness of 25 μm (KAPTON 100EN manufactured by DU PONT□TORAY CO., LTD.), and was subjected to vulcanization at 150° C. for 1 hour, thereby to obtain an electromagnetic noise suppressor. The electromagnetic noise suppressor was evaluated similarly to Example 14. The results are shown in Table 6.

TABLE 6

|  | Example 14 | Example 15 | Example 16 | Comparative Example 10 |
|---|---|---|---|---|
| Binding agent | Epoxy resin | Silicone rubber | PAN | Silicone rubber |
| Flame retarding agent | Polyimide resin | Polyether sulfon | Fluoro-resin | Polyimide resin |
| Thickness of flame retarding resin layer (μm) | 25 | 25 | 50 | 25 |
| Magnetic material amount (equivalent thickness, nm) | 10 | 15 | 20 | — |
| Thickness of composite layer (μm) | 0.025 | 0.030 | 0.030 | — |
| Reflection attenuation (S11) (dB at 1 GHz) | −6.0 | −8.2 | −7.0 | −9.5 |
| Transmission attenuation (S21) (dB at 1 GHz) | −7.4 | −7.9 | −6.1 | −0.9 |
| Ploss/Pin (at 1 GHz) | 0.57 | 0.69 | 0.56 | 0.07 |
| $t_1$ or $t_2$ (seconds) | 2-4 | 8-14 | 2-5 | 15-24 |
| $t_1 + t_2$ of 5 samples | 40 | 106 | 34 | 198 |
| $t_2 + t_3$ (seconds) | 2-6 | 11-23 | 0-4 | 24-42 |
| Whether flame or smoke remained up to the marking line of 125 mm | No | No | No | No |
| Whether the indicator cotton was ignited by flaming material or dripping material | No | No | No | No |
| UL94 Evaluation | VTM-0 | VTM-1 | VTM-0 | VTM-1 |
| Comprehensive evaluation | Excellent | Good | Excellent | Poor |

Table 6 shows that satisfactory values of Ploss/Pin at 1 GHz were achieved in Examples 14 to 16, indicating sufficient electromagnetic noise suppressing effect. In Comparative Example 10, where the soft magnetic material powder and the binding agent were simply mixed, Ploss/Pin at 1 GHz was 0.1 or lower when the thickness was as small as 100 μm, indicating very low electromagnetic noise suppressing effect.

With regards to flame retarding property, the electromagnetic noise suppressors of Examples 14 to 16 demonstrated sufficient level of flame retarding property, satisfying the requirements of VTM-0 in Examples 14 and 16 and VTM-1 in Example 15. In Comparative Example 10, although the requirement of VTM-1 was met due to the use of flame retarding agent, electromagnetic noise suppressing effect was not exhibited despite the presence of the composite magnetic material layer having a thickness of 100 μm, and the electromagnetic noise suppressor was heavy and less flexible since a large amount of soft magnetic material powder was used. In the comprehensive evaluation, "Excellent" indicates that high electromagnetic noise suppressing effect and flame retarding property of VTM-0 were achieved, "Good" indicates that high electromagnetic noise suppressing effect and flame retarding property of VTM-1 were achieved, and "Poor" indicates that electromagnetic noise suppressing effect and/or flame retarding property were poor.

In Examples 17 to 20 and Comparative Examples 11 and 12, elastic modulus in shear of the base material was measured at the normal temperature in accordance with JIS K 6254.

Example 17

The electromagnetic noise suppressor shown in FIG. 8 was made under the following conditions.

(Base Material Containing Electrically Conductive Filler and Dielectric Material Powder Dispersed Therein)

A silicone rubber was prepared with 15% by volume of dielectric material powder consisting of barium titanate having a mean particle size of 1 μm and 30% by volume of electrically conductive filler consisting of scale-shaped silver powder having mean particle size of 3.5 μm dispersed therein. The silicone rubber was used as the base material (elastic modulus in shear of $8.3 \times 10^8$ Pa, carbon dioxide gas permeability of $2.1 \times 10^{-7}$ [$cm^3$ (STP) cm/($cm^2 \times s \times cmHg$)], containing wet silica).

The base material prepared as described above was applied onto a PET film used as the support layer having a thickness of 12 μm and elastic modulus in shear of $3.8 \times 10^9$ Pa at normal temperature, thereby forming a base material layer 10 μm in thickness.

(Composite Layer)

A composite layer was formed on the surface of the base material made as described above by sputtering Fe—Ni-based soft magnetic metal to equivalent thickness of 30 nm, thereby to obtain the electromagnetic noise suppressor. Sputtering was carried out by the opposing target type magnetron sputtering process while applying a low negative voltage so as to impart energy of 8 eV to the vaporized particles while maintaining the base material at the normal temperature.

Surface resistivity of the electromagnetic noise suppressor thus obtained was measured by DC 4-terminal method with the result of $2 \times 10^2$ Ω/□ and total thickness of the electromagnetic noise suppressor was 19 μm.

Example 18

The electromagnetic noise suppressor shown in FIG. 13 was made under the following conditions.

(Electrically Conductive Layer)

Ag Metal and Ni metal were deposited to a thickness of 45 nm and 80 nm, respectively, on a PI film 9 μm in thickness used as the support film by physical deposition of the opposing target type magnetron sputtering process, there by form an electrically conductive layer having surface resistivity of 0.2 Ω/□ as measured by DC 4-terminal method.

(Base Material)

A base material similar to that of Example 17 except that the electrically conductive filler was not contained (elastic modulus in shear $6.5 \times 10^7$ Pa at the normal temperature, carbon dioxide gas permeability $2.3 \times 10^{-7}$ [$cm^3$ (STP) cm/($cm^2 \times s \times cmHg$)], containing wet silica) was applied onto the metal surface of the electrically conductive layer, thereby forming a base material layer 10 μm in thickness.

(Composite Layer)

Ferromagnetic material layer consisting of Ni metal was formed on the surface of the base material made as described above by the opposing target type magnetron sputtering process to equivalent thickness of 50 nm, while applying a bias voltage so as to impart energy of 100 eV to the vaporized particles, thereby to obtain the electromagnetic noise suppressor having surface resistivity of $6 \times 10^3$ Ω/□ and total thickness of 19.125 μm.

Example 19

The electromagnetic noise suppressor was made similarly to Example 18 except for using a silicone rubber (elastic modulus in shear $1.2 \times 10^7$ Pa at normal temperature, carbon dioxide gas permeability $2.2 \times 10^{-7}$ [$cm^3$ (STP) cm/($cm^2 \times s \times cmHg$)], containing wet silica), that is, the base material of Example 17 minus the electrically conductive filler and the dielectric material powder dispersed therein.

Example 20

(Electrically Conductive Layer)

Electrically conductive layer was made from plain-weaved SUS mesh of #165 in the form of interlaced metal wires (wire diameter 0.05 mm, mesh opening 0.104 mm, void ratio 43.9%) without providing a support film.

(Base Material)

Then a base material was formed to a thickness of 10 μm from a material similar to that of Example 18 on the electrically conductive layer of interlaced metal wires.

(Composite Layer)

The electromagnetic noise suppressor having total thickness of 110 μm was made by sputtering on the base material similarly to Example 18.

Comparative Example 11

A paste was prepared by adding 5 parts by weight of a polyurethane resin, 1 part by weight of an isocyanate compound as a curing agent and 30 parts by weight of a solvent (1:1 mixture of cyclohexanon and toluene) to 94 parts by weight of Fe—Ni-based soft magnetic metal powder of flake shape having nonconductive film formed by oxidization of the surface (mean particle size 15 μm, aspect ratio 65). This paste was applied to plain-weaved SUS mesh of #165 in the form of interlaced metal wires (wire diameter 0.05 mm, mesh opening 0.104 mm, void ratio 43.9%) by a bar coating method, thereby to form a functional layer having a thickness of 510 μm after drying. The layer was fully dried, pressed in a vacuum and cured at 85° C. for 24 hours, thereby to obtain the electromagnetic noise suppressor having a thickness of 1120 μm.

Comparative Example 12

A copper foil having a thickness of 100 μm was directly subjected to evaluation to be described later.

(Evaluation)

Examples 17 to 20 and Comparative Examples 11 to 12 were evaluated as follows.

Observation of cross section was carried out with a transmission electron microscope H9000NAR manufactured by Hitachi, Inc.

Electromagnetic noise transmission characteristic: S11 (reflection attenuation) and S21 (transmission attenuation) were measured by micro strip line (MSL) method using a near field electromagnetic noise suppressor measuring instrument manufactured by KEYCOM Corporation.

Power loss is a comprehensive index of reflection and transmission characteristics of electromagnetic noise suppressing function determined by the following equations and takes a value in a range from 0 to 1. Power loss was determined by the following equations based on changes in S11 and S21 of transmission characteristics that were measured as shown in FIG. 33.

$$\text{Power loss } (P_{loss}/P_{in}) = 1 - (|\Gamma|^2 + |T|^2)$$

$$S11 = 20 \log|\Gamma|$$

$$S21 = 20 \log|T|$$

Vector network analyzer 37247C manufactured by Anritsu Company Ltd. and test fixture TF-3A manufactured by KEYCOM Corporation was used for micro-strip line having impedance of 50 Ω.

Electromagnetic noise radiation characteristic: Near field electromagnetic noise radiation characteristic was measured by micro-loop antenna method using a micro loop 2 mm in diameter manufactured by KEYCOM Corporation and the internal coupling coefficient and mutual coupling coefficient were measured with a spectrum analyzer R3132 manufactured by ADVANTEST CORPORATION.

Figure 43:
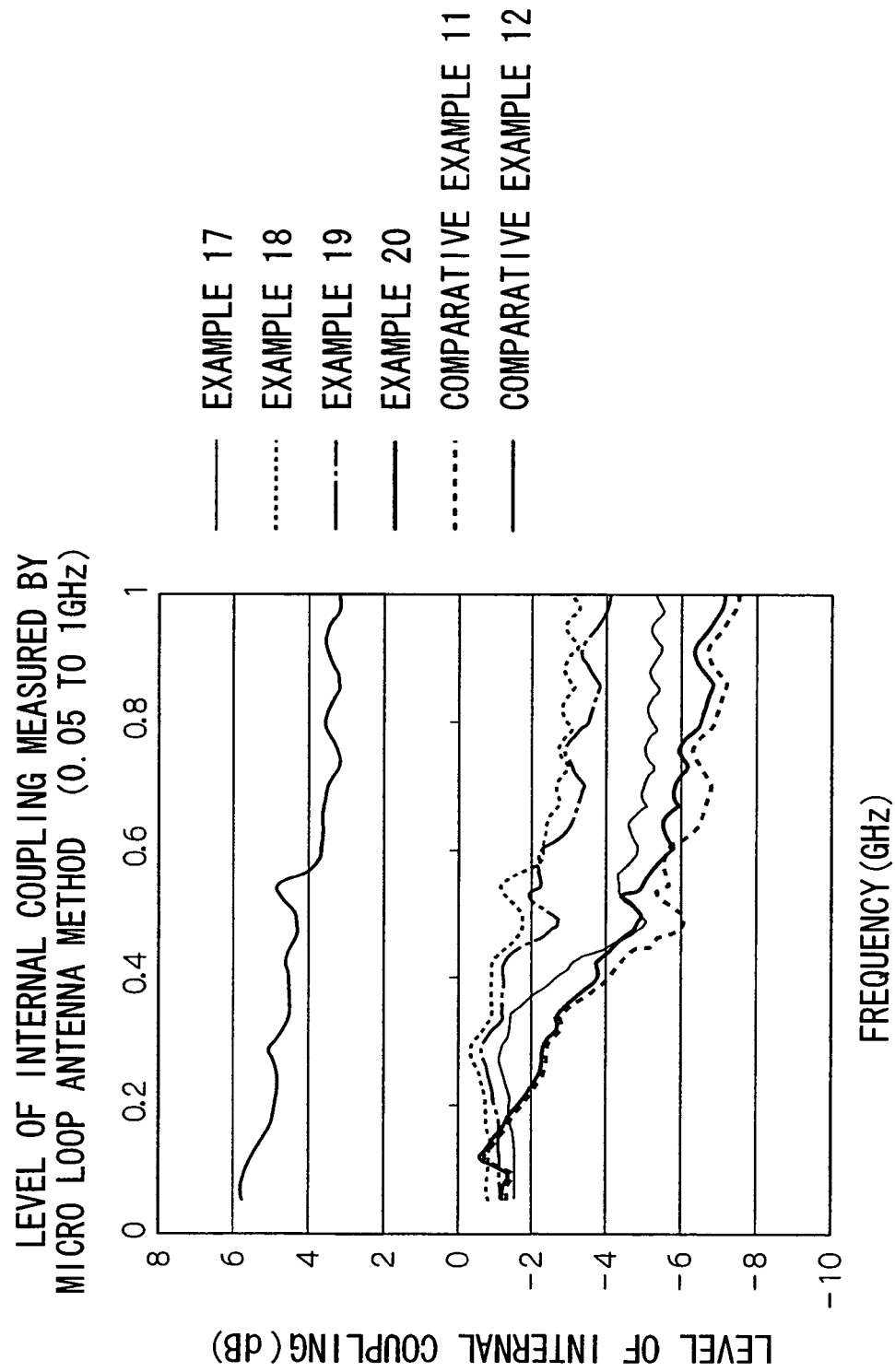
FIG. 43 is a graph showing the level of internal coupling of noise radiated from the electromagnetic noise suppressors of Examples 17, 18, 19 and 20 and Comparative Examples 11 and 12, measured by a micro loop method.
Figure 44:
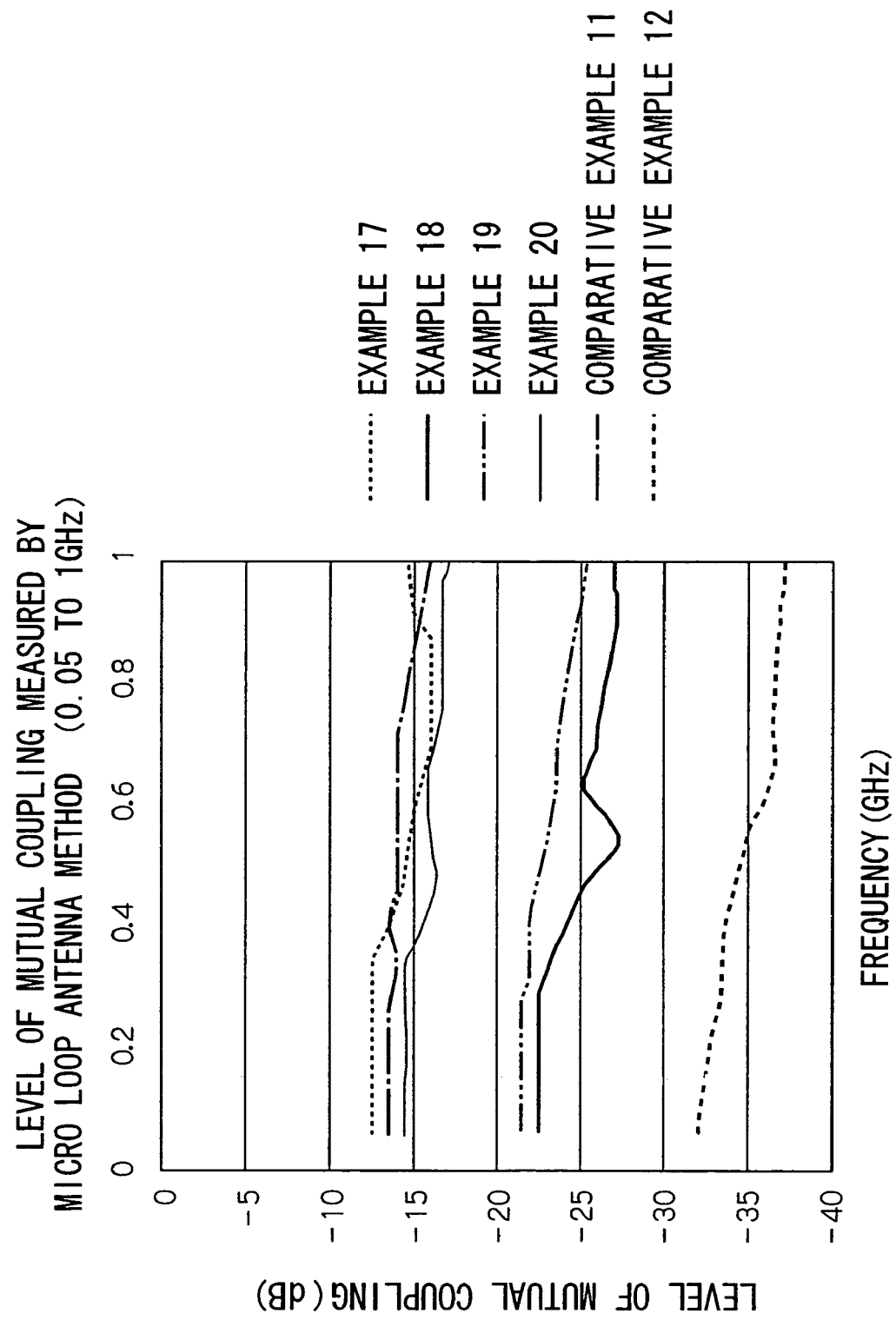
FIG. 44 is a graph showing the level of internal coupling of noise radiated from the electromagnetic noise suppressors of Examples 17, 18, 19 and 20 and Comparative Examples 11 and 12, measured by a micro loop method.

The results are shown in Table 7, noise transmission characteristics (S11, S21) measured by micro-strip line (MSL) method and power loss characteristic are shown in FIGS. 31 to 42, and noise attenuation characteristics (level of internal coupling and level of mutual coupling) measured by micro-loop antenna method are shown in FIGS. 43 and 44.

TABLE 7

|  | Example 17 | Example 18 | Example 19 | Example 20 | Comparative Example 11 | Comparative Example 12 |
|---|---|---|---|---|---|---|
| Support layer or film | PET | PI | PI | None | None | — |
| Thickness of support layer or film (μm) | 12 | 9 | 9 | — | — | — |
| Base material | Silicone rubber | Silicone rubber | Silicone rubber | Silicone rubber | Polyurethane resin | — |
| Electrically conductive filler (particle size, μm) | Ag powder (3.5) | — | — | — | — | — |
| Dielectric material powder (particle size, μm) | Barium titanate (1.0) | Barium titanate (1.0) | — | Barium titanate (1.0) | — | — |
| Elastic modulus in shear (Pa) | $8.3 \times 10^8$ | $6.5 \times 10^7$ | $1.2 \times 10^7$ | $6.5 \times 10^7$ | — | — |
| Thickness of base material (μm) | 10 | 10 | 10 | 10 | 500 | — |
| Magnetic material | Fe—Ni | Ni | Ni | Ni | Fe—Ni-based metal powder of flake shape | — |
| Magnetic material amount (equivalent thickness, nm) | 30 | 50 | 50 | 50 | — | — |
| Physical vapor deposition method | Opposing target deposition | Opposing target deposition | Opposing target deposition | Opposing target deposition | — | — |
| Surface resistivity (Ω/□) | $2 \times 10^2$ | $1.5 \times 10^3$ | $1.5 \times 10^3$ | $1.5 \times 10^3$ | — | — |
| Thickness of composite layer (μm) | Approx. 0.05 | Approx. 0.1 | Approx. 0.1 | Approx. 0.1 | — | — |
| Dielectric material layer | None | Ag + Ni | Ag + Ni | SUS net of 165 mesh | SUS net of 165 mesh | Cu foil |
| Thickness of dielectric material layer (μm) | — | 0.125 | 0.125 | 100 | 100 | 100 |
| Film formation | — | Physical vapor deposition on support film | Physical vapor deposition on support film | — | — | — |
| Intrinsic resistivity (Ω□cm) | 300* | 0.07 | 0.07 | (1.2) | (1.2) | $2 \times 10^{-6}$ |
| Thickness of electromagnetic noise suppressor (μm) | 22 | 19.125 | 19.125 | 110 | 600 | 100 |
| Specific gravity | 2.5 | 1.3 | 1.3 | 2.1 | 3.3 | 8.9 |
| Flexibility | Rubber-like elasticity with good flexibility | Flexibility of support film | Flexibility of support film | Resilience of metal fabric | Thick, heavy, hard and prone to chipping | Metal foil |
| MSL(S11)(dB at 1 GHz) | −7.07 | −6.38 | −6.38 | −7.37 | −7.93 | — |
| MSL(S21)(dB at 1 GHz) | −5.29 | −3.93 | −4.53 | −4.69 | −2.29 | — |
| Power loss (at 1 GHz) | 0.45 | 0.6 | 0.55 | 0.48 | 0.23 | — |
| Near field noise transmission suppressing effect | Good | Good | Good | Good | Poor | — |
| Micro-loop (Internal coupling coefficient) (dB at 0.8 GHz) | −5.3 | −3.0 | −3.5 | −6.5 | −6.9 | +3.5 |

TABLE 7-continued

|  | Example 17 | Example 18 | Example 19 | Example 20 | Comparative Example 11 | Comparative Example 12 |
|---|---|---|---|---|---|---|
| Micro-loop (Mutual coupling coefficient) (dB at 0.8 GHz) | −15.9 | −26.5 | −24.1 | −16.7 | −14.6 | −36.6 |
| Near field noise radiation suppressing effect | Good | Good | Good | Good | Good | — |

(*Resistivity of the base material)

The electromagnetic noise suppressors of Examples 17 to 20 have the composite layer where part of the base material and the magnetic material are integrated, and showed high attenuation characteristic, with the transmission attenuation in a range from −3.93 to −5.29 dB (at 1 GHz), in the evaluation of transmission noise by micro-strip line method. In terms of power loss, it also showed performance of 0.45 or higher (at 1 GHz). The electromagnetic noise suppressors of Examples were thin and showed specifically high attenuation, in comparison to Comparative Example 11 where transmission attenuation was −2.29 dB (at 1 GHz) with the functional layer having a thickness of about 500 μm.

In the evaluation of radiation noise by the micro loop antenna method, radiation noise is aggravated by the antenna and resonation at the level of internal coupling thereby showing positive value, in the metal foil of Comparative Example 12. The electromagnetic noise suppressors of Examples 17 to 20, suppressing function is demonstrated with values of −3.0 to −6.5 dB (at 0.8 GHz).

Thus, it was shown that the electromagnetic noise suppressors of Examples 17 to 20 have electromagnetic radiation shielding function, and they function to suppress the transmission and radiation of electromagnetic noise nearby.

It has been also shown that the electromagnetic noise suppressor has such a flexibility as can be attached to the inside of a housing of an electoronic apparatus or directly cover the surface of electronic components or the wiring board whereon electronic components are mounted and, even when made thinner and inserted between wiring boards, can suppress electromagnetic coupling from increasing due to radiation and/or reflection.

INDUSTRIAL APPLICABILITY

The electromagnetic noise suppressor of the present invention can be used to cover electoronic apparatuses and electronic components, and it allows the manufacture of electoronic apparatuses and electronic components that are smaller and lighter in weight while achieving sufficient electromagnetic noise suppressing effect throughout the sub-microwave band.

The invention claimed is:

1. An electromagnetic noise suppressor having:
a base material containing a binding agent, the base material comprising a surface; and
a composite layer consisting of the binding agent that is a part of the base material and a magnetic material integrated with each other and consisting of a crystal portion made of nanometer scale crystals of atoms of the magnetic material disposed at a spacing of several angstroms in a crystal lattice, a binding agent portion including the binding agent without the nanometer scale crystals of the atoms of the magnetic material, and a dispersed portion wherein atoms of the magnetic material are dispersed without crystallizing in the binding agent;
the composite layer formed by an application of the magnetic material to the surface of the base material by physical vapor deposition with particle energy in a range from 5 eV to 1000 eV,
wherein surface resistivity of the composite layer is in a range from $1\times10^1$ to $1\times10^{10}$ Ω/□; and
the composite layer has a thickness in a range from 0.005 μm to 0.3 μm.

2. The electromagnetic noise suppressor according to claim 1, wherein maximum transmission attenuation of electromagnetic radiation per unit thickness of the composite layer is in a range from −0.5 to −500 dB/μm.

3. The electromagnetic noise suppressor according to claim 2, wherein maximum transmission attenuation of electromagnetic radiation is in a range from −10 to −50 dB.

4. The electromagnetic noise suppressor according to claim 2, wherein maximum reflection attenuation at the frequency where maximum transmission attenuation of electromagnetic radiation is achieved is in a range from −6 to −50 dB.

5. The electromagnetic noise suppressor according to claim 1, wherein power loss at 1 GHz is in a range from 0.3 to 0.65.

6. The electromagnetic noise suppressor according to claim 1, wherein specific gravity of the composite layer, the base material and a support material combined is in a range from 0.9 to 1.5.

7. An electromagnetic noise suppressor comprising a plurality of the electromagnetic noise suppressors of claim 1 stacked one on another.

8. The electromagnetic noise suppressor according to claim 1, wherein the binding agent is a resin or a rubber.

9. The electromagnetic noise suppressor according to claim 1, wherein the binding agent is a hardening resin.

10. The electromagnetic noise suppressor according to claim 1, wherein elastic modulus in shear of the binding agent is in a range from $1\times10^4$ to $1\times10^{10}$ Pa.

11. The electromagnetic noise suppressor according to claim 1, wherein elastic modulus in shear of the binding agent is in a range from $1\times10^4$ to $5\times10^7$ Pa.

12. The electromagnetic noise suppressor according to claim 1, further comprising: a heat conduction layer containing a thermally conductive filler.

13. The electromagnetic noise suppressor according to claim 1, further comprising: a support layer.

14. The electromagnetic noise suppressor according to claim 1, wherein the base material contains a non-halogen and non-antimony flame retarding agent.

15. The electromagnetic noise suppressor according to claim 1, further comprising: a flame retarding resin layer.

16. The electromagnetic noise suppressor according to claim 1, wherein the base material contains an electrically conductive filler.

17. The electromagnetic noise suppressor according to claim 16, wherein the electrically conductive filler is at least one kind of electrically conductive fine powder selected from the group consisting of metal powder, metal fiber, metal-coated fine particles, fine carbon particles and carbon nanotube.

18. The electromagnetic noise suppressor according to claim 1, further comprising: an electrically conductive layer.

19. The electromagnetic noise suppressor according to claim 18, wherein the electrically conductive layer is at least one kind selected from the group consisting of metal foil, fabric of metal fibers, fabric of electrically conductive fibers, interlaced metal wires, interlaced electrically conductive fibers, organic polymer layer containing an electrically conductive filling agent dispersed therein and electrically conductive film.

20. The electromagnetic noise suppressor according to claim 19, wherein the electrically conductive film comprises a support film and a metal layer having a thickness from 5 to 500 nm formed by physical deposition of a metal on the support film.

21. The electromagnetic noise suppressor according to claim 20, wherein the metal layer is formed by an opposing target magnetron sputtering process.

22. The electromagnetic noise suppressor according to claim 1, wherein the base material contains a dielectric material powder.

23. The electromagnetic noise suppressor according to claim 22, wherein the dielectric material powder is at least one kind selected from the group consisting of barium titanate-based ceramic, zirconium titanate-based ceramic and lead perovskite-based ceramic.

* * * * *

UNITED STATES PATENT AND TRADEMARK OFFICE
CERTIFICATE OF CORRECTION

PATENT NO. : 7,625,633 B2  Page 1 of 1
APPLICATION NO. : 10/540825
DATED : December 1, 2009
INVENTOR(S) : Toshiyuki Kawaguchi et al.

It is certified that error appears in the above-identified patent and that said Letters Patent is hereby corrected as shown below:

On the title page, item [73] should read:

--(73) Assignee: Shin-Etsu Polymer Co., Ltd. (JP)--.

Signed and Sealed this

Ninth Day of March, 2010

David J. Kappos
*Director of the United States Patent and Trademark Office*